(12) United States Patent  (10) Patent No.: US 8,334,551 B2
Itagaki et al.  (45) Date of Patent: Dec. 18, 2012

(54) NON-VOLATILE SEMICONDUCTOR STORAGE DEVICE

(75) Inventors: Kiyotaro Itagaki, Yokohama (JP); Yoshihisa Iwata, Yokohama (JP); Hiroyasu Tanaka, Minato-ku (JP); Masaru Kidoh, Komae (JP); Ryota Katsumata, Yokohama (JP); Masaru Kito, Yokohama (JP); Hideaki Aochi, Kawasaki (JP); Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/120,987

(22) PCT Filed: Aug. 25, 2009

(86) PCT No.: PCT/JP2009/065139
§ 371 (c)(1),
(2), (4) Date: Mar. 25, 2011

(87) PCT Pub. No.: WO2010/035609
PCT Pub. Date: Apr. 1, 2010

(65) Prior Publication Data
US 2011/0175159 A1 Jul. 21, 2011

(30) Foreign Application Priority Data
Sep. 26, 2008 (JP) .................. 2008-248350

(51) Int. Cl.
H01L 29/792 (2006.01)
G11C 11/34 (2006.01)
(52) U.S. Cl. ............ 257/216; 257/E29.309; 365/185.05
(58) Field of Classification Search .................. 257/326, 257/315, 324, E29.309; 365/185.05, 185.17, 365/185.33
See application file for complete search history.

(56) References Cited

U.S. PATENT DOCUMENTS

| 2007/0252201 A1 | 11/2007 | Kito et al. |
| 2008/0067583 A1 | 3/2008 | Kidoh et al. |
| 2008/0099819 A1 | 5/2008 | Kito et al. |
| 2008/0173932 A1 | 7/2008 | Kidoh et al. |
| 2008/0186771 A1* | 8/2008 | Katsumata et al. ...... 365/185.17 |

(Continued)

FOREIGN PATENT DOCUMENTS
JP 3107693 11/2000
(Continued)

OTHER PUBLICATIONS
U.S. Appl. No. 13/235,389, filed Sep. 18, 2011, Itagaki, et al.
(Continued)

*Primary Examiner* — Matthew Reames
*Assistant Examiner* — Nikolay Yushin
(74) *Attorney, Agent, or Firm* — Oblon, Spivak, McClelland, Maier & Neustadt, L.L.P.

(57) ABSTRACT

Each of the memory blocks includes: a first conductive layer expanding in parallel to the substrate over the first area, n layers of the first conductive layers being formed in a lamination direction and shared by the plurality of memory strings; a first semiconductor layer; and an electric charge accumulation layer. The memory strings are arranged with m columns in a second direction for each of the memory blocks. The wiring layers are arranged in the second direction, formed to extend to the vicinity of one end of the first conductive layer in the first direction from one side of the memory block, and connected via contact plugs to the first conductive layers. A relation represented by (Formula 1) is satisfied: (Formula 1) m>=n 15 Claims, 40 Drawing Sheets

U.S. PATENT DOCUMENTS

2011/0103153 A1    5/2011    Katsumata et al.

FOREIGN PATENT DOCUMENTS

| JP | 2007 266143 | 10/2007 |
| JP | 2008-72051 | 3/2008 |
| JP | 2008 171918 | 7/2008 |
| JP | 2008 171968 | 7/2008 |
| WO | 2008 126774 | 10/2008 |

OTHER PUBLICATIONS

Chen, J. et al., "Subbreakdown Drain Leakage Current in MOSFET", IEEE Electron Device Letters, vol. EDL-8, No. 11, pp. 515-517 (Nov. 1987).

Kotani, N. et al., "The Effect of Holes On the Injection-Induced Breakdown in n -Channel MOSFETS's", IEEE Transactions on Electron Devices, vol. ED-32, No. 3 , pp. 722-725 (Mar. 1985).

Terauchi, M. et al., "Depletion Isolation Effect of Surrounding Gate Transistors", IEEE Transactions on Electtron Devices, vol. 44, No. 12, pp. 2303-2305 (Dec. 1997).

Auth, C. P. et al., "Scaling Theory for Cylindrical, Fully-Depleted, Surrounding-Gate MOSFET's", IEEE Electron Device Letters, vol. 18, No. 2, pp. 74-76 (Feb. 1997).

Sakuraba, H. et al., "New Three-Dimensional High-Density Stacked-Surrounding Gate Transistor (S-SGT) Flash Memory Architecture Using Self-Aligned Interconnection Fabrication Technology Without Photolithography Process for Tera-Bits and Beyond", Japanese Journal of Applied Physics, vol. 43, No. 4B, pp. 2217-2219 (2004).

International Search Report issued Dec. 1, 2009 in PCT/JP09/065139 filed Aug. 25, 2009.

Tanaka, H. et al., "Bit-Cost Scalable Technology for Low-Cost and Ultrahigh-Density Flash Memory", Toshiba Review, vol. 63, No. 2, pp. 28-31, (Feb. 1, 2008) (with English abstract).

Tanaka, H. et al., "Bit-Cost Scalable Technology with Punch and Plug Process for Ultra High Density Flash Memory", IEEE Symposium on VLSI Technology Digest of Technical Papers, pp. 14-15, 1/1 (Jun. 12-14, 2007).

Maeda, T. et al., "Multi-Stacked 1G Cell/Layer Pipe-Shaped BiCS Flash Memory", IEEE Symposium on VLSI Circuits Digest of Technical Papers IEEE, pp. 22-23 (Jun. 16, 2009).

Tanizawa, M. et al. "A Complete Substrate Current Model Including Band-to-Band Tunneling Current for Circuit Simulation", IEEE Transactions on Computer-Aided Design of Integrated Circuits and Systems, vol. 12, No. 11, pp. 1749-1757 (Nov. 1993).

Hioki, M. et al., "An Analysis of Program and Erase Operation for FC-SGT Flash Memory Cells", Simulation of Semiconductor Processes and Devices, 2000, SISPAD 2000. 2000 International Conference, pp. 116-118, (2000).

Endoh, T. et al., "Novel Ultrahigh-Density Flash Memory With a Stacked-Surrounding Gate Transistor (S-SGT) Structured Cell", IEEE Trans. on Electron Devices, vol. 50, No. 4, pp. 945-951 (2003).

Koyanagi, M. et al. "Investigation and Reduction of Hot Electron Induced Punchthrough (HEIP) Effect in Submicron Pmosfets", Tec. Dig. of IEEE Intern. Electron Devices Meeting, pp. 722-725 (1986).

Japanese Office Action dated Jul. 10, 2012, in Japanese Patent Application No. 2008-248350 filed Sep. 26, 2008 (with English Translation).

Korean Office Action issued Jul. 11, 2012, Korean Patent Application No. 10-2011-7006737 (with English Translation).

* cited by examiner

Read

Read

Programming

Programming

FIG. 23A Read
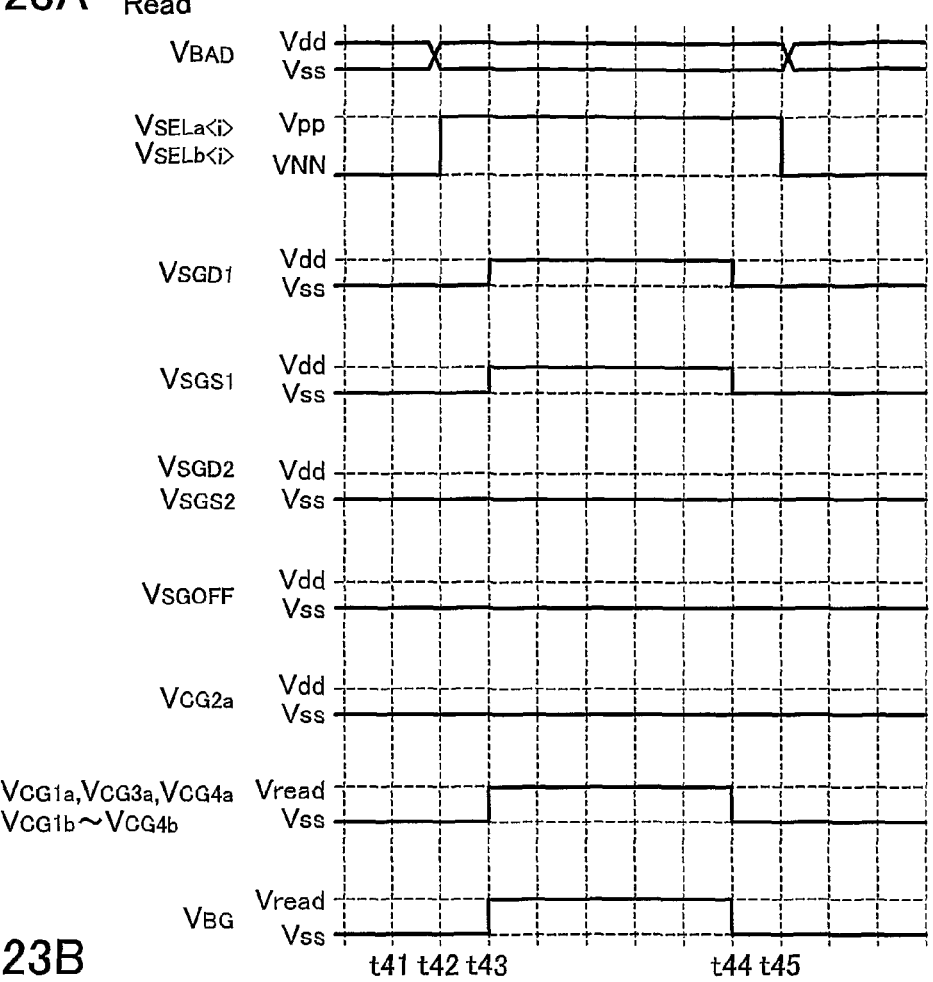
FIG. 23B
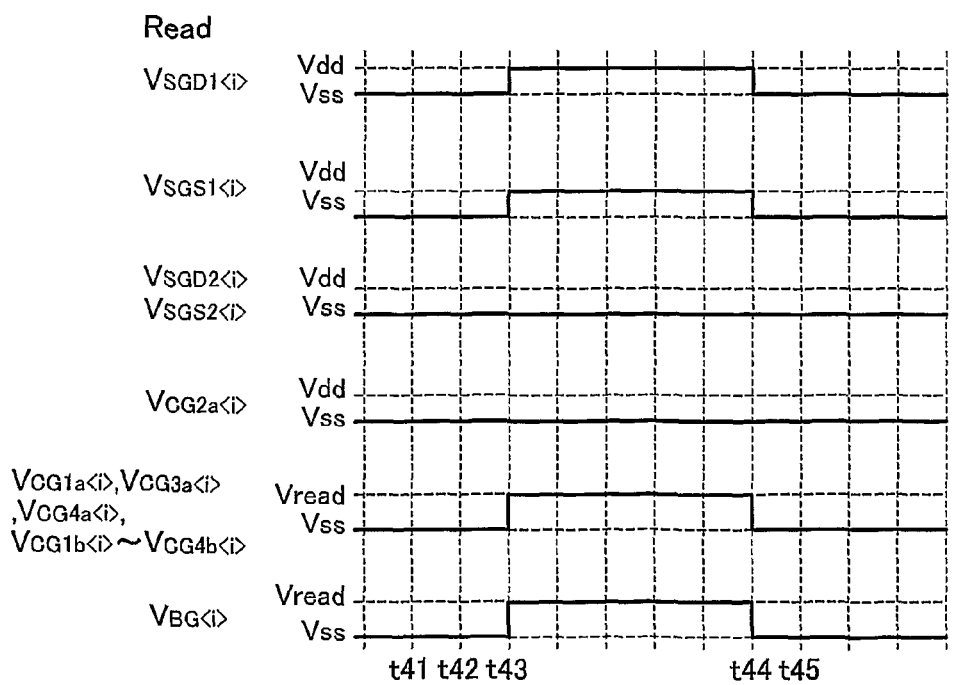

Programming

Programming

NON-VOLATILE SEMICONDUCTOR STORAGE DEVICE

TECHNICAL FIELD

The present invention relates to an electrically rewritable non-volatile semiconductor storage device.

BACKGROUND ART

As refinement technologies are pushed to the limit for improving the bit density of NAND type flash memory, there is increasing demand for lamination of memory cells. As one example, there has been proposed such lamination-type NAND flash memory where memory cells are configured with vertical transistors (see, for example, PTL 1). Meanwhile, with the technology described in Patent Document 1, more contact gates (CG) and selection gates (SG) are required as the number of laminated layers increases, which would result in larger peripheral circuit area.

Therefore, another technology has been disclosed that achieves substantial reduction in the number of contact gates to be independently driven, by setting the contact gates of different memory strings to the same potential (see, for example, PTL 2). As such, a combination of these technologies disclosed in Patent Documents 1 and 2 can mitigate an increase in the number of contact gates to be driven even if the memory cells are configured in a laminated fashion. This, however, fails to address problems associated with the increasing selection gates to be driven.

[Citation List]

[Patent Literature]

[PTL 1] Japanese Patent Laid-Open No. 2007-266143

[PTL 2] Japanese Patent No. 3107693

SUMMARY OF INVENTION

One aspect of the present invention provides a non-volatile semiconductor storage device comprising: a plurality of memory blocks, each of the memory blocks having a plurality of memory strings with a plurality of memory cells connected in series, and each of the memory blocks being provided for each first area parallel to a substrate; and a plurality of wiring layers formed in the same layer and extending in a first direction parallel to the substrate, each of the memory blocks comprising: a first conductive layer expanding in parallel to the substrate over the first area, n layers of the first conductive layers being formed in a lamination direction and shared by the plurality of memory strings; a first semiconductor layer formed to extend in a lamination direction and penetrate the first conductive layers, the first semiconductor layer provided for each of the memory strings; and an electric charge accumulation layer formed between the first conductive layers and the first semiconductor layer, and configured to be able to accumulate electric charges, the memory strings including the first semiconductor layer, parts of the first conductive layers, and the electric charge accumulation layer, and being arranged with m columns in a second direction orthogonal to the lamination direction and the first direction, for each of the memory blocks; the wiring layers being arranged in the second direction, being formed to extend to the vicinity of one end of the the first conductive layer in the first direction from one side of the memory block, and being connected via contact plugs to the first conductive layers; and a relation represented by (Formula 1) being satisfied:

$$m \geq n \quad \text{(Formula 1)}$$

In addition, another aspect of the present invention provides a non-volatile semiconductor storage device comprising: a plurality of memory blocks, each of the memory blocks having a plurality of memory strings with a plurality of memory cells connected in series, and each of the memory blocks being provided for each first area parallel to a substrate; and a plurality of wiring layers formed in the same layer and extending in a first direction parallel to the substrate, each of the memory blocks comprising: a first conductive layer expanding in parallel to the substrate over the first area, n layers of the first conductive layers being formed in a lamination direction and shared by the plurality of memory strings; a first semiconductor layer formed to extend in a lamination direction and penetrate the first conductive layers, the first semiconductor layer provided for each of the memory strings; and an electric charge accumulation layer formed between the first conductive layers and the first semiconductor layer, and configured to be able to accumulate electric charges, the memory strings including the first semiconductor layer, parts of the first conductive layers, and the electric charge accumulation layer, and being arranged with m columns in a second direction orthogonal to the lamination direction and the first direction, for each of the memory blocks; the wiring layers being arranged in the second direction, being formed to extend to the vicinity of both ends of the first conductive layers in the first direction from both sides of the memory block, and being connected via contact plugs to the first conductive layers; and a relation represented by (Formula 2) being satisfied:

$$m \geq n/2 \quad \text{(Formula 2)}$$

In addition, still another aspect of the present invention provides a non-volatile semiconductor storage device comprising: a plurality of memory blocks, each of the memory blocks having a plurality of memory strings with a plurality of memory cells connected in series, and each of the memory blocks being provided for each first area parallel to a substrate; and a plurality of wiring layers formed in the same layer and extending in a first direction parallel to the substrate, each of the memory blocks comprising: a first conductive layer formed in comb-teeth shape with a plurality of protruding portions extending in the first direction at the first area, n layers of the first conductive layers being formed in a lamination direction and shared by the plurality of memory strings; a second conductive layer formed in comb-teeth shape with a plurality of protruding portions extending in the first direction at the first area, n layers of the second conductive layers being formed in a lamination direction and shared by the plurality of memory strings, so that the protruding portions of the second conductive layers are positioned between the protruding portions of the first conductive layers; a first semiconductor layer formed to penetrate the first conductive layers, the first semiconductor layer provided for each of the memory strings; a second semiconductor layer formed to penetrate the second conductive layer, the second semiconductor layer provided for each of the memory strings; a third semiconductor layer formed to join respective bottom portions of the first semiconductor layer and the second semiconductor layer; and an electric charge accumulation layer formed between the first conductive layers and the first semiconductor layer, as well as between the second conductive layer and the second semiconductor layer, and configured to be able to accumulate electric charges, the memory strings including the first conductive layers, the second conductive layer, the first semiconductor layer, the second semiconductor layer, the third semiconductor layer, and the electric charge accumulation layer, and being arranged with m columns in a second direction orthogonal to the lamination direction and the first direction, for each of the memory blocks; the wiring layers being arranged in the second direction, being formed to extend to the vicinity of both ends of the first conductive layer and the second conductive layer in the first direction from both sides of the memory block, and being connected via contact plugs to the first conductive layer or the second conductive layer; and a relation represented by (Formula 3) being satisfied:

$$m \geq n \quad \text{(Formula 3)}$$

BRIEF DESCRIPTION OF DRAWINGS

FIG. 23A is a timing chart illustrating a read operation by the non-volatile semiconductor storage device 10B according to the third embodiment;

FIG. 23B is a timing chart illustrating a read operation by the non-volatile semiconductor storage device 10B according to the third embodiment;

DESCRIPTION OF EMBODIMENTS

Embodiments of a non-volatile semiconductor storage device according to the present invention will now be described below with reference to the accompanying drawings.

[First Embodiment]

(General Configuration of Non-Volatile Semiconductor Storage Device 10 in First Embodiment)

Figure 1:
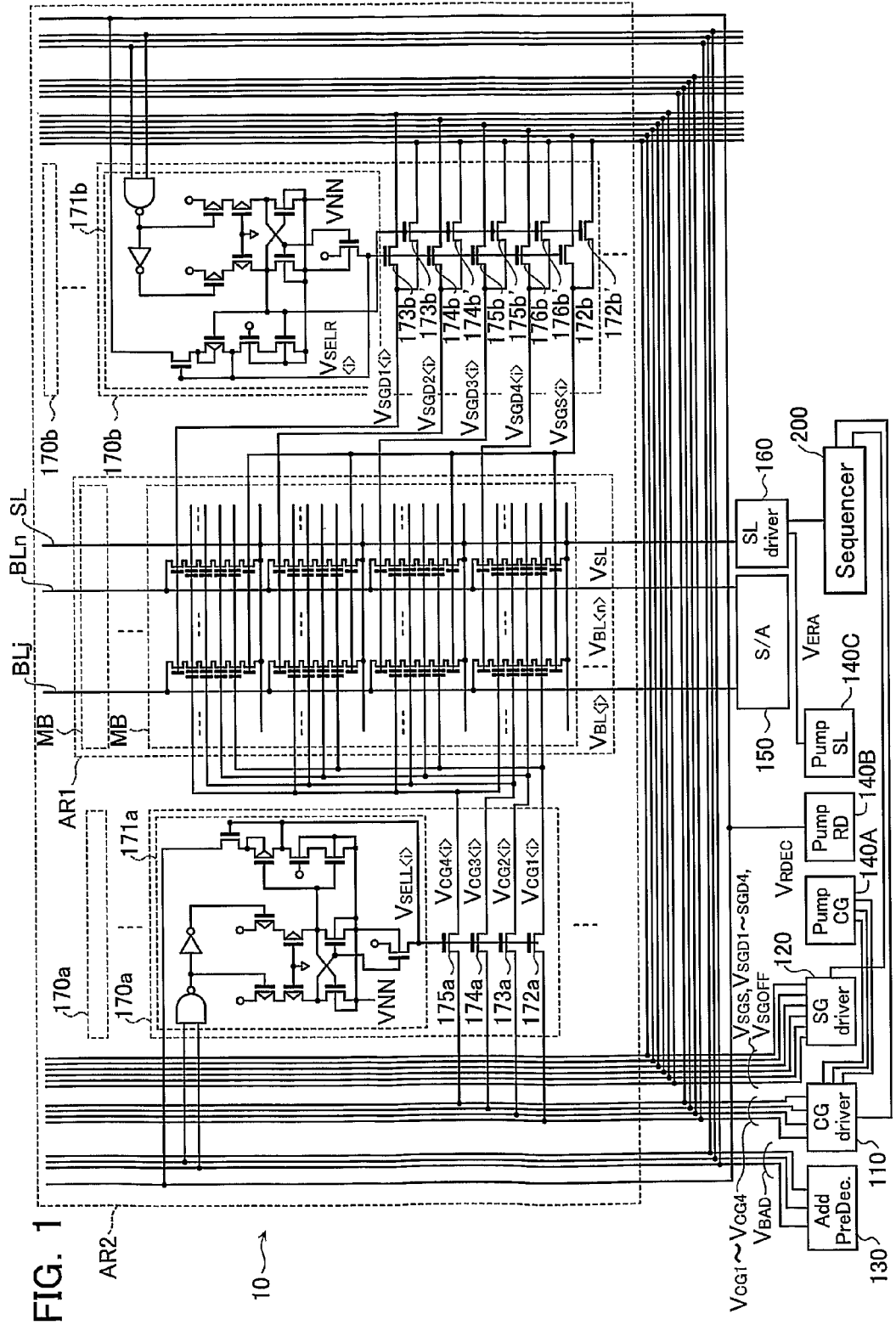
FIG. 1 is a circuit diagram of a non-volatile semiconductor storage device 10 according to a first embodiment of the present invention.

Referring first to FIG. 1, a general configuration of a non-volatile semiconductor storage device 10 according to a first embodiment will be described below. FIG. 1 is a circuit diagram of the non-volatile semiconductor storage device 10 according to the first embodiment.

As illustrated in FIG. 1, the non-volatile semiconductor storage device 10 according to the first embodiment comprises memory transistor areas AR1 and a peripheral area AR2 provided on the periphery thereof. Each memory transistor area AR1 is an area that has electrically rewritable memory transistors MTr1 to MTr4 (memory cells). The peripheral area AR2 is an area that has different control circuits for controlling voltage provided to the memory transistors MTr1 to MTr4, etc.

Figure 2:
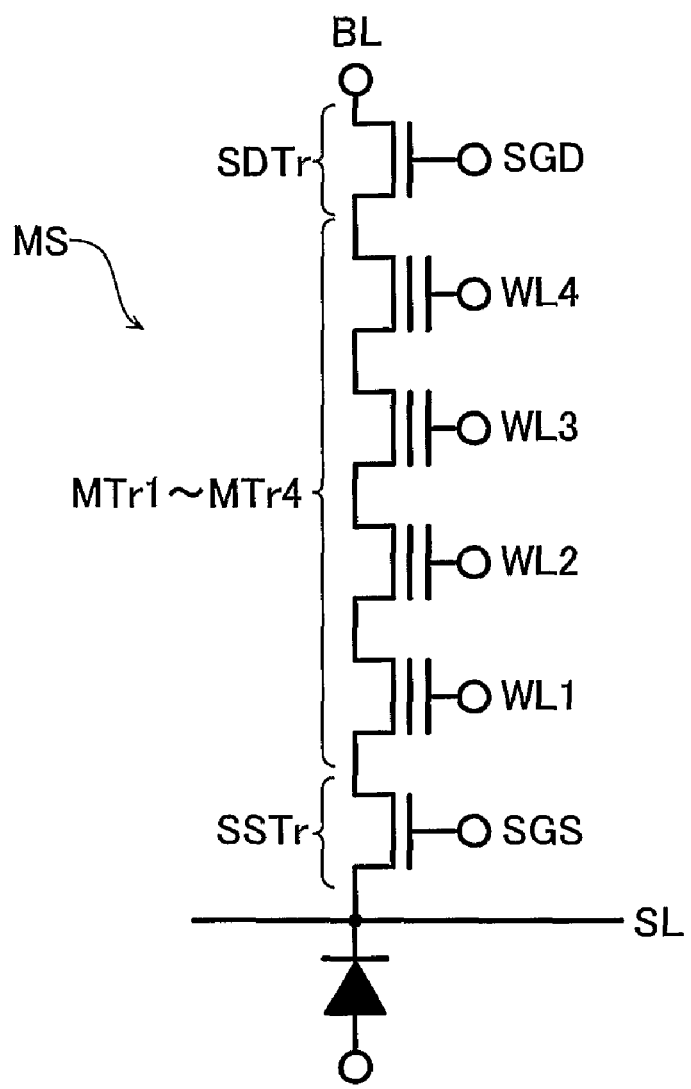
FIG. 2 is an enlarged view of FIG. 1.

Each memory transistor area AR1 comprises a plurality of memory blocks MB, each of which has n rows and four columns of memory strings MS. As illustrated in FIG. 2, each memory string MS has a configuration where four electrically rewritable memory transistors MTr1 to MTr4 are connected in series. A source-side selection transistor SSTr and a drain-side selection transistor SDTr are provided at one end and the other of each memory string MS. The source-side selection transistor SSTr and the drain-side selection transistor SDTr control conduction of the memory string MS. The control gates of the memory transistors MTr1 to MTr4 are connected to word lines WL1 to WL4. The control gate of the source-side selection transistor SSTr is connected to a source-side selection gate line SGS. The control gate of the drain-side selection transistor SDTr is connected to a drain-side selection gate line SGD.

Figure 3:
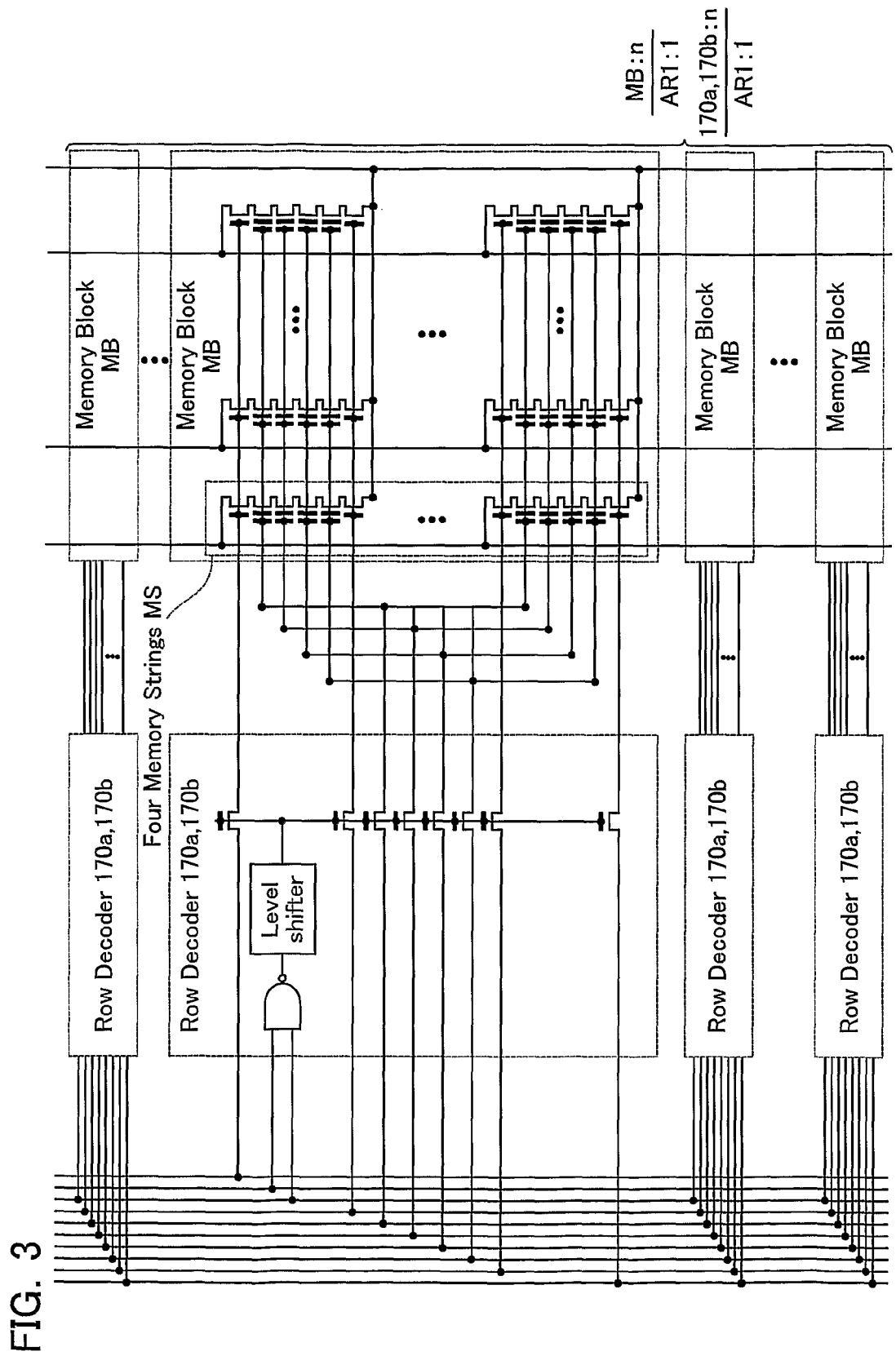
FIG. 3 is a schematic diagram illustrating a lamination structure of a memory transistor area AR1 according to the first embodiment.

As illustrated in FIG. 3, a memory transistor area AR1 includes a plurality of memory blocks MB. N memory blocks MB are arranged in line in a predetermined direction. One row decoder circuit 170a and one row decoder circuit 170b are provided for each memory block MB. The configuration of the row decoder circuits 170a and 170b will be described in detail below.

In addition, according to the first embodiment, as illustrated in FIG. 3, the word lines WL1 to WL4 are shared by four adjacent memory strings MS in the column direction (described below) in one memory block MB. In other words, the word lines WL1 to WL4 aggregate four adjacent memory strings MS in the column direction in one memory block MB.

Note that the word lines WL1 to WL4 are connected to the row decoder circuits 170a, 170b corresponding to the respective memory blocks MB.

Figure 4:
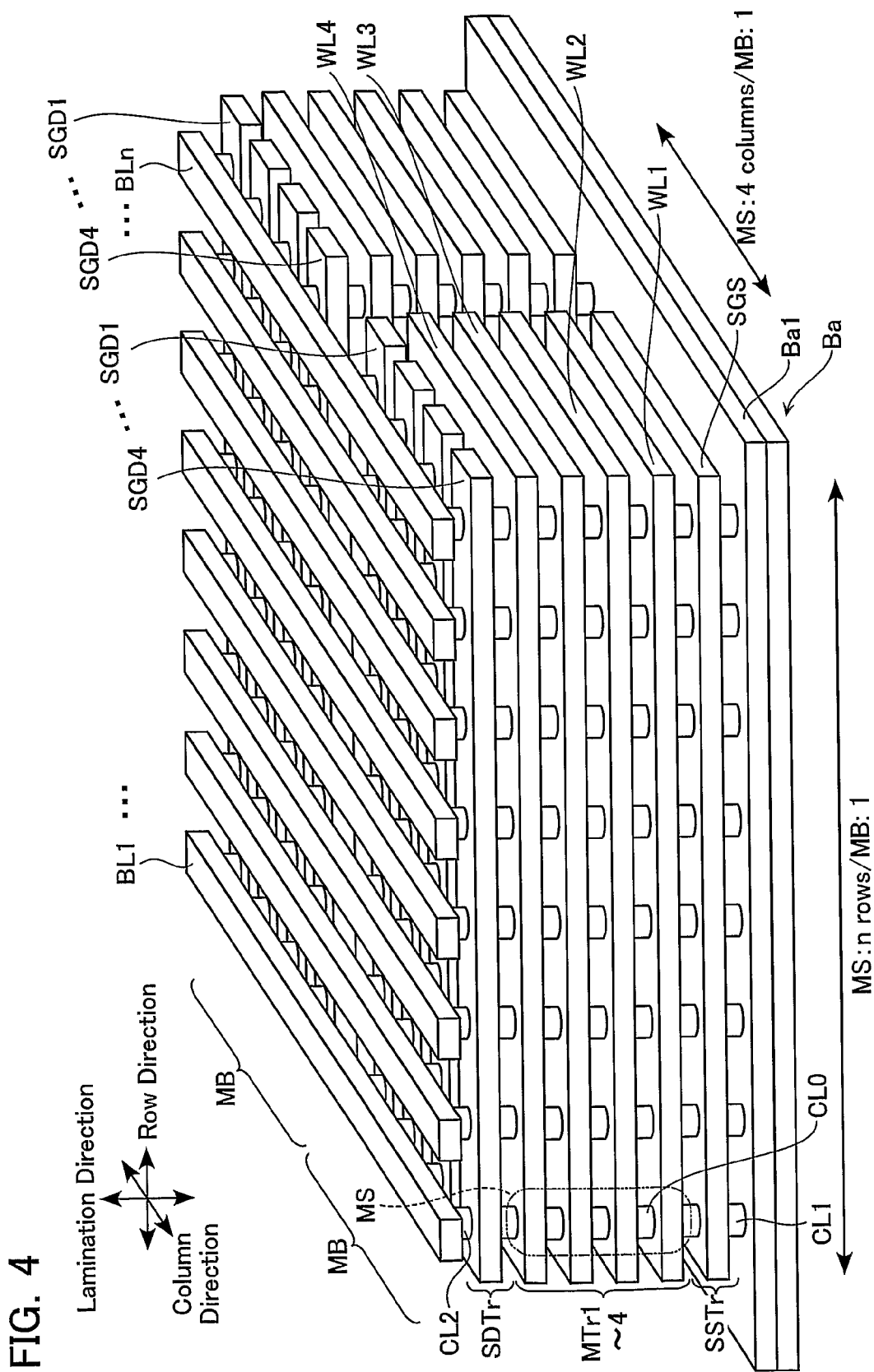
FIG. 4 is an enlarged view of FIG. 3.

Referring now to FIG. 4, a lamination structure of a memory transistor area AR1 will be outlined below. FIG. 4 schematically illustrates a lamination structure of a memory transistor area AR1.

As illustrated in FIG. 4, the memory transistor area AR1 includes a plurality of memory blocks MB arranged on a substrate Ba. In other words, one memory block MB is formed for each predetermined area. Note that there are formed above the memory blocks MB wirings (not illustrated) leading to the memory blocks MB. The details of the wirings will be discussed later.

As illustrated in FIG. 4, each memory block MB has a plurality of memory strings MS extending in the lamination direction.

The memory strings MS are arranged in a matrix form in the row and column directions at respective memory blocks MB. The memory strings MS are formed in "I-shape", as viewed from the row direction (the column direction). The memory strings MS according to the first embodiment are provided for each memory block MB, including "n rows" in the row direction and "4 columns" in the column direction. Wherein, the row direction represents one direction (orthogonal to the lamination direction) in which drain-side selection gate lines SGD1 to SGD4 described below extend, and the column direction represents another direction (orthogonal to the lamination direction and the row direction) in which bit lines BL1 to BLn extend.

Each memory block MB has four layers of word lines WL1 to WL4 that are shared by multiple memory strings MS, columnar semiconductors CL0 that are provided for respective memory strings MS, and electric charge accumulation layers.

The word lines WL1 to WL4 expand in parallel to the substrate Ba, in a two-dimensional manner within a predetermined area. That is, in the predetermined area, all gates of the memory transistors MTr1 in respective memory strings MS are commonly connected to the word line WL1. In addition, all gates of the memory transistors MTr2 in respective memory strings MS are commonly connected to the word line WL2. In addition, all gates of the memory transistors MTr3 in respective memory strings MS are commonly connected to the word line WL3. In addition, all gates of the memory transistors MTr4 in respective memory strings MS are commonly connected to the word line WL4.

The columnar semiconductors CL0 are formed to extend in the lamination direction. The columnar semiconductors CL0 are formed to penetrate the word lines WL1 to WL4. The columnar semiconductors CL0 are provided on the n$^+$ area formed on the P-well area Ba1 of the substrate Ba.

The electric charge accumulation layers are formed between the word lines WL1 to WL4 and the respective columnar semiconductors CL0. The electric charge accumulation layers are configured to be able to accumulate electric charges.

The memory transistors MTr1 to MTr4 include the word lines WL1 to WL4, the columnar semiconductors CL0, and the electric charge accumulation layers.

In addition, each memory block MB has a plurality of source-side selection transistors SSTr that are connected in series to one ends of the memory strings MS. Each memory block MB has a source-side selection gate line SGS that expands in parallel with respect to the substrate Ba, and columnar semiconductors CL1 that are provided for respective source-side selection transistors SSTr.

The source-side selection gate lines SGS are formed in parallel to the substrate Ba, in a two-dimensional manner within a predetermined area. The columnar semiconductors CL1 are formed to extend downward from the respective columnar semiconductors CL0. The columnar semiconductors CL1 are formed in a matrix form in the row and column directions. The columnar semiconductors CL1 are formed to penetrate the respective source-side selection gate lines SGS.

Each source-side selection transistor SSTr includes a source-side selection gate line SGS, a columnar semiconductor CL1, and a source-side gate insulation layer formed between the source-side selection gate line SGS and the columnar semiconductor CL1.

Furthermore, each memory block MB has a plurality of drain-side selection transistors SDTr that are connected in series to the other ends of the memory strings MS. Each memory block MB has drain-side selection gate lines SGD1 to SGD4 and columnar semiconductors CL2.

The drain-side selection gate lines SGD1 to SGD4 are formed to be aligned in the column direction and to extend in the row direction. The columnar semiconductors CL2 are formed to extend upward from the respective columnar semiconductors CL0. The columnar semiconductors CL2 are formed in a matrix form in the row and column directions. The columnar semiconductors CL2 are formed to penetrate the drain-side selection gate lines SGD1 to SGD4.

Each drain-side selection transistor SDTr includes drain-side selection gate lines SGD1 to SGD4, a columnar semiconductor CL2, and a drain-side gate insulation layer formed between the drain-side selection gate lines SGD1 to SGD4 and the columnar semiconductor CL2.

Referring again to FIG. 1, the peripheral area AR2 will be described below. Each peripheral area AR2 has a word-line driving circuit 110, a selection-gate-line driving circuit 120, an address decoder circuit 130, boost circuits 140A to 140C, a sense amplifier circuit 150, a source-line driving circuit 160, first row decoder circuits 170a, second row decoder circuits 170b, and a sequencer 200.

The word-line driving circuit 110 transfers voltages $V_{CG1}$ to $V_{CG4}$ for driving word lines WL1 to WL4. The selection-gate-line driving circuit 120 transfers a voltage $V_{SGS}$ for driving a source-side selection gate line SGS. In addition, the selection-gate-line driving circuit 120 transfers voltages $V_{SGD1}$ to $V_{SGD4}$ for driving drain-side selection gate lines SGD1 to SGD4. In addition, the selection-gate-line driving circuit 120 transfers a voltage $V_{SGOFF}$ for disabling the drain-side selection gate lines SGD1 to SGD4 and the source-side selection gate line SGS. The address decoder 130 outputs a voltage $V_{BAD}$ for specifying a block address.

The boost circuit 140A transfers a voltage which is boosted from the reference voltage, to the word-line driving circuit 110. The boost circuit 140B transfers a voltage $V_{RDEC}$, which is boosted from the reference voltage, to first and second row decoder circuits 170a and 170b. The boost circuit 140C transfers a voltage $V_{ERA}$, which is boosted from the reference voltage, to the source-line driving circuit 160.

The sense amplifier circuit 150 reads data based on the voltages $V_{BL<1>}$-$V_{BL<j>}$-$V_{BL<n>}$ of the bit lines BL1-BL<j>-BL<n>.

The source-line driving circuit 160 transfers a voltage $V_{SL}$ for driving a source line SL.

The first and second row decoder circuits 170a and 170b are provided, one for each memory block MB, respectively. The first row decoder circuits 170a are provided at one ends in the row direction of the respective memory blocks MB. The second row decoder circuits 170b are provided at the other ends in the row direction of the respective memory blocks MB. The first row decoder circuits 170a selectively apply voltages $V_{CG1<i>}$ to $V_{CG4<i>}$ to the gates of the memory transistors MTr1 to MTr4, based on the voltage $V_{BAD}$. The second row decoder circuits 170b selectively apply a voltage $V_{SGS<i>}$ to the gates of the source-side selection transistors SSTr, based on the voltage $V_{BAD}$. In addition, based on the voltage $V_{BAD}$, the second row decoder circuits 170b selectively apply voltages $V_{SGD1<i>}$ to $V_{SGD4<i>}$ to the gates of the drain-side selection transistors SDTr that are connected to the drain-side selection gate lines SGD1 to SGD4.

Each first row decoder circuit 170a has a voltage converting circuit 171a and first transfer transistors 172a to 175a. The voltage converting circuit 171a converts the received voltage $V_{RDEC}$ to generate a voltage $V_{SELL<i>}$, which in turn is output to the gates of the first transfer transistors 172a to 175a. The first transfer transistors 172a to 175a are connected between the word-line driving circuit 110 and the respective word lines WL1 to WL4. The first transfer transistors 172a to 175a transfer voltages $V_{CG1<1>}$ to $V_{CG4<i>}$ to the word lines WL1 to WL4, based on the voltages $V_{CG1}$ to $V_{CG4}$ and $V_{SELL<i>}$.

Each second row decoder circuit 170b has a voltage converting circuit 171b, second transfer transistors 172b to 176b, and third transfer transistors 172b' to 176b'. The voltage converting circuit 171b converts the received voltage $V_{REDC}$ to generate a voltage $V_{SELR<i>}$, which in turn is output to the gates of the second transfer transistors 172b to 176b. The second and third transfer transistors 172b and 172b' are connected between the selection-gate-line driving circuit 120 and a source-side selection gate line SGS. The second and third transfer transistors 173b to 176b and 173b' to 176b' are connected between the selection-gate-line driving circuit 120 and respective drain-side selection gate lines SGD1 to SGD4. The second and third transfer transistors 172b and 172b' transfer a voltage $V_{SGS<i>}$ to a source-side selection gate line SGS, based on the voltages $V_{SGS}$, $V_{SGOFF}$, and $V_{SELR<i>}$. The second and third transfer transistors 173b to 176b and 173b' to 176b' transfer voltages $V_{SGD1<i>}$ to $V_{SGD4<i>}$ to drain-side selection gate lines SGD1 to SGD4, based on the voltages $V_{SGD1}$ to $V_{SGD4}$, $V_{SGOFF}$, and $V_{SELR<i>}$.

The sequencer 200 inputs control signals to the word-line driving circuit 110, the selection-gate-line driving circuit 120, and the source-line driving circuit 160.

Figure 5A:
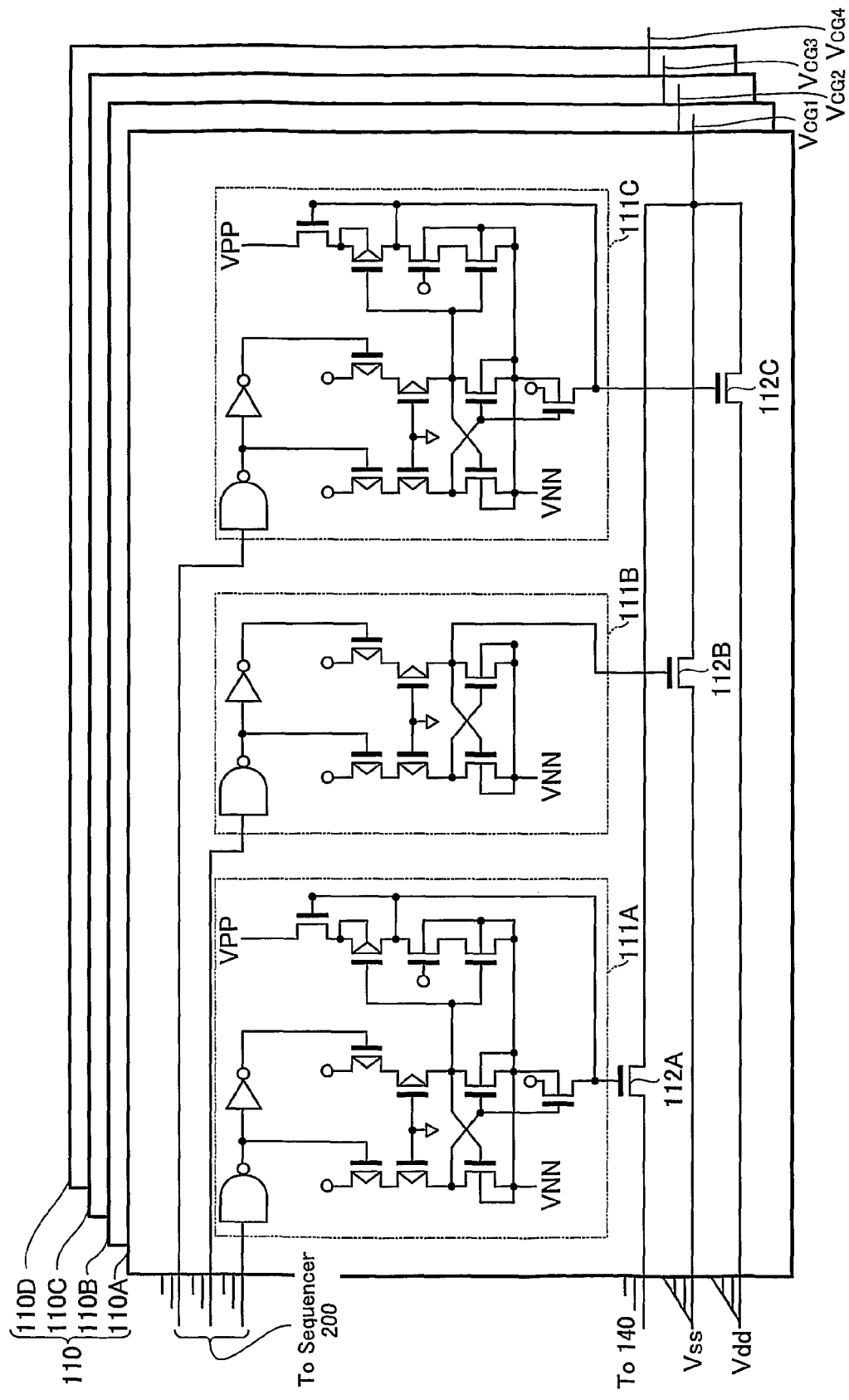
FIG. 5A is a circuit diagram of the word-line driving circuit 110.

As illustrated in FIG. 5A, the word-line driving circuit 110 includes first to fourth word-line driving circuits 110A to 110D. The first word-line driving circuit 110A outputs a voltage $V_{CG1}$. The second word-line driving circuit 110B outputs a voltage $V_{CG2}$ The third word-line driving circuit 110C outputs a voltage $V_{CG3}$. The fourth word-line driving circuit 110D outputs a voltage $V_{CG4}$.

The first word-line driving circuit 110A has voltage converting circuits 111A to 111C and transfer transistors 112A to 112C. The voltage converting circuits 111A to 111C have input terminals that receive control signals from the sequencer 200. The voltage converting circuit 111A has an output terminal that is connected to the gate of the transfer transistor 112A. The voltage converting circuit 111B has an output terminal that is connected to the gate of the transfer transistor 112B. The voltage converting circuit 111C has an output terminal that is connected to the gate of the transfer transistor 112C. The output terminals of the transfer transistors 112A to 112C are commonly connected. The input terminal of the transfer transistor 112A is connected to the output terminal of the boost circuit 140A. The input terminal of the transfer transistor 112B is connected to the ground voltage Vss. The input terminal of the transfer transistor 112C is connected to the power supply voltage Vdd. Note that the second to fourth word-line driving circuits 110B to 110D have the same configuration as the first word-line driving circuit 110A.

Figure 5B:
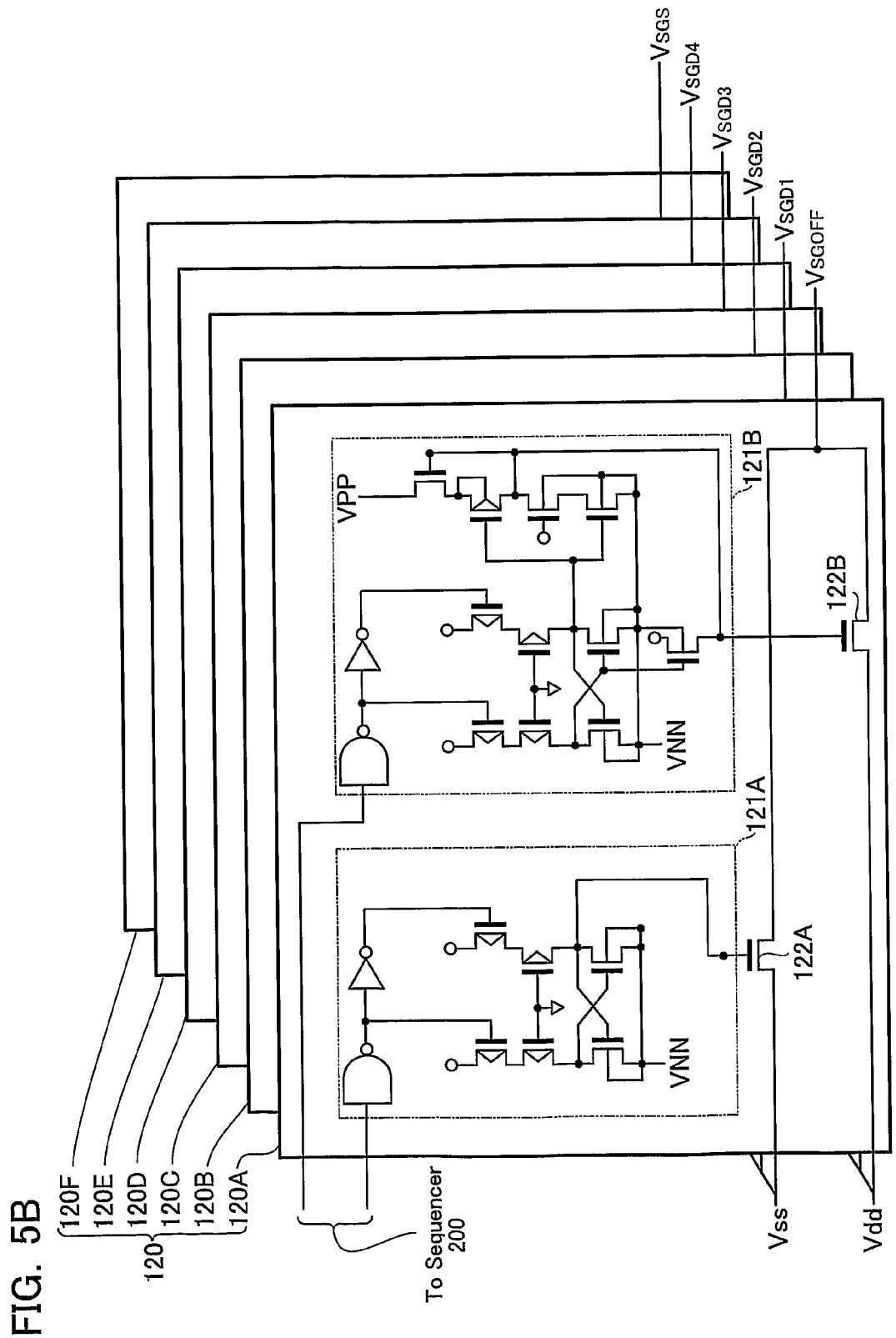
FIG. 5B is a circuit diagram of the selection-gate-line driving circuit 120.

As illustrated in FIG. 5B, the selection-gate-line driving circuit 120 includes first to sixth selection-gate-line driving circuits 120A to 120F. The first selection-gate-line driving circuit 120A outputs a voltage $V_{SGOFF}$. The second selection-gate-line driving circuit 1203 outputs a voltage $V_{SGD1}$. The third selection-gate-line driving circuit 120C outputs a voltage $V_{SGD2}$. The fourth selection-gate-line driving circuit 120D outputs a voltage $V_{SGD3}$. The fifth selection-gate-line driving circuit 120E outputs a voltage $V_{SGD4}$. The sixth selection-gate-line driving circuit 120F outputs a voltage $V_{SGS}$.

The first selection-gate-line driving circuit 120A has voltage converting circuits 121A, 121B and transfer transistors 122A, 122B. The voltage converting circuits 121A and 1213 have input terminals that receive control signals from the sequencer 200. The voltage converting circuit 121A has an output terminal that is connected to the gate of the transfer transistor 122A. The voltage converting circuit 121B has an output terminal that is connected to the gate of the transfer transistor 122B. The output terminals of the transfer transistors 122A and 122B are commonly connected. The input terminal of the transfer transistor 122A is connected to the ground voltage Vss. The input terminal of the transfer transistor 122B is connected to the power supply voltage Vdd. Note that the second to sixth selection-gate-line driving circuits 120B to 120F have the same configuration as the first selection-gate-line driving circuit 120A.

Figure 5C:
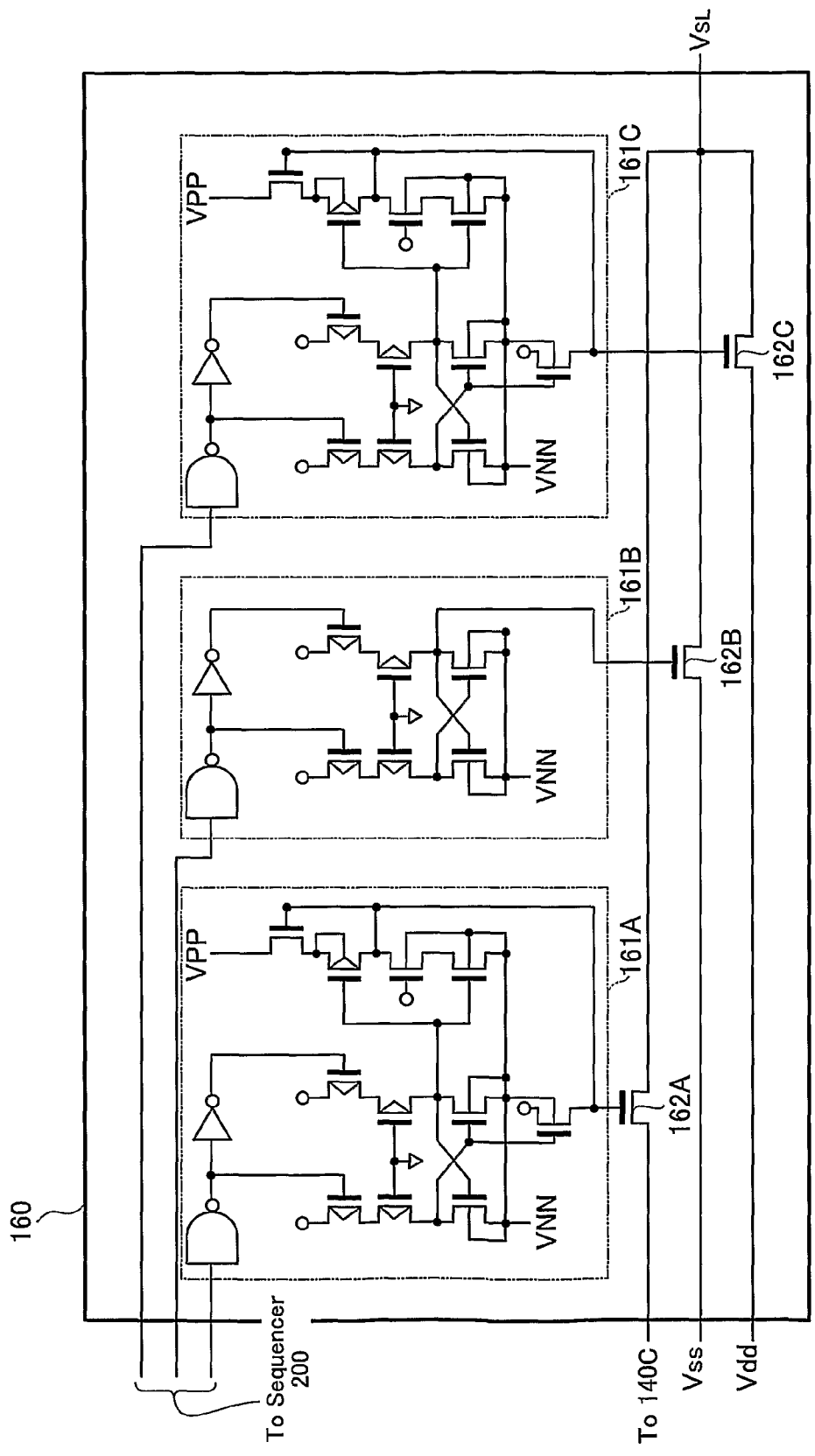
FIG. 5C is a circuit diagram of the source-line driving circuit 160.

As illustrated in FIG. 5C, the source-line driving circuit 160 has voltage converting circuits 161A to 161C and transfer transistors 162A to 162C. The voltage converting circuits 161A to 161C and the transfer transistors 162A to 162C are connected as in the first word-line driving circuit 110A. The voltage converting circuits 161A to 161C have input terminals that receive control signals from the sequencer 200. The input terminal of the transfer transistor 162A is connected to the output terminal of the boost circuit 140C. The input terminal of the transfer transistor 162B is connected to the ground voltage Vss. The input terminal of the transfer transistor 162C is connected to the power supply voltage Vdd.

Figure 6:
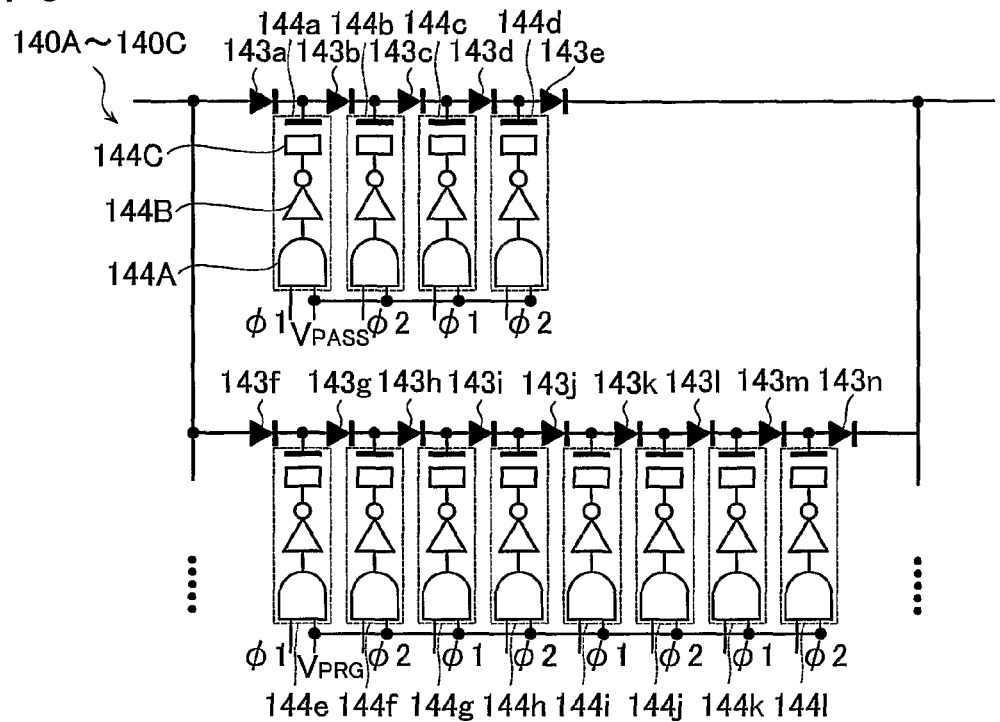
FIG. 6 is a circuit diagram of the boost circuits 140A to 140C.

The boost circuits 140A to 140C generate a voltage higher than the power supply voltage Vdd by means of charge and discharge of condensers. As illustrated in FIG. 6, the boost circuits 140A to 140C have diodes 143a to 143n as well as charge and discharge circuits 144a to 144l. Note that the boost circuits 140A to 140C may have more diodes and charge and discharge circuits.

The diodes 143a to 143e are connected in series. The diodes 143f to 143n are connected in series. One end of the diode 143a is connected to one end of the diode 143f. One end of the diode 143e is connected to one end of the diode 143n.

The charge and discharge circuits 144a to 144d have their output terminals connected between the diodes 143a to 143e. The charge and discharge circuits 144e to 144l have their output terminals connected between the diodes 143f to 143n. Each of the charge and discharge circuits 144a to 144l involves an AND circuit 144A, an inverter 144B, and a capacitor 144C connected in series.

In the charge and discharge circuits 144a to 144d, the input terminals at one ends of the AND circuits 144A alternately receive signals φ1 or φ2. In the charge and discharge circuits 144a to 144d, the input terminals at the other ends of the AND circuits 144A receive signals $V_{PASS}$.

In the charge and discharge circuits 144e to 144l, the input terminals at one ends of the AND circuits 144A alternately receive signals φ1 or φ2. In the charge and discharge circuits 144e to 144l, the input terminals at the other ends of the AND circuits 144A receive signals $V_{PRG}$.

Figure 7A:
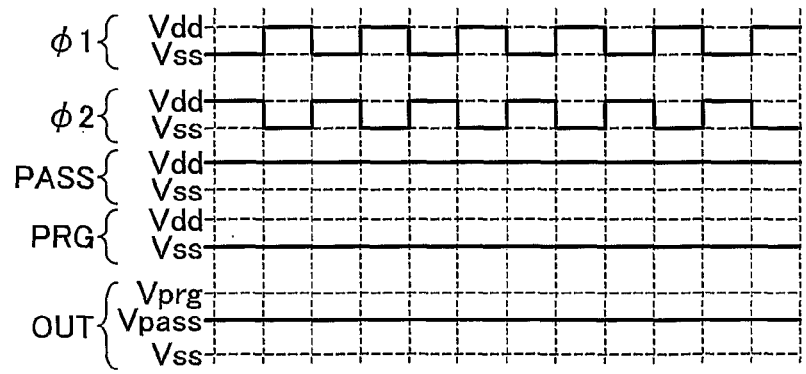
FIG. 7A is a timing chart illustrating an operation of the boost circuits 140A to 140C.
Figure 7B:
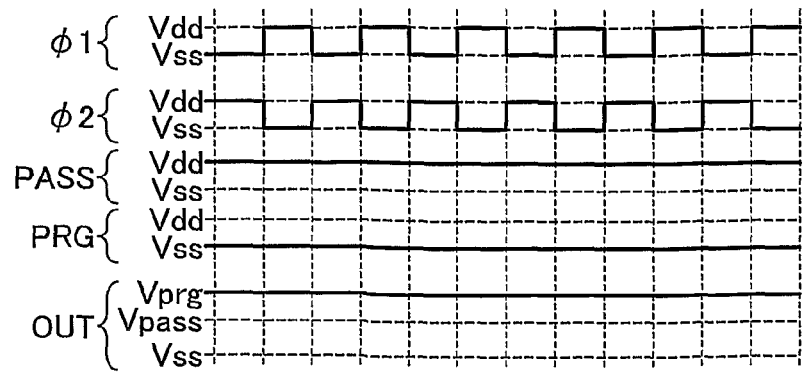
FIG. 7B is a timing chart illustrating an operation of the boost circuits 140A to 140C.

Referring now to FIGS. 7A and 7B, operations of the boost circuits 140A to 140C will be described below. FIGS. 7A and 7B are timing charts illustrating operations of the boost circuits 140A to 140C. As illustrated in FIGS. 7A and 7B, the boost circuits 140A to 140C set signals $V_{PASS}$ or signals $V_{PRG}$ to the power supply voltage Vdd or the ground voltage Vss, depending on the generated signals.

Figure 8A:
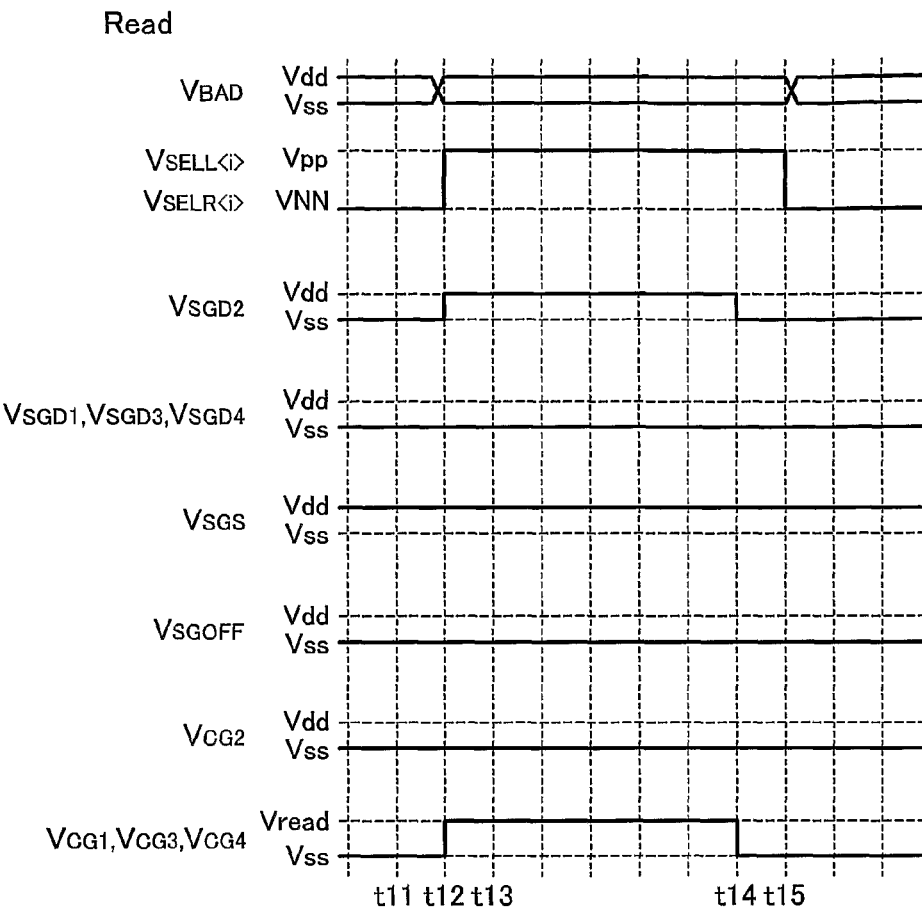
FIG. 8A is a timing chart illustrating a read operation by the non-volatile semiconductor storage device 10 according to the first embodiment.
Figure 8B:
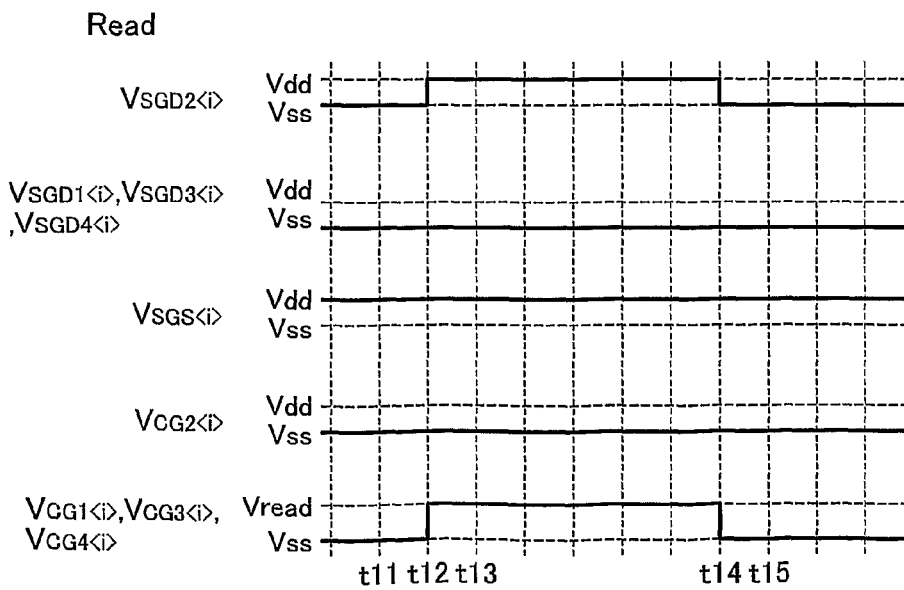
FIG. 8B is a timing chart illustrating a read operation by the non-volatile semiconductor storage device 10 according to the first embodiment.
Figure 8C:
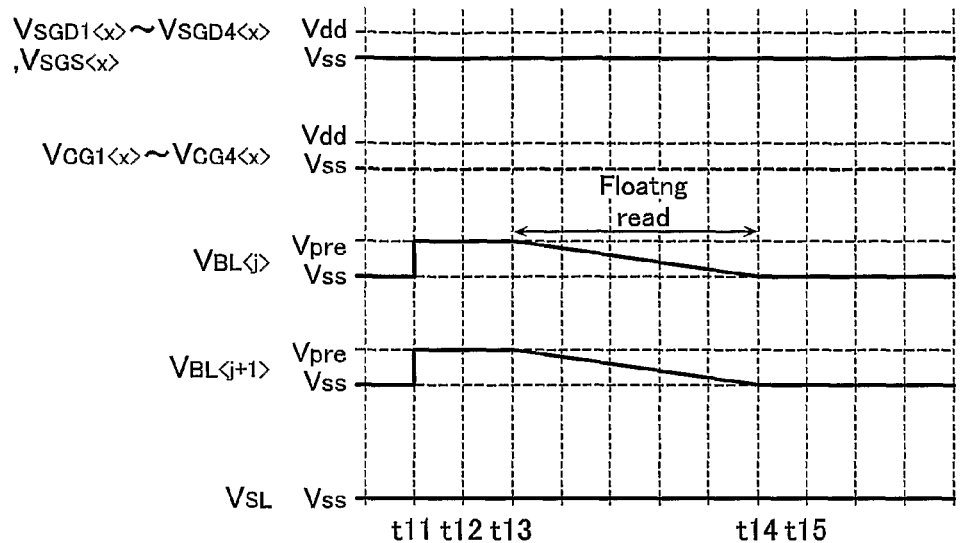
FIG. 8C is a timing chart illustrating a read operation by the non-volatile semiconductor storage device 10 according to the first embodiment.

The non-volatile semiconductor storage device 10 so configured according to the first embodiment operates as illustrated in FIGS. 8A to 8C in read operation. The read operation is performed on those memory strings MS that are connected to a drain-side selection gate line SGD2 in the ith memory block MB<i>. Furthermore, this read operation is performed on the memory transistor MTr2 that is included in the memory strings MS and that has its gate connected to a word line WL2. Note that the above-mentioned voltages $V_{SGD1<i>}$ to $V_{SGD4<i>}$, $V_{SGS<i>}$, and $V_{CG1<i>}$ to $V_{CG4<i>}$ are related to the selected block MB<i> that has been selected, while the voltages $V_{SGD1<x>}$ to $V_{SGD4<x>}$, $V_{SGS<i>}$, and $V_{CG1<x>}$ to $V_{CG4<x>}$ are related to the non-selected blocks MB<x> (x≠i) that have not been selected.

Figure 9A:
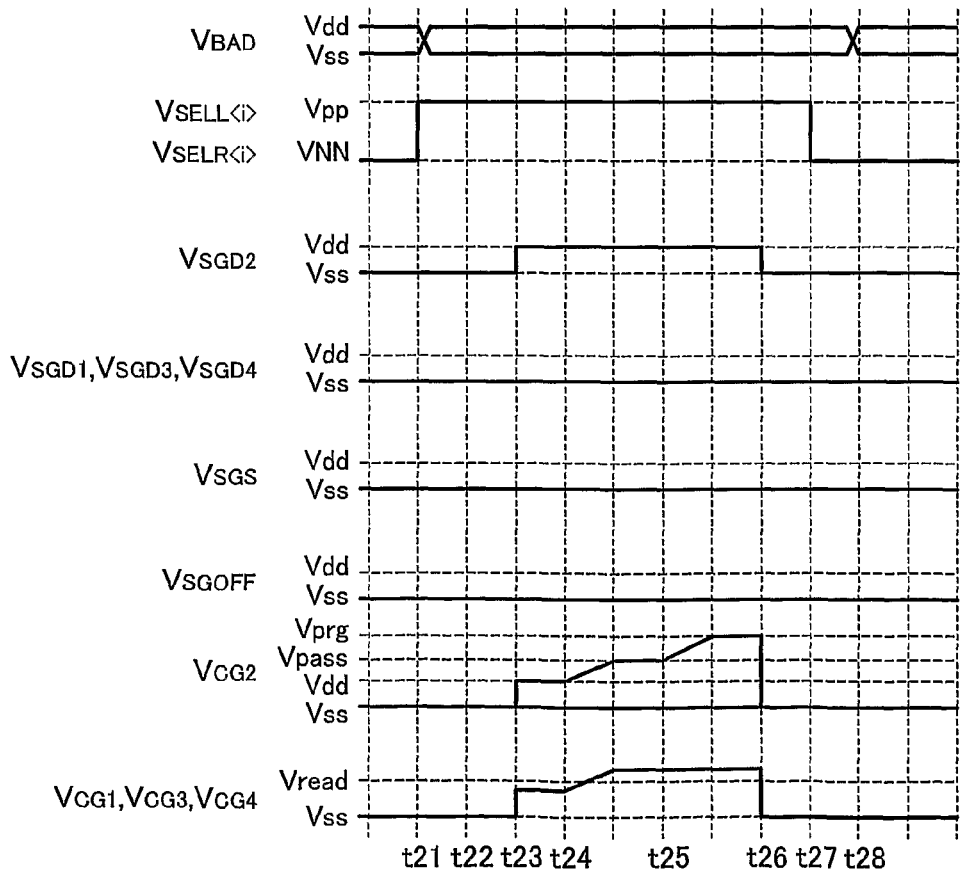
FIG. 9A is a timing chart illustrating a programming operation by the non-volatile semiconductor storage device 10 according to the first embodiment.
Figure 9B:
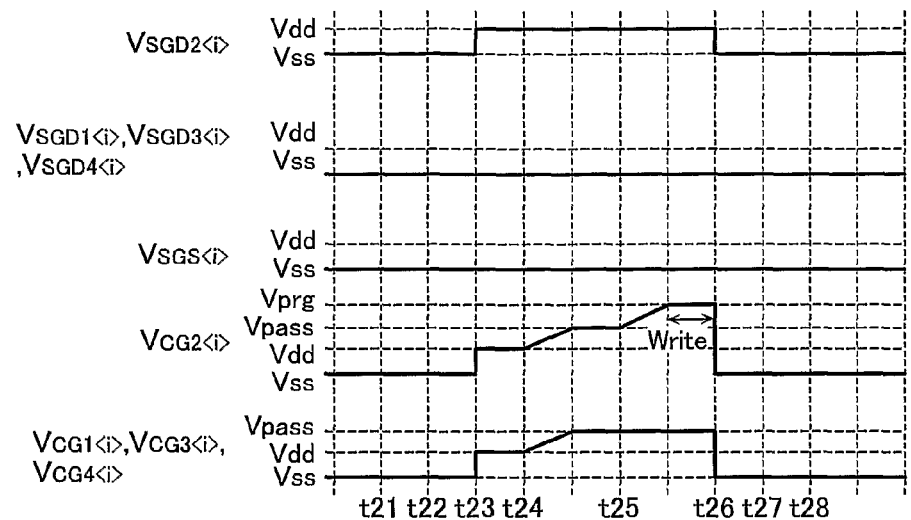
FIG. 9B is a timing chart illustrating a programming operation by the non-volatile semiconductor storage device 10 according to the first embodiment.
Figure 9C:
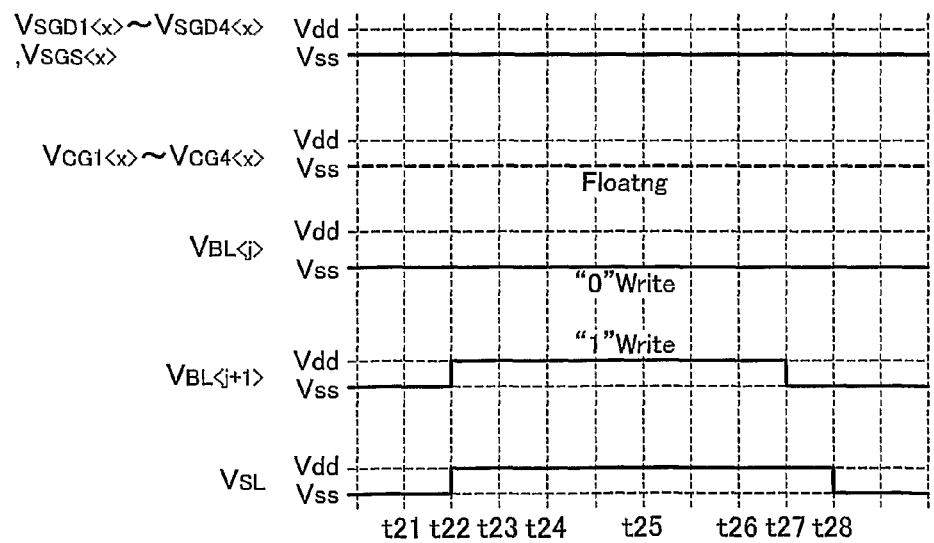
FIG. 9C is a timing chart illustrating a programming operation by the non-volatile semiconductor storage device 10 according to the first embodiment.

In addition, the non-volatile semiconductor storage device 10 according to the first embodiment operates as illustrated in FIGS. 9A to 9C in programming operation (write operation). The programming operation is performed on the same memory transistor MTr2 as mentioned earlier with respect to the read operation. Furthermore, this programming operation involves writing "0" to the memory transistor MTr2 connected to a bit line BL<j>, and "1" to the memory transistor MTr2 connected to a bit line BL<j+1>.

Figure 10A:
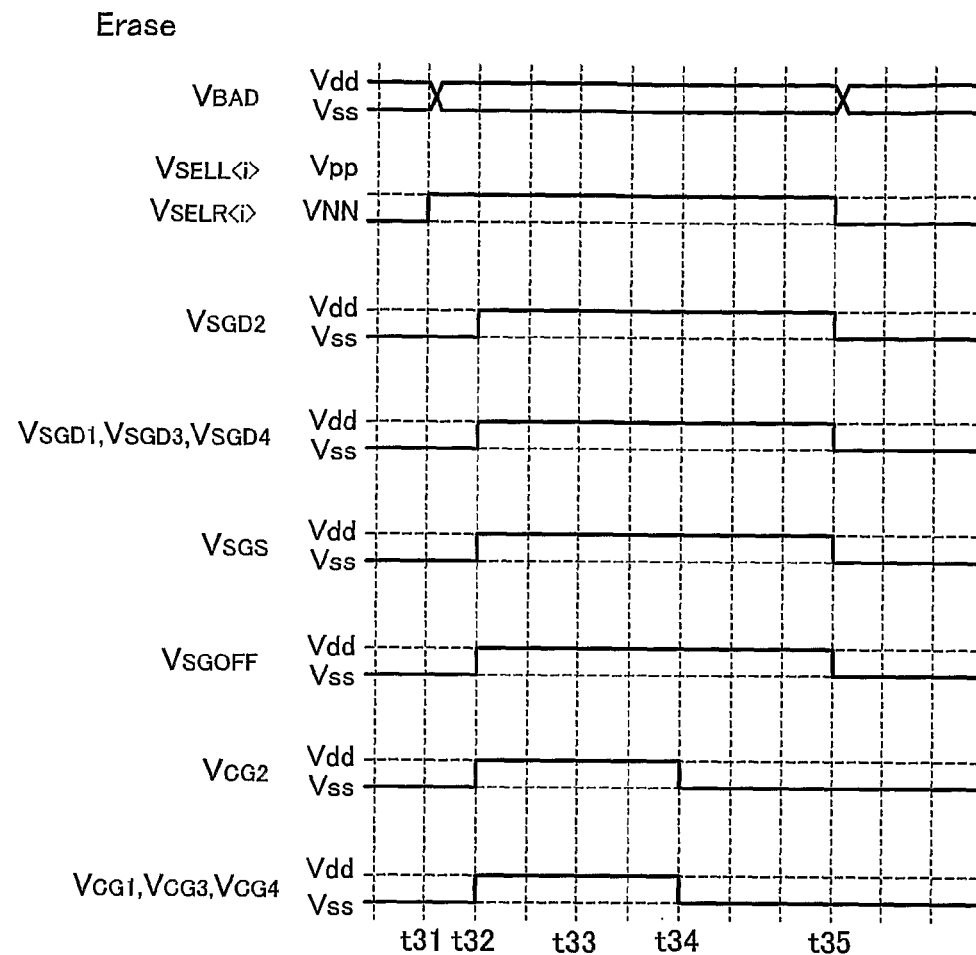
FIG. 10A is a timing chart illustrating an erase operation by the non-volatile semiconductor storage device 10 according to the first embodiment.
Figure 10B:
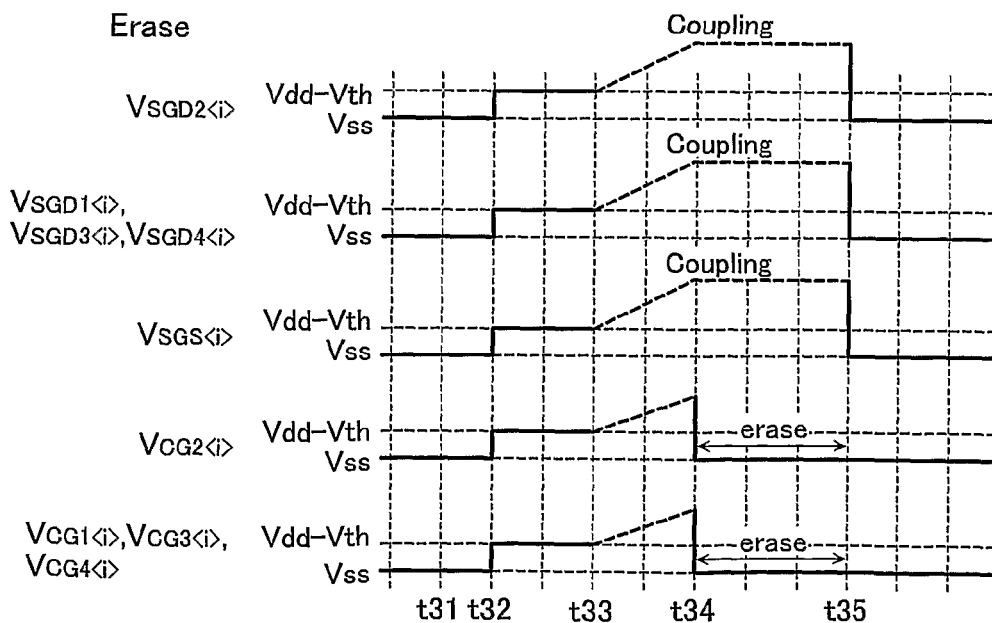
FIG. 10B is a timing chart illustrating an erase operation by the non-volatile semiconductor storage device 10 according to the first embodiment.
Figure 10C:
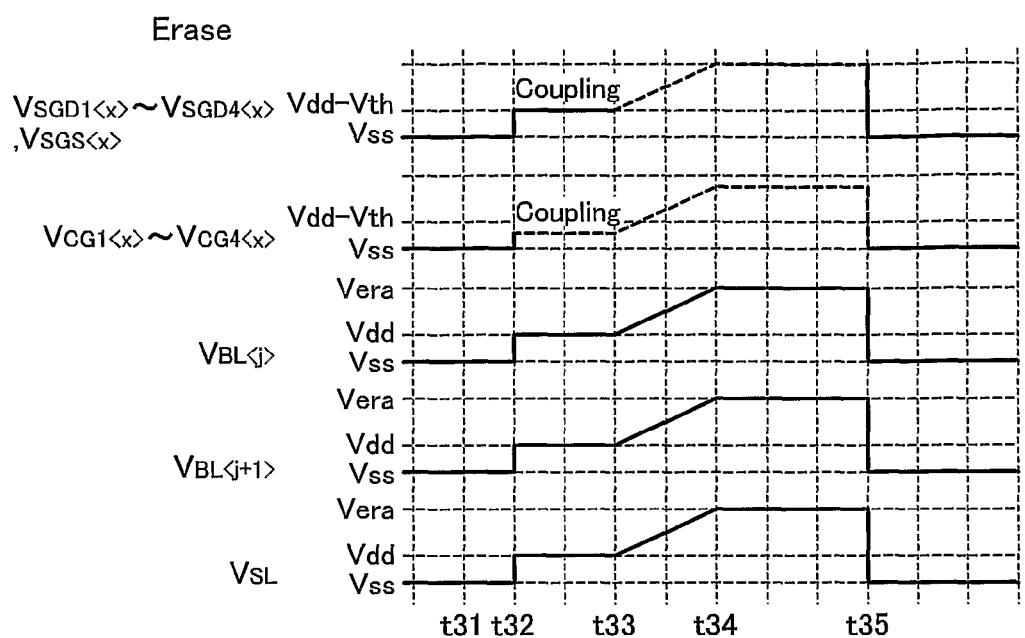
FIG. 10C is a timing chart illustrating an erase operation by the non-volatile semiconductor storage device 10 according to the first embodiment.

In addition, the non-volatile semiconductor storage device 10 according to the first embodiment operates as illustrated in FIGS. 10A to 10C in erase operation. The erase operation is performed on the entire ith memory block MB<i>.

(Lamination Structure of Non-Volatile Semiconductor Storage Device 10 in First Embodiment)

Figure 11:
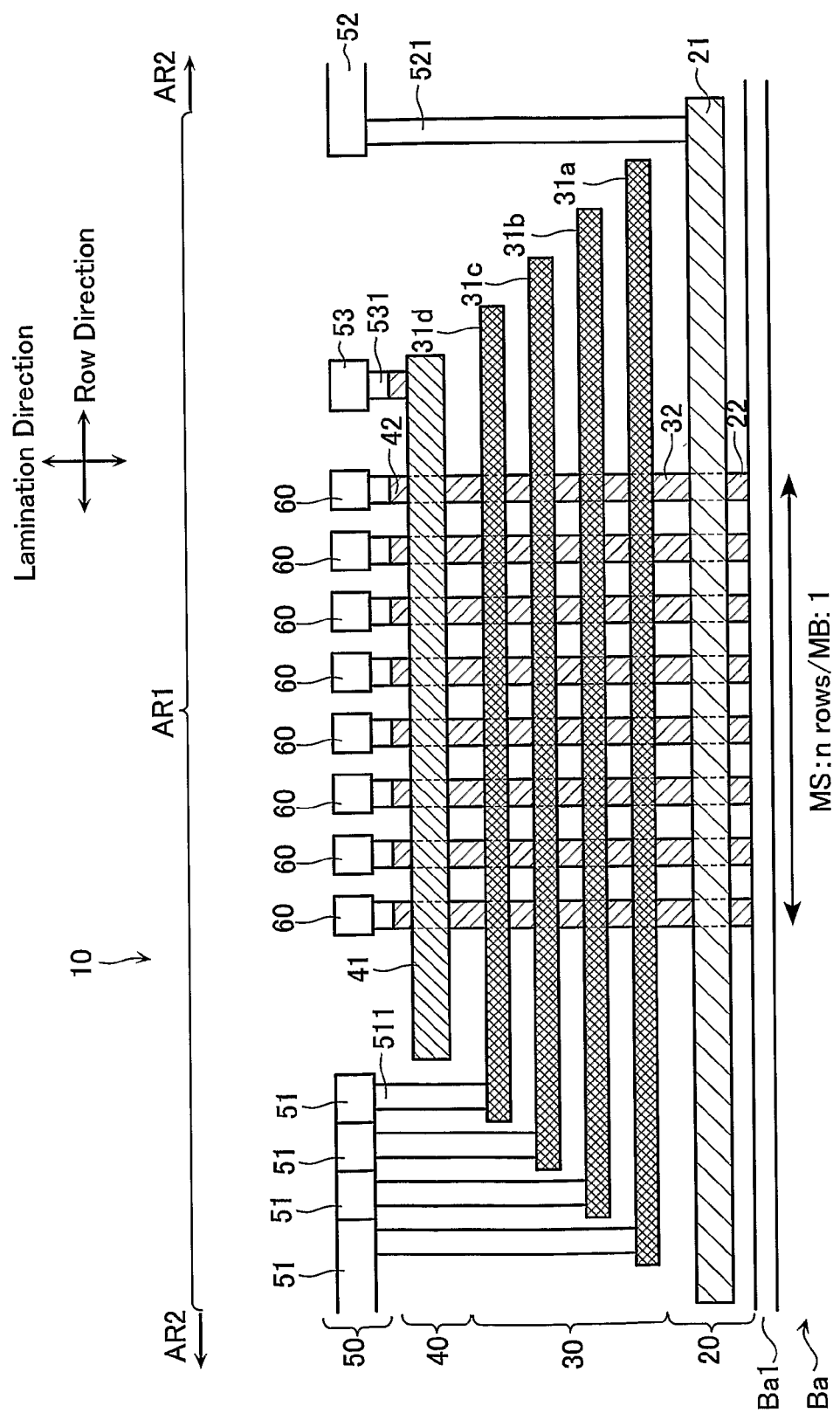
FIG. 11 is a cross-sectional view in the row direction of the non-volatile semiconductor storage device 10 according to the first embodiment.
Figure 12:
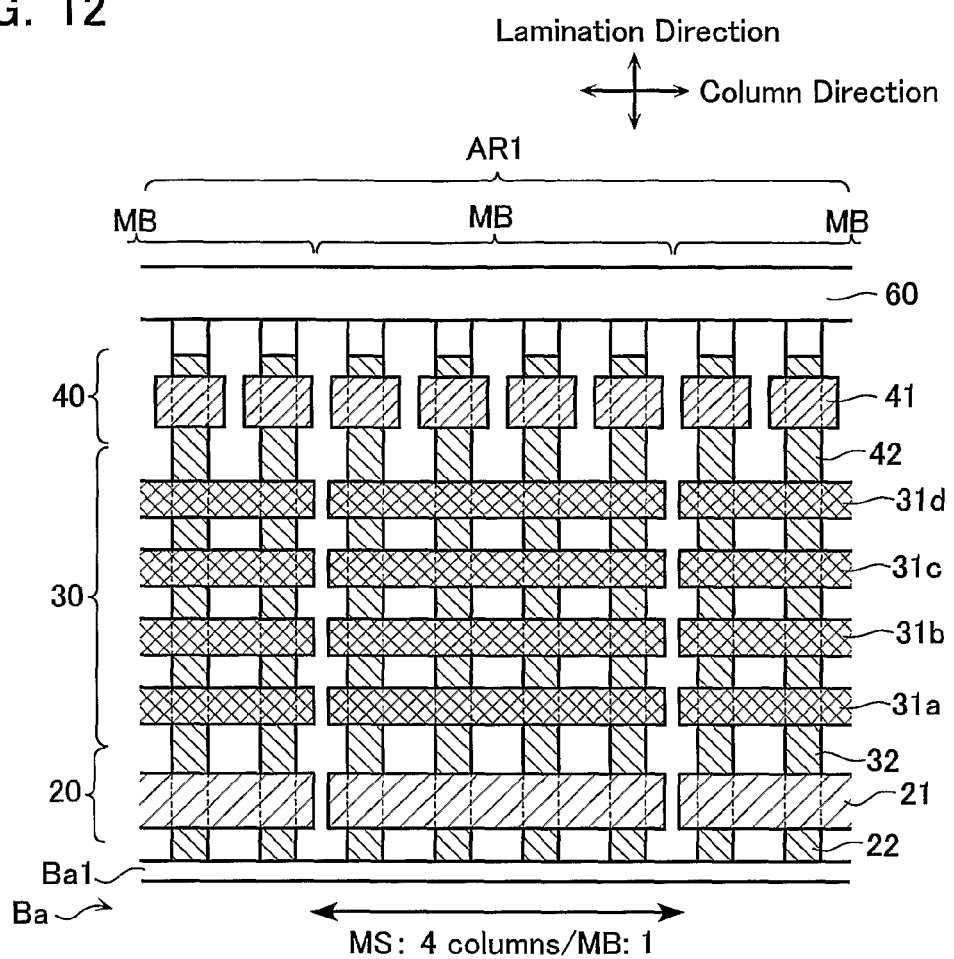
FIG. 12 is a cross-sectional view in the column direction of the non-volatile semiconductor storage device 10 according to the first embodiment.
Figure 13:
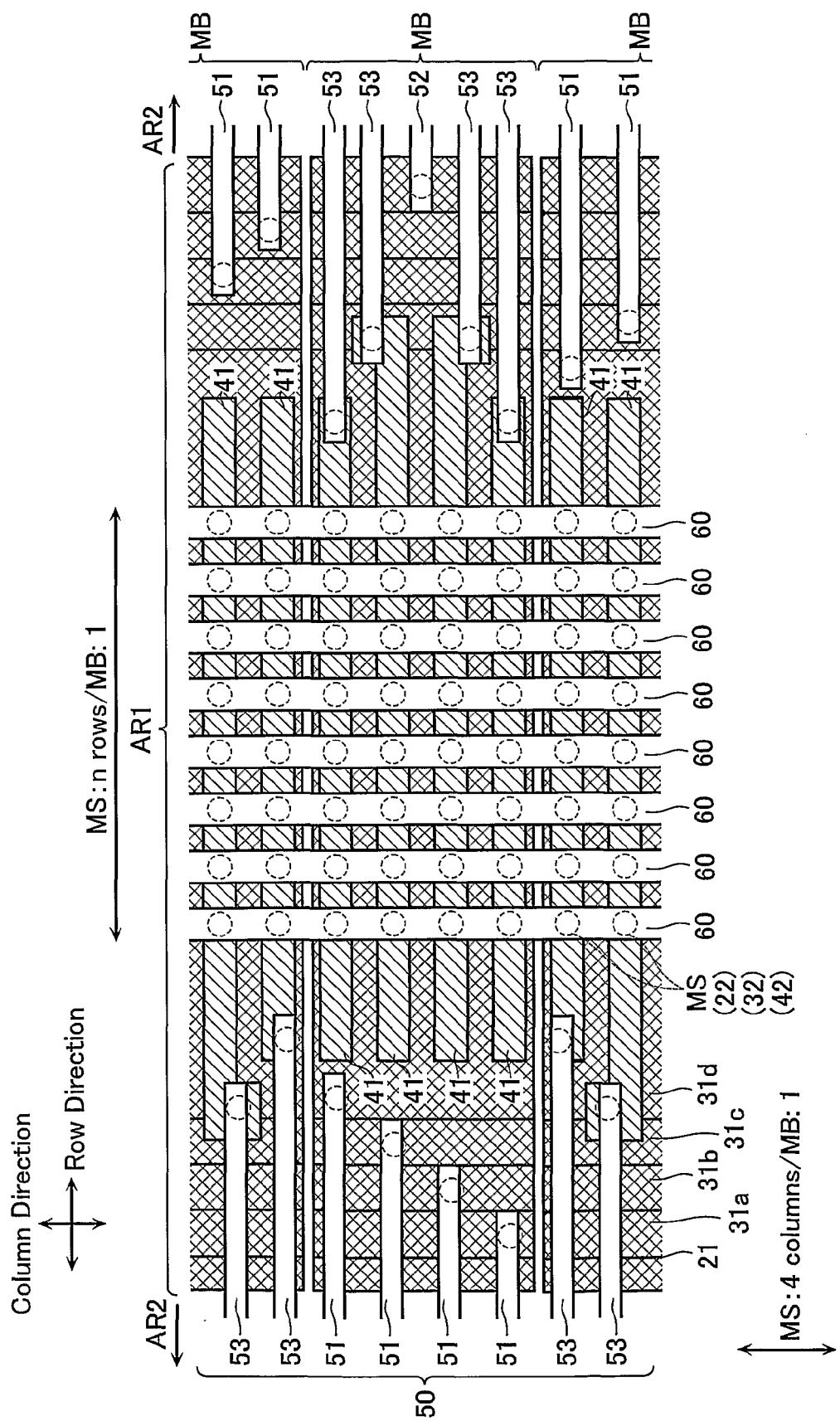
FIG. 13 is a top plan view of the non-volatile semiconductor storage device 10 according to the first embodiment.
Figure 14:
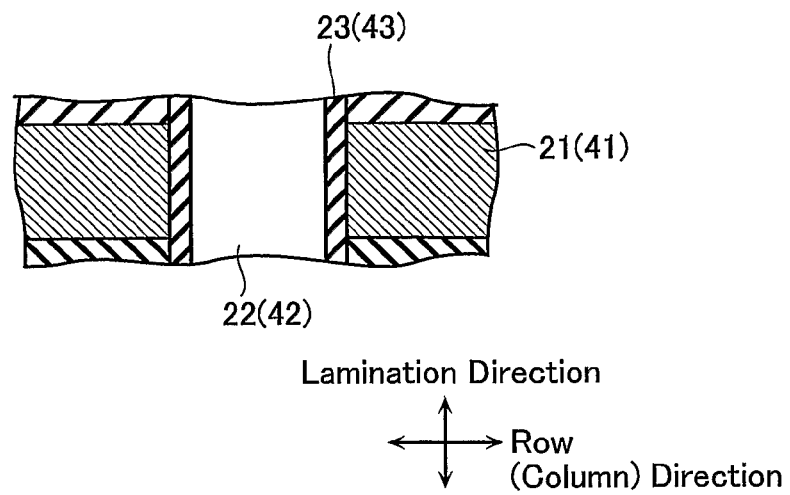
FIG. 14 is a partial enlarged view of FIG. 11.
Figure 15:
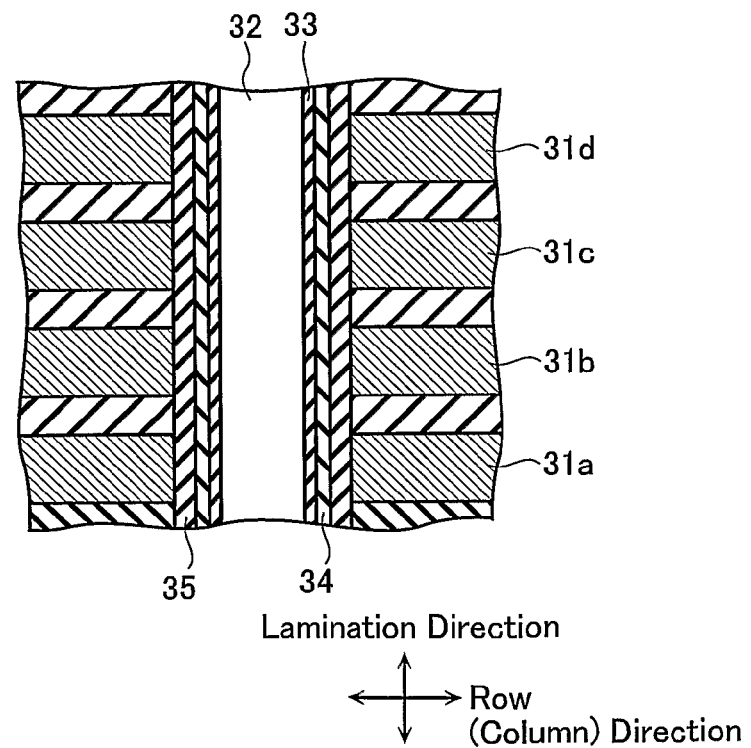
FIG. 15 is a partial enlarged view of FIG. 11.

Referring now to FIGS. 11 to 16, a lamination structure of the non-volatile semiconductor storage device 10 according to the first embodiment as summarized with reference to FIG. 4 will be described in more detail below. FIG. 11 is a cross-sectional view in the row direction of the non-volatile semiconductor storage device 10 according to the first embodiment. FIG. 12 is a cross-sectional view in the column direction of the non-volatile semiconductor storage device 10 according to the first embodiment. FIG. 13 is a top plan view of the non-volatile semiconductor storage device 10 according to the first embodiment. FIGS. 14 and 15 are partial enlarged views of FIG. 11. FIGS. 11 to 13 omit interlayer insulation layers.

As illustrated in FIG. 11, a memory transistor area AR1 has a n$^+$ diffusion layer Ba1 that is provided on the semiconductor substrate Ba. In addition, the memory block MB (the memory transistor area AR1) has a source-side selection transistor layer 20, a memory transistor layer 30, and a drain-side selection transistor layer 40 that are sequentially provided on the semiconductor substrate Ba. The source-side selection transistor layer 20 functions as source-side selection transistors SSTr. The memory transistor layer 30 functions as memory transistors MTr1 to MTr4. The drain-side selection transistor layer 40 functions as drain-side selection transistors SDTr.

As illustrated in FIG. 11, the source-side selection transistor layer 20 has source-side conductive layers 21 and source-side columnar semiconductor layers 22. As illustrated in FIGS. 12 and 13, the source-side conductive layers 21 extend over a predetermined area parallel to the semiconductor substrate Ba, and they are separated for each memory block MB. The source-side columnar semiconductor layers 22 are formed in columnar shape so as to penetrate the respective source-side conductive layers 21 to the semiconductor substrate Ba. As illustrated in FIG. 13, the source-side columnar semiconductor layers 22 are formed in a matrix form, as viewed from above. The source-side columnar semiconductor layers 22 are formed to be aligned in the column direction. Each memory block MB has n rows and 4 columns of source-side columnar semiconductor layers 22 formed therein. The source-side conductive layers 21 and the source-side columnar semiconductor layers 22 are composed of polysilicon (p-Si).

In addition, the source-side selection transistor layer 20 has source-side gate insulation layers 23 as illustrated in FIG. 14. Each source-side gate insulation layer 23 is formed between a source-side conductive layer 21 and a source-side columnar semiconductor layer 22. The source-side gate insulation layers 23 are composed of silicon oxide ($SiO_2$).

In the source-side selection transistor layer 20 configured as mentioned above, the source-side selection transistors SSTr are configured about the respective source-side columnar semiconductor layers 22. The source-side conductive layers 21 function as the control gates of the source-side selection transistors SSTr. The source-side conductive layers 21 also function as parts of the source-side selection gate lines SGS.

In addition, the configuration of the source-side selection transistor layer 20 is restated as follows: a source-side conductive layer 21 is formed to surround 32 source-side columnar semiconductor layers 22 that are arranged with n rows in the row direction and 4 columns in the column direction. The source-side columnar semiconductor layers 22 are formed to extend downward from memory columnar semiconductor layers 32 described below. That is, 32 source-side columnar semiconductor layers 22 penetrate one source-side conductive layer 21.

As illustrated in FIG. 11, the memory transistor layer 30 has word-line conductive layers 31 (31a to 31d) that are laminated in four layers and memory columnar semiconductor layers 32. As illustrated in FIGS. 12 and 13, the word-line conductive layers 31a to 31d extend over a predetermined area parallel to the semiconductor substrate Ba, and they are separated for each memory block MB. The word-line conductive layers 31a to 31d are laminated with interlayer insulation layers sandwiched in between, although not illustrated in FIG. 11. The word-line conductive layers 31a to 31d are formed in a stepwise manner in relation to each other at their both ends in the row direction. The memory columnar semiconductor layers 32 are formed to extend in the lamination direction and to penetrate the word-line conductive layers 31a to 31d. As illustrated in FIG. 13, the memory columnar semiconductor layers 32 are formed in a matrix form, as viewed from above. The memory columnar semiconductor layers 32 are formed to be aligned in the column direction. Each memory block MB has n rows and 4 columns of memory columnar semiconductor layers 32 formed therein. The word-line conductive layers 31a to 31d and the memory columnar semiconductor layers 32 are composed of polysilicon (p-Si).

As illustrated in FIG. 15, the memory transistor layer 30 also has a tunnel insulation layer 33, an electric charge accumulation layer 34, and a block insulation layer 35. Each tunnel insulation layer 33, electric charge accumulation layer 34, and block insulation layer 35 are formed between word-line conductive layers 31 and a memory columnar semiconductor layer 32. A tunnel insulation layer 33, an electric charge accumulation layer 34, and a block insulation layer 35 are formed in the stated order from the memory columnar semiconductor layer 32 to the word-line conductive layers 31. The tunnel insulation layer 33 and the block insulation layer 35 are composed of silicon oxide ($SiO_2$). The electric charge accumulation layer 34 is composed of silicon nitride (SiN).

In the memory transistor layer 30 configured as mentioned above, the memory strings MS (memory transistors MTr1 to MTr4) are configured about the respective memory columnar semiconductor layers 32. The word-line conductive layers 31a to 31d function as the control gates of the memory transistors MTr1 to MTr4. The word-line conductive layers 31a to 31d also function as the word lines WL1 to WL4.

Furthermore, the configuration of the memory transistor layer 30 is restated as follows: the word-line conductive layers 31a to 31d are formed to surround "memory columnar semiconductor layers 32 that are arranged with n rows in the row direction and 4 columns in the column direction" in one memory block MB (so that n×4=4n memory columnar semiconductor layers 32 are commonly connected thereto). That is, 32 memory columnar semiconductor layers 32 penetrate the respective word-line conductive layers 31a to 31d.

As illustrated in FIG. 11, the drain-side selection transistor layer 40 has drain-side conductive layers 41 and drain-side columnar semiconductor layers 42. As illustrated in FIGS. 12 and 13, the drain-side conductive layers 41 are formed to extend in the row direction and to be aligned in the column direction. In addition, the drain-side conductive layers 41 are separated for each memory block MB. Four columns of drain-side conductive layers 41 are provided in line for each memory block MB. The respective drain-side columnar semiconductor layers 42 are formed in columnar shape so as to penetrate the drain-side conductive layers 41. As illustrated in FIG. 13, the drain-side columnar semiconductor layers 42 are formed in a matrix form, as viewed from above. The drain-side columnar semiconductor layers 42 are formed to be aligned in the column direction. Each memory block MB has n rows and 4 columns of drain-side columnar semiconductor layers 42 formed therein. The drain-side conductive layers 41 and the drain-side columnar semiconductor layers 42 are composed of polysilicon (p-Si).

As illustrated in FIG. 14, the drain-side selection transistor layer 40 also has drain-side gate insulation layers 43. Each drain-side gate insulation layer 43 is formed between a drain-side conductive layer 41 and a drain-side columnar semiconductor layer 42. The each drain-side gate insulation layers 43 are composed of silicon oxide ($SiO_2$).

In the drain-side selection transistor layer 40 configured as mentioned above, the drain-side selection transistors SDTr are configured about the respective drain-side columnar semiconductor layers 42. The respective drain-side conductive layers 41 function as the control gates of the respective drain-side transistors SDTr. The drain-side conductive layers 41 also function as parts of the drain-side selection gate lines SGD.

Furthermore, the configuration of the drain-side selection transistor layer 40 is restated as follows: four drain-side conductive layers 41 are formed to surround "drain-side columnar semiconductor layers 42 that are arranged with n rows in the row direction and 4 columns in the column direction" in one memory block MB (so that n×1=n drain-side columnar semiconductor layers 42 are commonly connected, respectively). The drain-side columnar semiconductor layers are formed to extend upward from the memory columnar semiconductor layers 32. That is, n drain-side columnar semiconductor layers 42 penetrate each drain-side conductive layer 41.

In addition, according to the above-mentioned configuration of the memory transistor area AR1, 4 columns of memory strings MS are arranged in the column direction for each memory block MB, as illustrated in FIG. 13.

Furthermore, as illustrated in FIG. 11, the non-volatile semiconductor storage device 10 according to the first embodiment comprises memory transistor areas AR1, as well as a wiring layer 50 and bit-line layers 60 that extend over a peripheral area AR2. The wiring layer 50 and the bit-line layers 60 are formed above the drain-side selection transistor layer 40. The wiring layer 50 and the bit-line layers 60 are formed in the same layer. Note that the bit-line layers 60 function as bit lines BL.

The wiring layer 50 comprises word connection layers 51, source-side connection layers 52, and drain-side connection layers 53.

As illustrated in FIG. 13, the word connection layers 51 are formed in rectangular shapes extending in the row direction. The word connection layers 51 are arranged with "4 columns" aligned in the column direction for each memory block MB. As illustrated in FIGS. 11 and 13, the word connection layers 51 are electrically connected via respective contact plug layers 511 to the word-line conductive layers 31a to 31d, at one end in the row direction of the word-line conductive layers 31a to 31d.

As illustrated in FIG. 13, the source-side connection layers 52 are formed in rectangular shapes extending in the row direction. The source-side connection layers 52 are provided, "1 row" for each memory block MB. As illustrated in FIGS. 11 and 13, the source-side connection layers 52 are electrically connected via respective contact plug layers 521 to the source-side conductive layers 21, at the other end in the row direction of the word-line conductive layers 31a to 31d (opposed to the side where the word connection layers 51 are connected to the word-line conductive layers 31a to 31d).

As illustrated in FIG. 13, the drain-side connection layers 53 are formed in rectangular shapes extending in the row direction. The drain-side connection layers 53 are arranged with "4 columns" aligned in the column direction for each memory block MB. As illustrated in FIGS. 11 and 13, the drain-side connection layers 53 are electrically connected via respective contact plug layers 531 to the drain-side conductive layers 42, at the other end in the row direction of the word-line conductive layers 31a to 31d.

As illustrated in FIG. 13, the bit-line layers 60 are formed in rectangular shapes extending in the column direction. The bit-line layers 60 are arranged with n rows aligned in the row direction for each memory block MB. The bit-line layers 60 are connected to the upper ends of the drain-side columnar semiconductor layers 42, respectively.

That is, the non-volatile semiconductor storage device 10 according to the first embodiment is formed with (Configuration 1) and (Configuration 2) as described below.

(Configuration 1) The Word Connection Layers 51

The word connection layers 51 extend to the vicinity of one end of the word-line conductive layer 31 in the row direction from one side of the memory block MB.

(Configuration 2) The Memory Strings MS

The number of memory strings MS arranged in the column direction for each memory block MB. i.e., "m" is 4.

The number of laminated word-line conductive layers 31. i.e., "n" is 4.

In view of (Configuration 1) and (Configuration 2) above, the non-volatile semiconductor storage device 10 according to the first embodiment is configured to satisfy a relation represented by (Formula 1):

$$m \geq n \quad \text{(Formula 1)}$$

(Advantages of Non-Volatile Semiconductor Storage Device 10 in First Embodiment)

Advantages of the non-volatile semiconductor storage device 10 according to the first embodiment will now be described below. As can be seen from the above, the non-volatile semiconductor storage device 10 according to the first embodiment is configured to satisfy the relation represented by (Formula 1) above. Accordingly, the non-volatile semiconductor storage device 10 according to the first embodiment may mitigate an increase in the area occupied by the word connection layers 51 and reduce the occupation area of the entire non-volatile semiconductor storage device 10.

Note that even if the word-line conductive layers 31a to 31d are formed to surround additional multiple columns of memory strings MS in the column direction, it is not necessary to increase the driving force of the first transfer transistors 172a to 175a in proportion to the number of memory strings MS. This is because the word-line conductive layers 31a to 31d have quite large CR time constants. Consequently, when the word-line conductive layers 31a to 31d are formed to surround those memory strings MS in the column direction, e.g., twice as many as those in the first embodiment, there will be little improvements in rising or falling rate thereof even if the driving force of the word-line driving circuit 110 is doubled. This means that as the number of first transfer transistors 172a to 175a decreases, the area of the word-line driving circuit 110 will simply be reduced by the corresponding amount.

[Second Embodiment]

(Lamination Structure of Non-Volatile Semiconductor Storage Device 10A in Second Embodiment)

Figure 16:
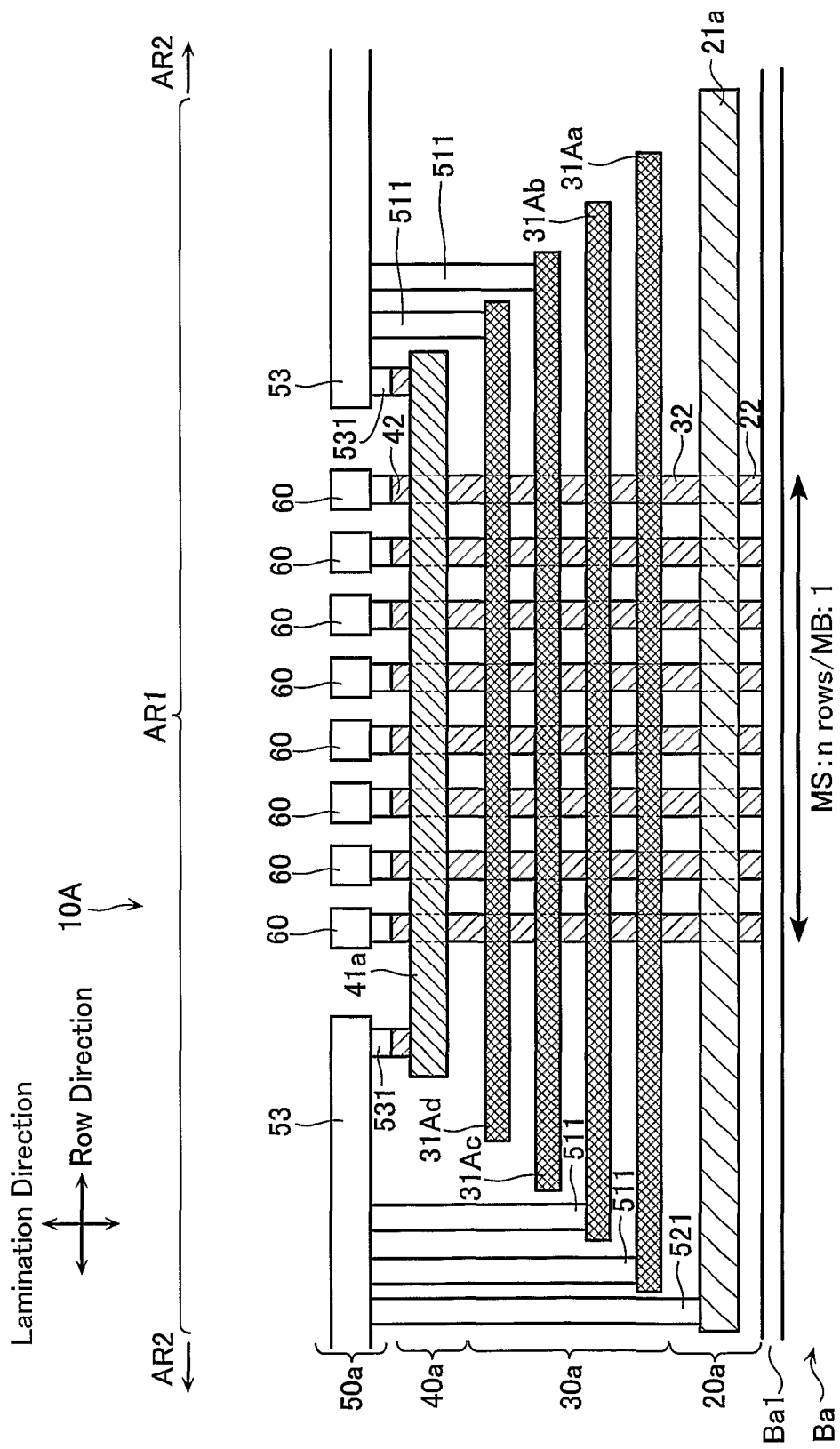
FIG. 16 is a cross-sectional view in the row direction of a non-volatile semiconductor storage device 10A according to a second embodiment.
Figure 17:
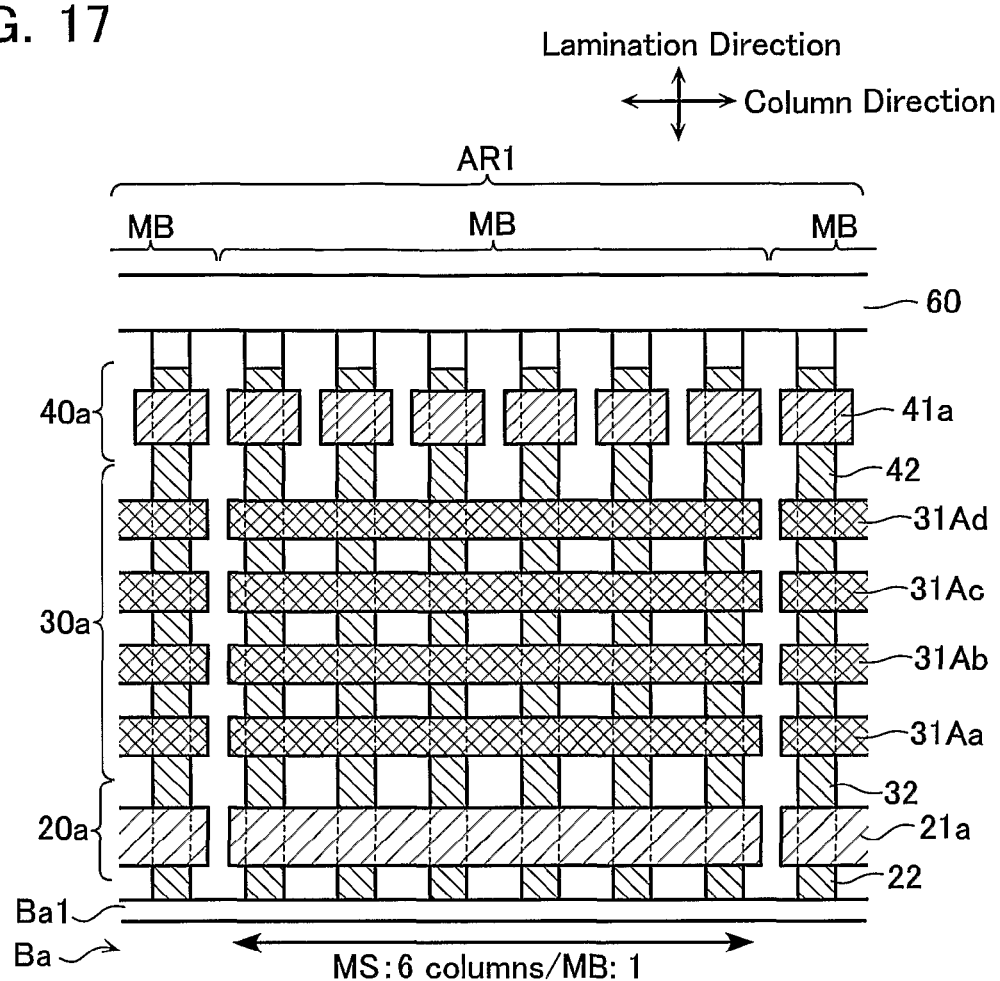
FIG. 17 is a cross-sectional view in the column direction of the non-volatile semiconductor storage device 10A according to the second embodiment.
Figure 18:
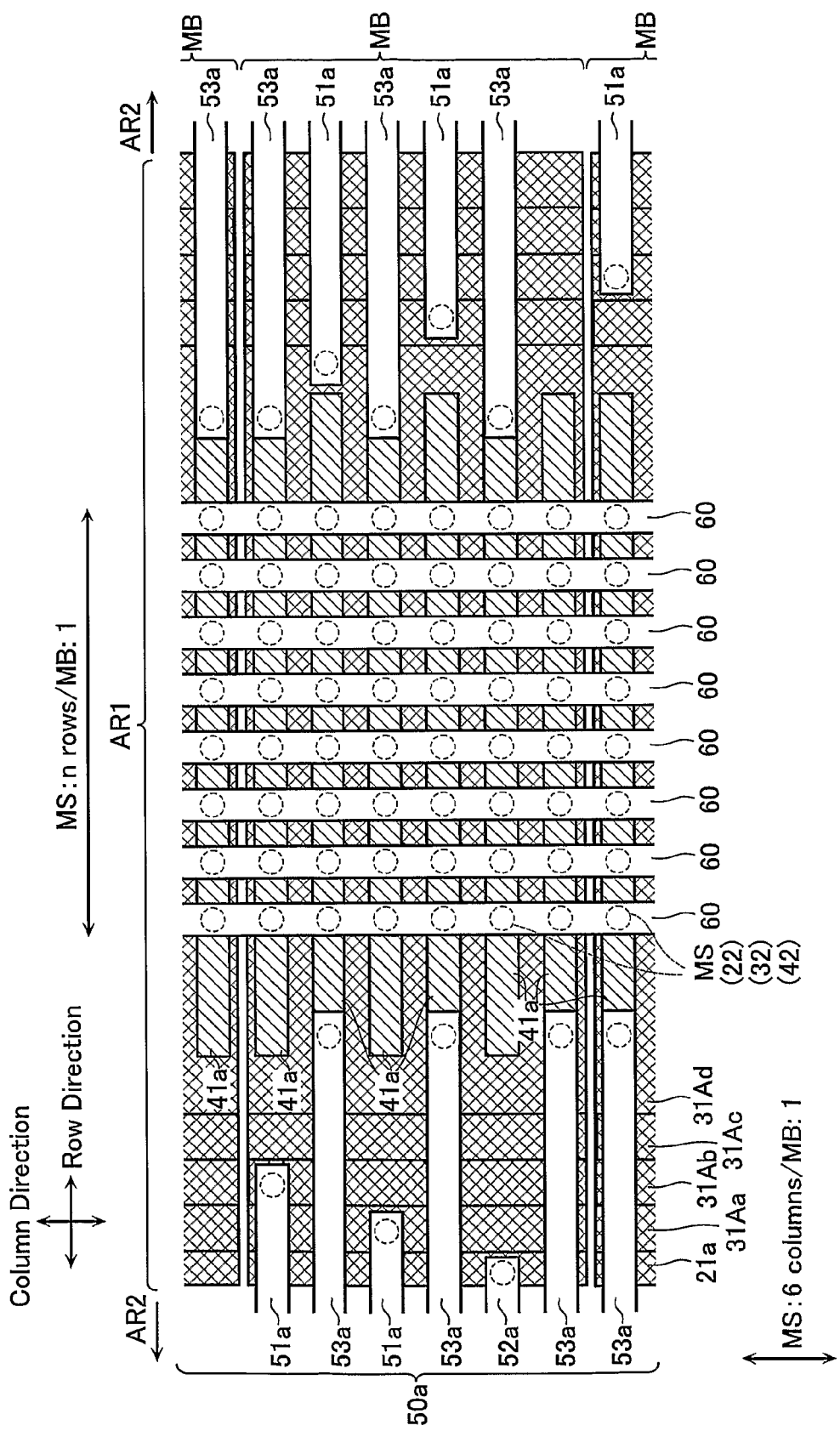
FIG. 18 is a top plan view of the non-volatile semiconductor storage device 10A according to the second embodiment.

Referring now to FIGS. 16 to 18, a lamination structure of a non-volatile semiconductor storage device 10A according to a second embodiment will be described below. FIG. 16 is a cross-sectional view in the row direction of the non-volatile semiconductor storage device 10A according to the second embodiment. In addition, FIG. 17 is a cross-sectional view in the column direction of the non-volatile semiconductor storage device 10A, and FIG. 18 is a top plan view thereof. FIGS. 16 to 18 omit interlayer insulation layers. Note that the same reference numerals represent the same components as the first embodiment, and description thereof will be omitted in the second embodiment.

As illustrated in FIGS. 16 to 18, the non-volatile semiconductor storage device 10A according to the second embodiment has a source-side selection transistor layer 20a, a memory transistor layer 30a, a drain-side selection transistor layer 40a, and a wiring layer 50a, each of which is different from the first embodiment.

The source-side selection transistor layer 20a has source-side conductive layers 21a different from the first embodiment. Each source-side conductive layer 21a is formed to surround source-side columnar semiconductor layers 22 that are arranged with n rows in the row direction and 6 columns in the column direction (so that n×6=6n source-side columnar semiconductor layers 22 are commonly connected thereto).

The memory transistor layer 30a has word-line conductive layers 31A (31Aa to 31Ad) different from the word-line conductive layers 31a to 31d in the first embodiment. The word-line conductive layers 31Aa to 31Ad are formed to surround memory columnar semiconductor layers 32 that are arranged with n rows in the row direction and 6 columns in the column direction (so that n×6=6n memory columnar semiconductor layers 32 are commonly connected thereto). In other words, the word-line conductive layers 31Aa to 31Ad aggregate six memory strings MS aligned in the column direction in each memory block MB. In the second embodiment, the number "6" of memory strings MS arranged in the column direction for each memory block MB is larger than the number "4" of laminated word-line conductive layer 31A. Note that the word-line conductive layers 31Aa to 31Ad are connected to row decoder circuits and driven by the corresponding transfer transistors (not illustrated), as in the first embodiment.

The drain-side selection transistor layer 40a has a drain-side conductive layer 41a different from the first embodiment. Drain-side conductive layers 41a are arranged with 3 columns in the column direction for each memory block MB. The drain-side conductive layers 41a are separated for each memory block MB in the row direction. Each drain-side conductive layer 41a is formed to surround drain-side columnar semiconductor layers 42 that are arranged with n rows in the row direction and 1 column in the column direction.

The wiring layer 50a has word connection layers 51a, source-side connection layers 52a, and drain-side connection layers 53a, each of which is different from the first embodiment.

As illustrated in FIG. 18, the word connection layers 51a are electrically connected via respective contact plug layers 511 to word-line conductive layers 41aa to 41ad at the both ends in the row direction of the word-line conductive layers 31Aa to 31Ad. The word connection layers 51a are provided with "2 columns" at one end in the row direction of the word-line conductive layers 31Aa to 31Ad for each memory block MB. The word connection layers 51a are also provided with "2 columns" at the other end in the row direction of the word-line conductive layers 31Aa to 31Ad for each memory block MB.

As illustrated in FIG. 18, source-side connection layers 52a are electrically connected via respective contact plugs 521 to the source-side conductive layers 21a, at one end in the row direction of the word-line conductive layers 31Aa to 31Ad. The source-side connection layers 52a are provided with "1 row" at one end in the row direction for each memory block MB.

As illustrated in FIG. 18, the drain-side connection layers 53a are electrically connected via respective contact plugs 531 to the drain-side conductive layers 41a, at one end in the row direction of the word-line conductive layers 31Aa to 31Ad. The drain-side connection layers 53a are provided with "3 columns" at one end in the row direction for each memory block MB. The drain-side connection layers 53a are also provided with "3 columns" at the other end in the row direction for each memory block MB.

That is, the non-volatile semiconductor storage device 10A according to the second embodiment is formed with (Configuration 1a) and (Configuration 2a described below) different from the first embodiment.

(Configuration 1a) The Word Connection Layers 51a
The word connection layers 51a extend to the vicinity of both ends of the word-line conductive layer 31A in the row direction from both sides of the memory block MB.
(Configuration 2a) The Memory Strings MS
The number of memory strings MS arranged in the column direction for each memory block MB. i.e., "m" is 3.
The number of laminated word-line conductive layers 31A. i.e., "n" is 4.

In view of (Configuration 1a) and (Configuration 2a) above, the non-volatile semiconductor storage device 10A according to the second embodiment is configured to satisfy a relation represented by (Formula 2):

$$m \leq n/2 \quad \text{(Formula 2)}$$

(Advantages of Non-Volatile Semiconductor Storage Device 10A in Second Embodiment)

Advantages of the non-volatile semiconductor storage device 10A according to the second embodiment will now be described below. The non-volatile semiconductor storage device 10A according to the second embodiment has the same advantages as the first embodiment since it is configured to satisfy the relation represented by (Formula 2) above.

[Third Embodiment]
(General Configuration of Non-Volatile Semiconductor Storage Device 10B in Third Embodiment)

Figure 19:
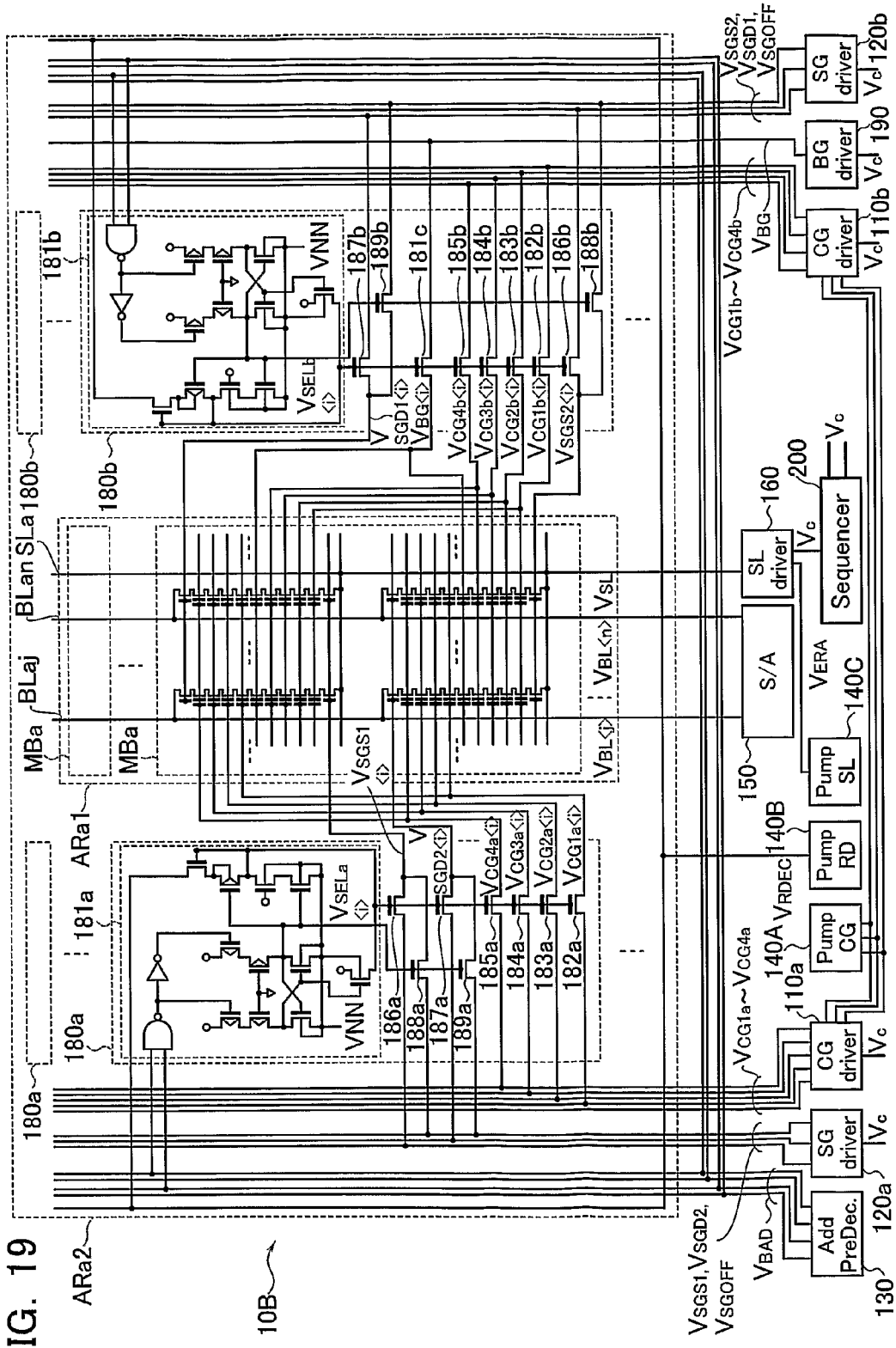
FIG. 19 is a circuit diagram of a non-volatile semiconductor storage device 10B according to a third embodiment.

Referring now to FIG. 19, a general configuration of a non-volatile semiconductor storage device 10B according to a third embodiment will be described below. FIG. 19 is a circuit diagram of the non-volatile semiconductor storage device 10B according to the third embodiment. Note that the same reference numerals represent the same components as the first and second embodiments, and description thereof will be omitted in the third embodiment.

As illustrated in FIG. 19, the non-volatile semiconductor storage device 10B according to the third embodiment has memory transistor areas ARa1 and a peripheral area ARa2 provided on the periphery thereof. Each memory transistor area ARa1 is an area that has electrically rewritable memory transistors MTra1 to MTra8 (memory cells). The peripheral area ARa2 is an area that has different control circuits for controlling voltages applied to the memory transistors MTra1 to MTra8, etc.

Figure 20:
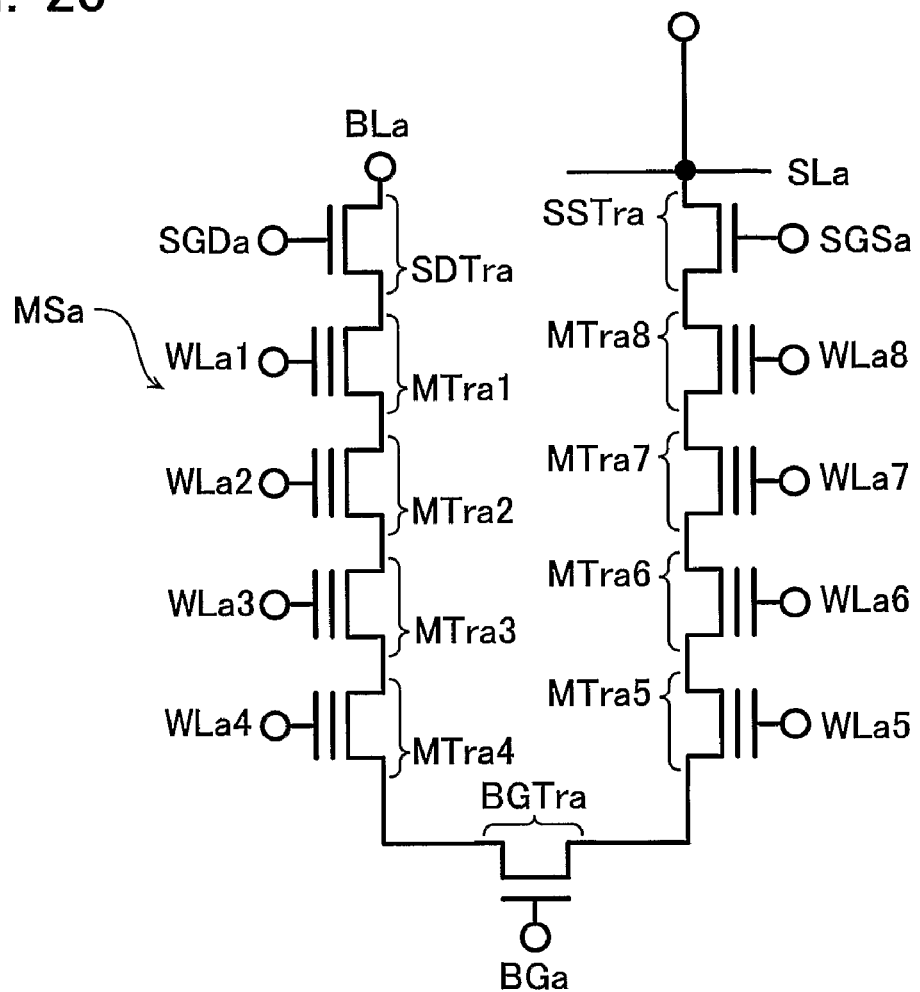
FIG. 20 is an enlarged view of FIG. 19.

Each memory transistor area ARa1 comprises a plurality of memory blocks having n rows and 2 columns of memory strings MSa. The memory strings MSa are formed in "U-shape", as viewed from a direction parallel to the substrate. As illustrated in FIG. 20, each memory string MSa has a configuration where eight electrically rewritable memory transistors MTra1 to MTra8 are connected in series. A source-side selection transistor SSTra and a drain-side selection transistor SDTra are provided at one end and the other of each memory string MS. The source-side selection transistor SSTra and the drain-side selection transistor SDTra control conduction of the memory string MS. The control gates of the memory transistors MTra1 to MTra8 are connected to word lines WLa1 to WLa8. The control gate of the source-side selection transistor SSTra is connected to a source-side selection gate line SGSa. The control gate of the drain-side selection transistor SDTra is connected to a drain-side selection gate line SGDa.

In addition, according to the third embodiment, the word lines WLa1 to WLa8 are shared by two adjacent memory strings MSa in the column direction in one memory block MBa. In other words, the word lines WLa1 to WLa8 aggregate two adjacent memory strings MSa in the column direction in one memory block MBa. In addition, the word line WLa1 and the word line WLa8 are formed in the same layer, which will be described in detail below. The word line WLa2 and the word line WLa7 are formed in the same layer. The word line WLa3 and the word line WLa6 are formed in the same layer. The word line WLa4 and the word line WLa5 are formed in the same layer. That is, the word lines WLa1 to WLa8 are formed in four layers. Note that the word lines WLa1 to WLa8 are connected to row decoder circuits (not illustrated) corresponding to the respective memory blocks MBa.

Figure 21:
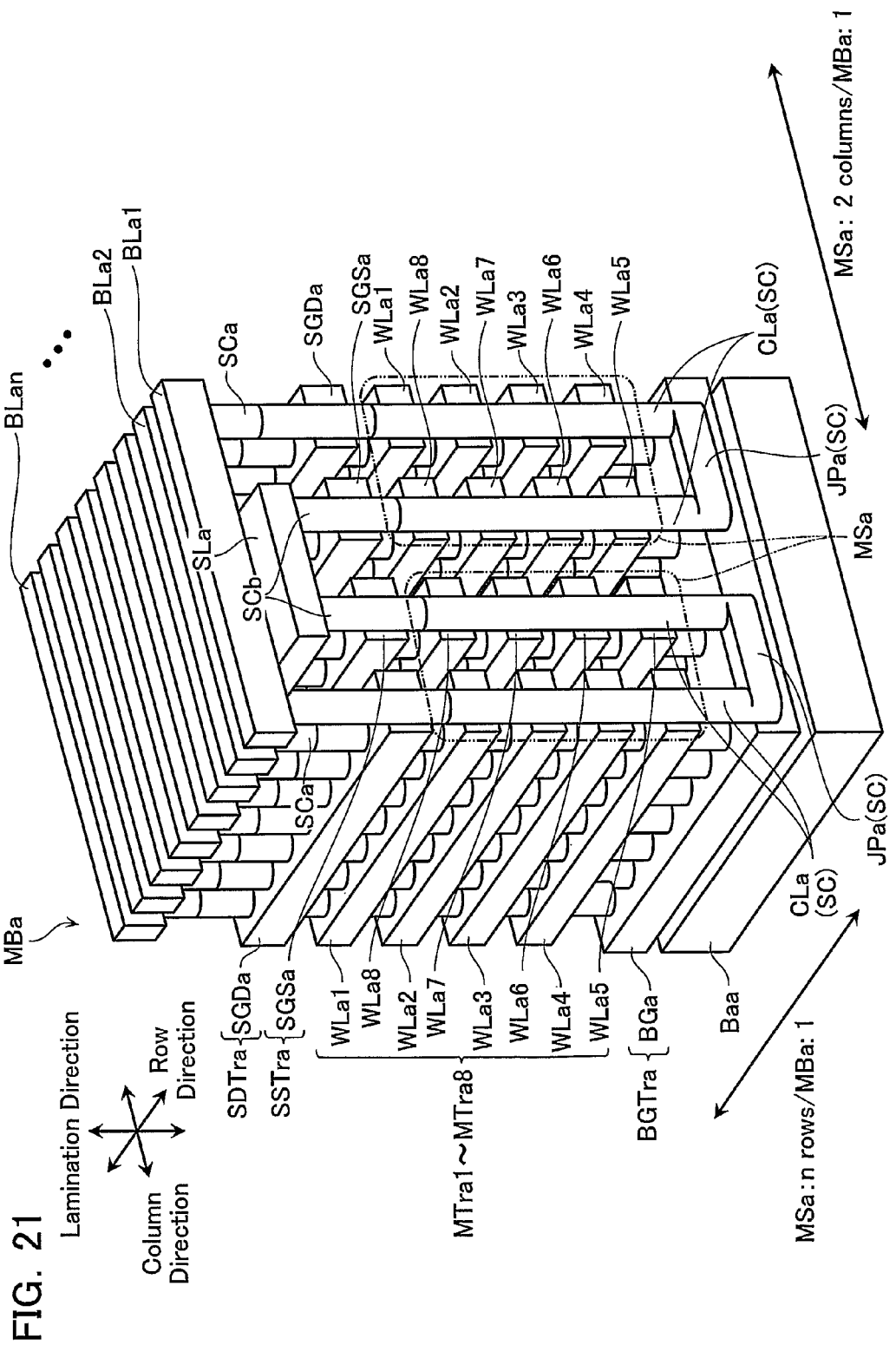
FIG. 21 a schematic diagram illustrating a lamination structure of a memory transistor area ARa1 according to the third embodiment.

Referring now to FIG. 21, a lamination structure of a memory transistor area ARa1 will be outlined below. FIG. 21 schematically illustrates a lamination structure of the memory transistor area ARa1. The memory transistor area ARa1 is formed on a semiconductor substrate Baa different from the first embodiment. The substrate Baa does not have any $n^+$ diffusion layer Ba1 as described in the first embodiment.

A memory block MBa (memory transistor area ARa1) has a U-shaped semiconductor SC provided for each memory string MSa, word lines WLa1 to WLa8, and a back gate line BGa.

Each U-shaped semiconductor SC is formed in U-shape, as viewed from the row direction. That is, each U-shaped semiconductor SC has a pair of columnar portions CLa extending in substantially the vertical direction with respect to the semiconductor substrate Baa, and a joining portion JPa formed to join the lower ends of the pair of columnar portions CLa. Note that the columnar portions CLa may be columnar or prismatic in shape. The columnar portions CLa may also be terraced columnar shape. Wherein the row direction represents one direction orthogonal to the lamination direction, and the column direction described below represents another orthogonal to the lamination direction and the row direction.

The U-shaped semiconductors SC are arranged in such a way that each straight line connecting the center axes of a pair of columnar portions CLa is parallel to the column direction. The U-shaped semiconductors SC are also arranged in a matrix form within a plane constituted by the row and column directions.

Each of the word lines WLa1 to WLa8 in respective layers has a shape extending in parallel to the row direction. The word lines WLa1 to WLa8 in respective layers are formed to extend in the column direction, insulated and isolated from each other. The word line WLa1 and the word line WLa8 are formed in the same layer. Similarly, the word line WLa2 and the word line WLa7, the word line WLa3 and the word line WLa6, and the word line WLa4 and the word line WLa5 are formed in the same layer, respectively.

The gates of the memory transistors MTra1 to MTra8 that are provided at the same position in the column direction and aligned in the row direction are connected to the same word lines WLa1 to WLa8, respectively. The word lines WLa1 to WLa8 are formed in a stepwise manner in relation to each other at their row direction ends. Each of the word lines WLa1 to WLa8 is formed to surround a plurality of columnar portions CLa aligned in the row direction.

Figure 22:
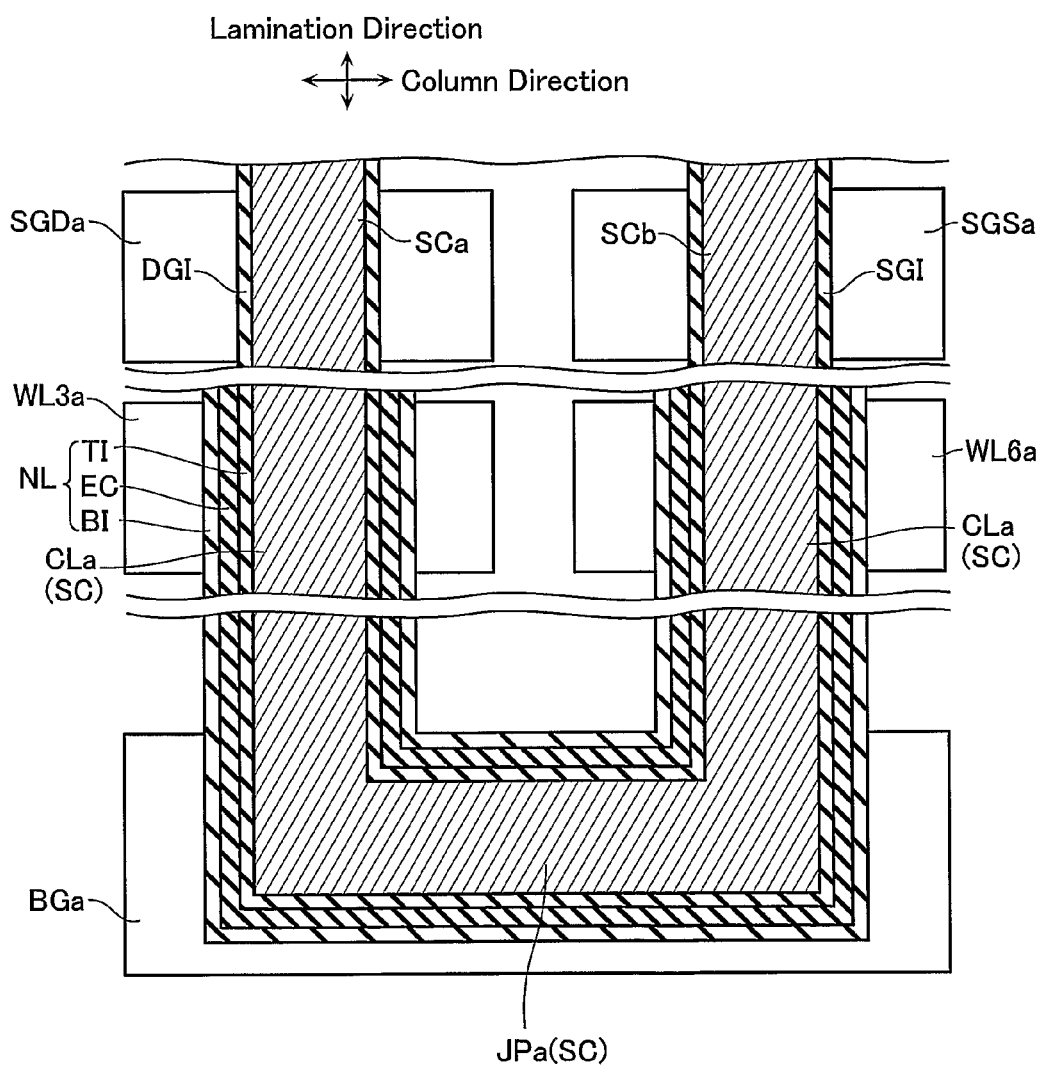
FIG. 22 is an enlarged cross-sectional view of FIG. 21.

As illustrated in FIG. 22, an ONO (Oxide-Nitride-Oxide) layer NL is formed between the word lines WLa1 to WLa8 and the columnar portions CLa. Each ONO layer NL has a tunnel insulation layer TI in contact with the columnar portions CLa, an electric charge accumulation layer EC in contact with the tunnel insulation layer TI, and a block insulation layer SI in contact with the electric charge accumulation layer EC. The electric charge accumulation layer EC has a function for accumulating electric charges. The above-mentioned configuration is restated as follows: the electric charge accumulation layer EC is formed to surround the side surfaces of the columnar portions CLa. The word lines WLa1 to WLa8 are formed to surround the electric charge accumulation layer EC.

Each drain-side selection transistor SDTra has a columnar semiconductor SCa, and a drain-side selection gate line SGDa. Each columnar semiconductor SCa is formed to extend upward from the top surface of one of the corresponding columnar portions CLa, in a vertical direction with respect to the substrate Ba. Each drain-side selection gate line SGDa is formed above the top word line WLa1. Each drain-side selection gate line SGDa has a shape extending in parallel to the row direction. The drain-side selection gate lines SGDa are aligned in the column direction, and repeatedly formed in lines so that source-side selection gate lines SGSa described below are provided therebetween. The drain-side selection gate lines SGDa are formed to surround a plurality of columnar semiconductors SCa aligned in the row direction. As illustrated in FIG. 22, a gate insulation layer DGI is formed between a drain-side selection gate line SGDa and a columnar semiconductor SCa. The above-mentioned configuration is restated as follows: each drain-side selection gate line SGDa is formed to surround a gate insulation layer DGI.

Each source-side selection transistor SSTra has a columnar semiconductor SCb and a source-side selection gate line SGSa. Each columnar semiconductor SCb is formed to extend upward from the top surface of the other of the corresponding columnar portions CLa. Each source-side selection gate line SGSa is formed above the top word line WLa8. Each source-side selection gate line SGSa has a shape extending in parallel to the row direction. The source-side selection gate lines SGSa are aligned in the column direction, and repeatedly formed in lines so that the above-mentioned drain-side selection gate lines SGDa are provided therebetween. Each source-side selection gate line SGSa is formed to surround multiple rows of columnar semiconductors SCb aligned in the row direction. As illustrated in FIG. 22, a gate insulation layer SGI is formed between a source-side selection gate line SGSa and a columnar semiconductor SCb. The above-mentioned configuration is restated as follows: each source-side selection gate line SGSa is formed to surround a gate insulation layer SGI.

A back gate line BGa is formed to extend in a two-dimensional manner in the row and column directions, over a predetermined range, so as to cover the lower portions of a plurality of joining portions JPa. As illustrated in FIG. 22, the above-mentioned ONO layer NL is formed between a back gate line BGa and a joining portion JPa.

Returning to FIG. 21, further description will be given below. The columnar semiconductors SCb are formed adjacently in the column direction. A source line SLa is connected to the upper ends of the pair of columnar semiconductors SCb. The source line SLa is provided in common to the pair of columnar semiconductors SCb.

Bit lines BLa are formed on the upper ends of the columnar semiconductors SCa, which are surrounded by the drain-side selection gate lines SGDa via plug lines PL. The bit lines BLa are formed so as to be positioned above the source lines SLa. The bit lines BLa are repeatedly formed in lines extending in the column direction with a predetermined interval in the row direction.

Referring again to FIG. 19, the peripheral area ARa2 will be described below. The peripheral area ARa2 has word-line driving circuits 110a, 110b, selection-gate-line driving circuits 120a, 120b, an address decoder circuit 130, boost circuits 140A to 140C, a sense amplifier circuit 150, a source-line driving circuit 160, a first row decoder circuit 180a, a second row decoder circuit 180b, and a back-gate-line driving circuit 190.

The word-line driving circuit 110a transfers voltages $V_{CG1a}$ to $V_{CG4a}$ for driving the word lines WLa1 to WLa4. The word-line driving circuit 110b transfers voltages $V_{CG1b}$ to $V_{CG4b}$ for driving the word lines WLa5 to WLa8. The selection-gate-line driving circuit 120a transfers a voltage $V_{SGS1}$ for driving a source-side selection gate line SGSa1. The selection-gate-line driving circuit 120b transfers a voltage $V_{SGS2}$ for driving a source-side selection gate line SGSa2. The address decoder 130 outputs a voltage $V_{BAD}$ for specifying a block address, as in the first embodiment.

The boost circuit 140A transfers a voltage, which is boosted from the reference voltage, to the word-line driving circuits 110a and 110b. The boost circuit 140B transfers a voltage $V_{RDEC}$, which is boosted from the reference voltage, to the first and second row decoder circuits 180a and 180b.

The first and second row decoder circuits 180a and 180b are provided, one for each memory block MBa, respectively. Each first row decoder circuit 180a selectively transfers the voltages $V_{CG1a<i>}$ to $V_{CG4a<i>}$ to the gates of the memory transistors MTra1 to MTra4, based on the voltage $V_{BAD}$. In addition, each first row decoder circuit 180a selectively transfers the voltage $V_{SGS1<i>}$ to the gate of the source-side selection transistor SSTra connected to the source-side selection gate line SGSa1, based on the voltage $V_{BAD}$. Furthermore, each first row decoder circuit 180a selectively transfers the voltage $V_{SGD2<i>}$ to the gate of the drain-side selection transistor SDTra connected to the drain-side selection gate line SGDa2, based on the voltage $V_{BAD}$. Each second row decoder circuit 180b selectively transfers the voltages $V_{CG1b<i>}$ to $V_{CG4b<i>}$ to the gates of the memory transistors MTra5 to MTra8, based on the voltage $V_{BAD}$. In addition, each second row decoder circuit 180b selectively transfers the voltage $V_{SGS2<i>}$ to the gate of the source-side selection transistor SSTra connected to the source-side selection gate line SGSa2, based on the voltage $V_{BAD}$. Furthermore, each second row decoder circuit 180b selectively transfers the voltage $V_{SGD1<i>}$ to the gate of the drain-side selection transistor SDTra connected to the drain-side selection gate line SGDa1, based on the voltage $V_{BAD}$.

Each first row decoder circuit 180a has a voltage converting circuit 181a, first transfer transistors 182a to 185a, second transfer transistors 186a, 187a, and third transfer transistors 188a, 189a. The voltage converting circuit 181a converts the received voltage $V_{RDEC}$ to generate a voltage $V_{SELa<i>}$, which in turn is output to the gates of the first and second transfer transistors 182a to 187a. The first transfer transistors 182a to 185a are connected between the word-line driving circuit 110a and respective word lines WLa1 to WLa4. The first transfer transistors 182a to 185a transfer voltages $V_{CG1a<1>}$ to $V_{CG4a<i>}$ to the word lines WLa1 to WLa4, based on the voltages $V_{CG1a}$ to $V_{CG4a}$ and $V_{SELa<i>}$. The second transfer transistors 186a and 187a transfer voltages $V_{SGS1<i>}$ and $V_{SGD2<i>}$ to the source-side selection gate line SGSa1 and the drain-side selection gate line SGDa2, based on the voltages $V_{SGS1}$, $V_{SGD2}$, $V_{SGOFF}$, and $V_{SELa<i>}$.

Each second row decoder circuit 180b has a voltage converting circuit 181b, first transfer transistors 182b to 185b, second transfer transistors 186b, 187b, third transfer transistors 188b, 189b, and a fourth transfer transistor 181c. The voltage converting circuit 181b converts the received voltage $V_{RDEC}$ to generate a voltage $V_{SELb<i>}$, which in turn is output to the gates of the first, second, and fourth transfer transistors 182b to 187b and 181c. The first transfer transistors 182b to 185b are connected between the word-line driving circuit 110b and respective word lines WLa5 to WLa8. The first transfer transistors 182b to 185b transfer the voltages $V_{CG1b<1>}$ to $V_{CG4b<i>}$ to the word lines WLa5 to WLa8, based on the voltages $V_{CG1b}$ to $V_{CG4b}$, and $V_{SELb<i>}$. The second transfer transistors 186b and 187b are connected between the selection-gate-line driving circuit 120b and the source-side selection gate line SGS2, the drain-side selection gate line SGD1. The second transfer transistors 186b and 187b transfer the voltages $V_{SGS2<i>}$ and $V_{SGD1<i>}$ to the source-side selection gate line SGSa2 and the drain-side selection gate line SGDa1 based on the voltages $V_{SGS2}$, $V_{SGD1}$, $V_{SGOFF}$, and $V_{SELb<i>}$. The fourth transfer transistor 181c is connected between a back-gate-line driving circuit 190 and a back gate line BGa. The fourth transfer transistor 181c transfers the voltage $V_{BG<i>}$ to a back gate line BG, based on the voltage $V_{BG}$.

Figure 23C:
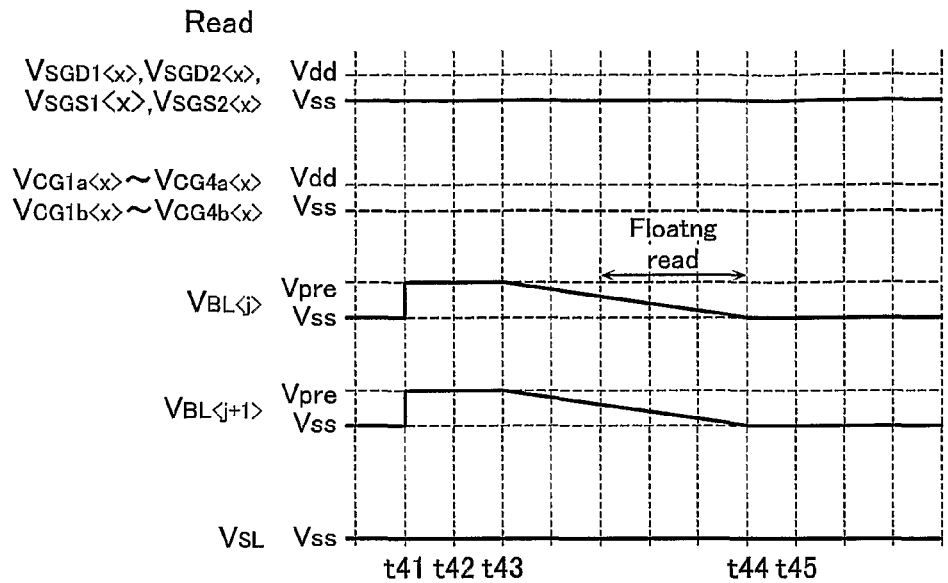
FIG. 23C is a timing chart illustrating a read operation by the non-volatile semiconductor storage device 10B according to the third embodiment.

The non-volatile semiconductor storage device 10B so configured according to the third embodiment operates as illustrated in FIG. 23A to FIG. 23C in read operation. The read operation is performed on those memory strings MSa that are connected to a drain-side selection gate line SGDa2 in the ith memory block MBa<i>. Furthermore, this read operation is performed on the memory transistor MTra2 that is included in the memory strings MSa and that has its gate connected to a word line WLa2.

Figure 24A:
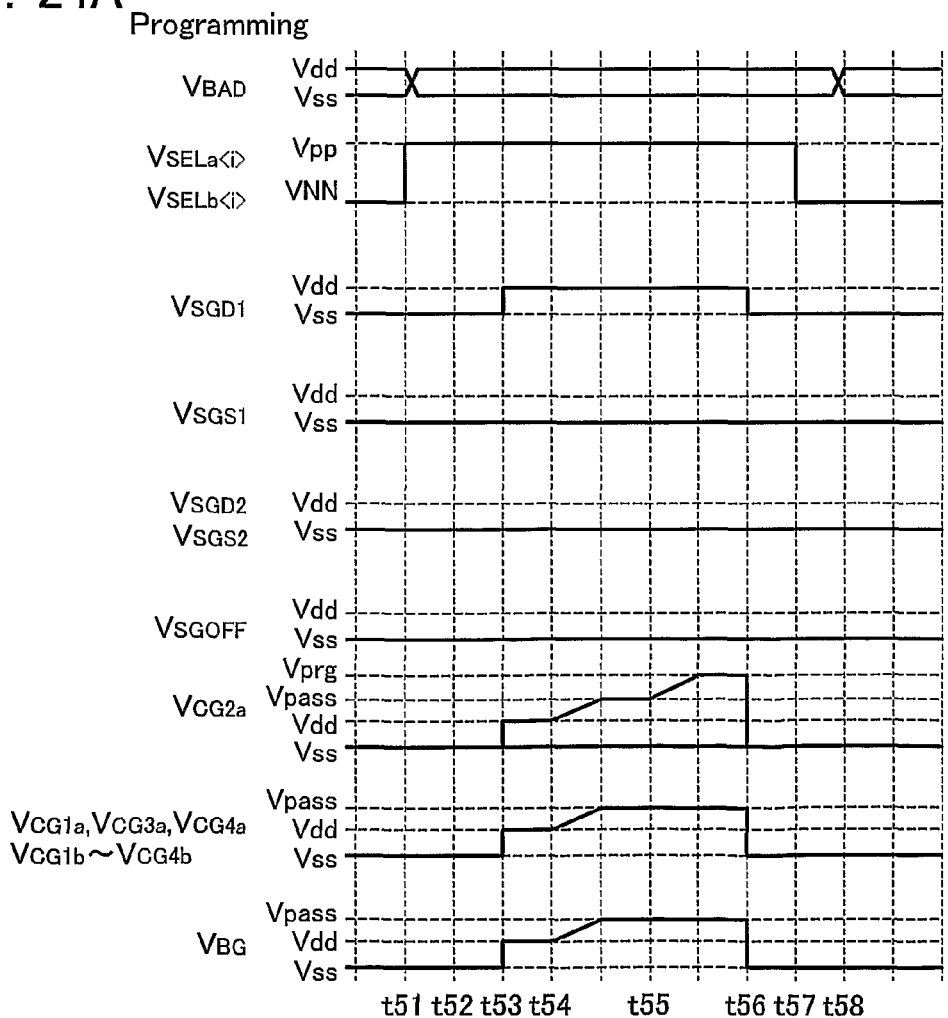
FIG. 24A is a timing chart illustrating a programming operation by the non-volatile semiconductor storage device 10B according to the third embodiment.
Figure 24B:
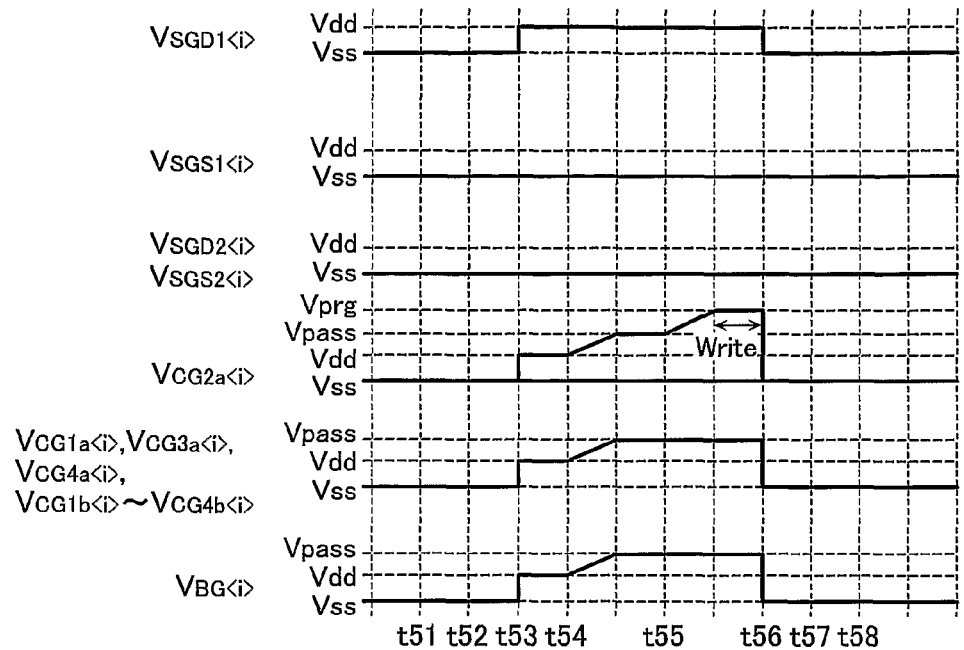
FIG. 24B is a timing chart illustrating a programming operation by the non-volatile semiconductor storage device 10B according to the third embodiment.
Figure 24C:
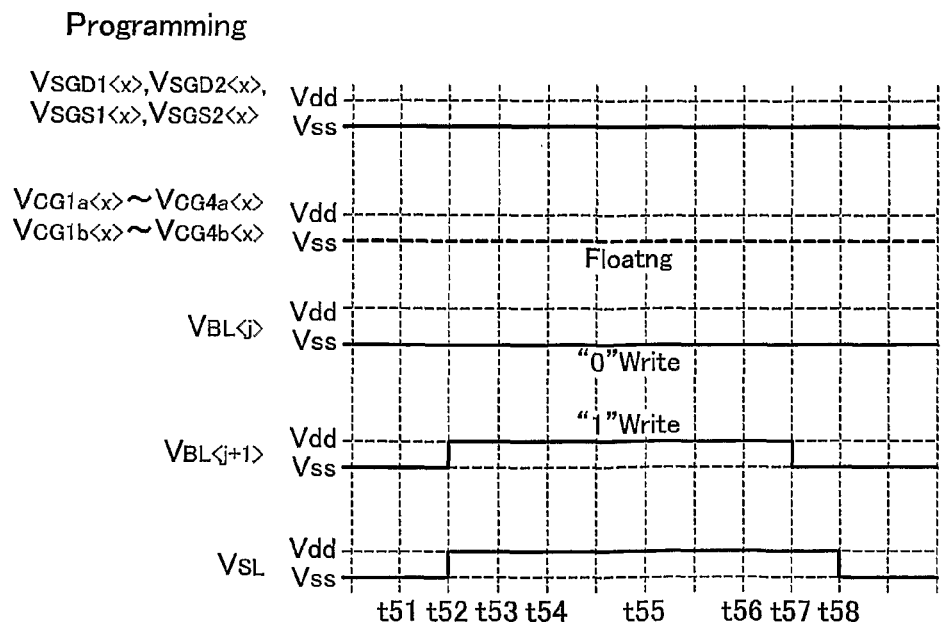
FIG. 24C is a timing chart illustrating a programming operation by the non-volatile semiconductor storage device 10B according to the third embodiment.

In addition, the non-volatile semiconductor storage device 10B according to the third embodiment operates as illustrated in FIGS. 24A to 24C in programming operation (write operation). The programming operation is performed on the memory transistor MTra2 as mentioned earlier with respect to the read operation. Furthermore, this programming operation involves writing "0" to the memory transistor MTra2 connected to a bit line BL<j>, and "1" to the memory transistor MTra2 connected to a bit line BL<j+1>.

Figure 25A:
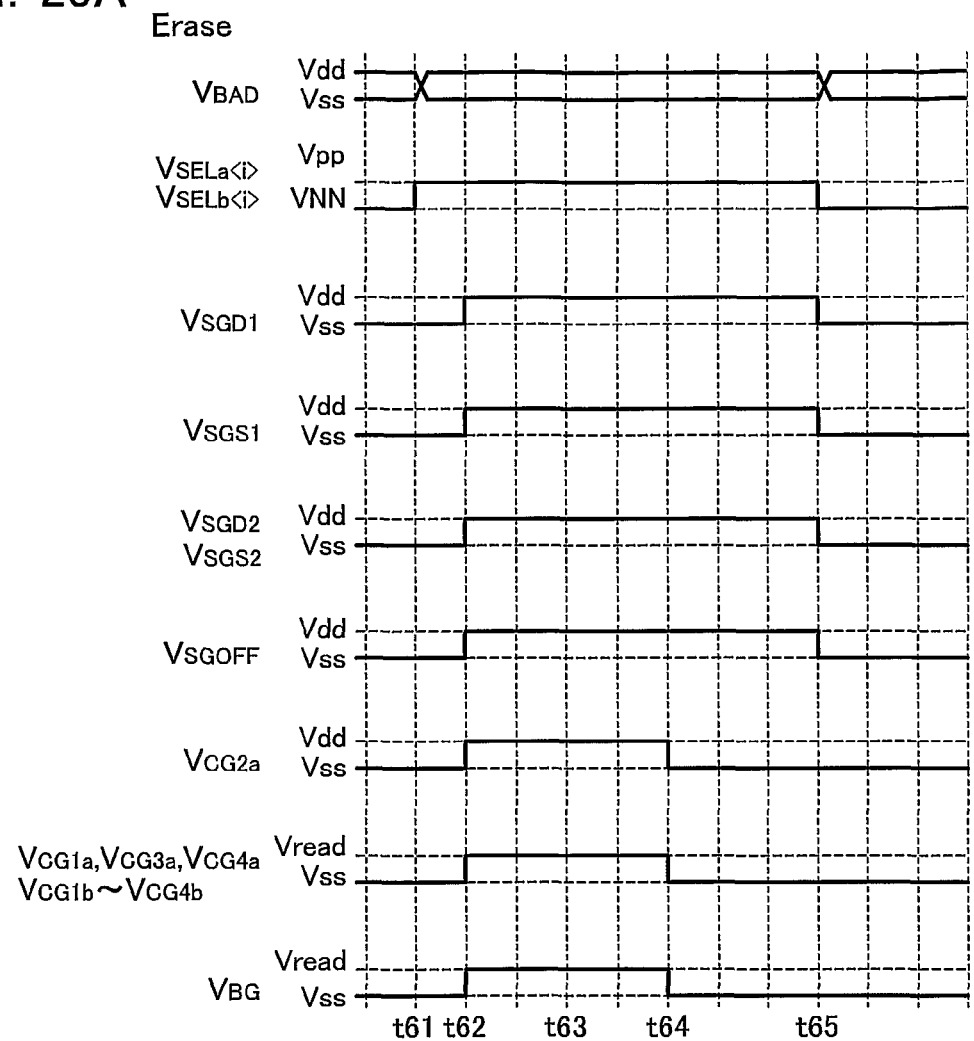
FIG. 25A is a timing chart illustrating an erase operation by the non-volatile semiconductor storage device 10B according to the third embodiment.
Figure 25B:
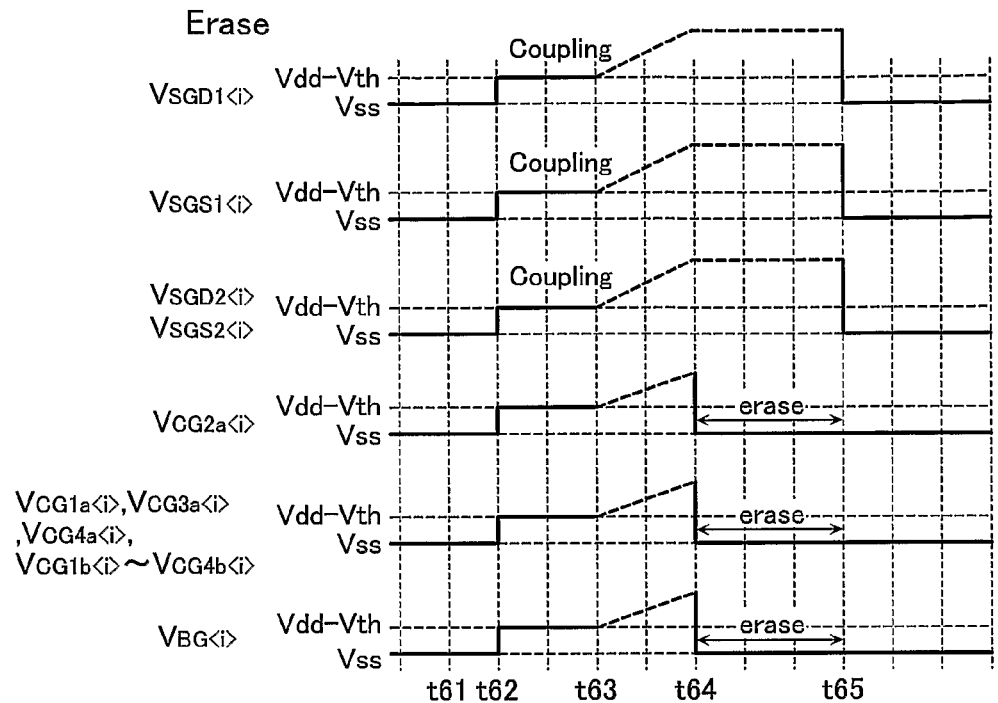
FIG. 25B is a timing chart illustrating an erase operation by the non-volatile semiconductor storage device 10B according to the third embodiment.
Figure 25C:
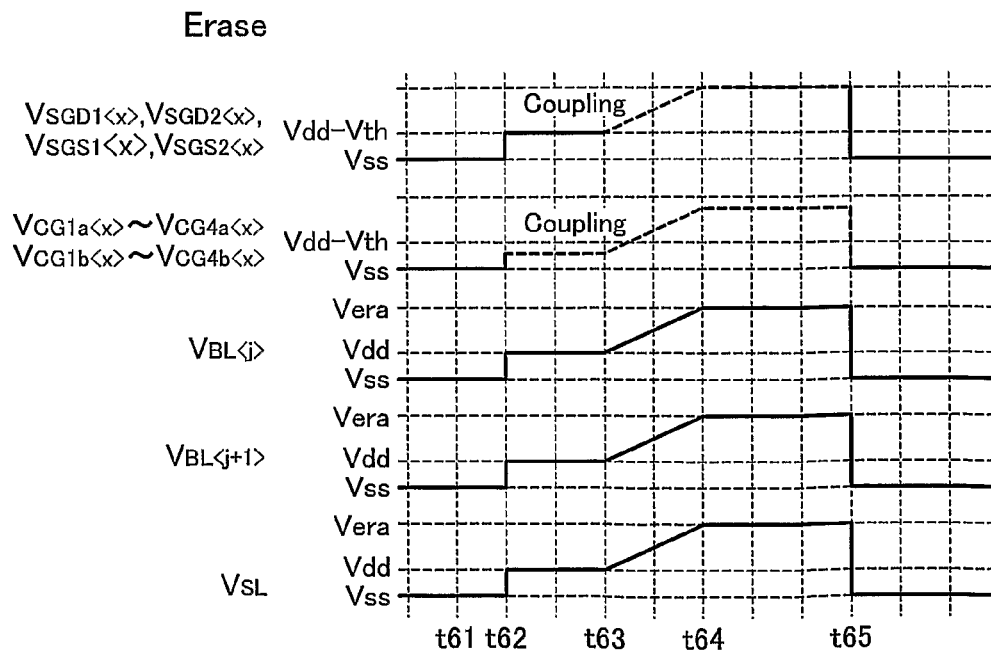
FIG. 25C is a timing chart illustrating an erase operation by the non-volatile semiconductor storage device 10B according to the third embodiment.

In addition, the non-volatile semiconductor storage device 10B according to the third embodiment operates as illustrated in FIG. 25A to FIG. 25C in erase operation. The erase operation is performed on the entire ith memory block MBa<i>.

(Lamination Structure of Non-Volatile Semiconductor Storage Device 10B in Third Embodiment)

Figure 26:
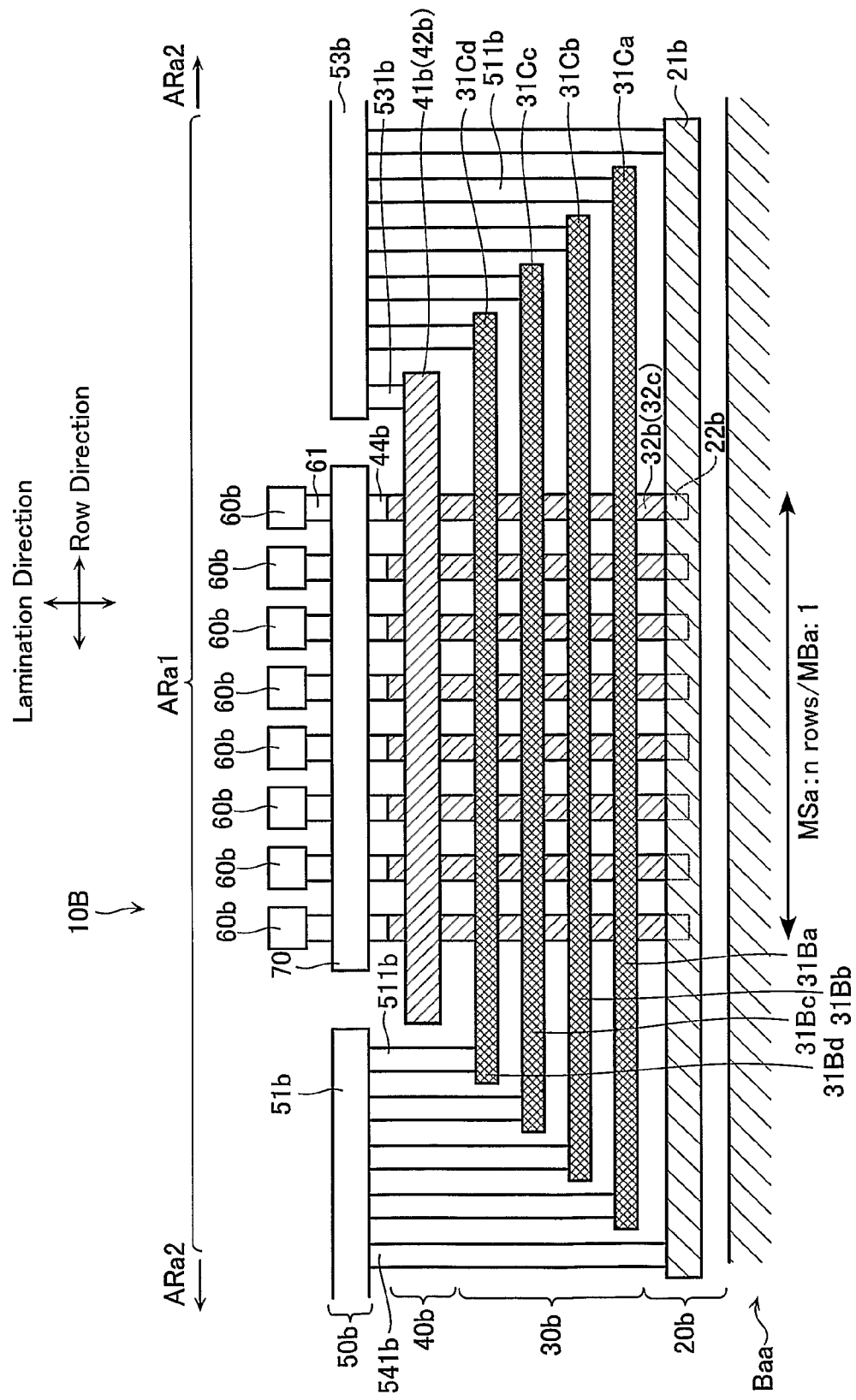
FIG. 26 is a cross-sectional view in the row direction of the non-volatile semiconductor storage device 10B according to the third embodiment.
Figure 27:
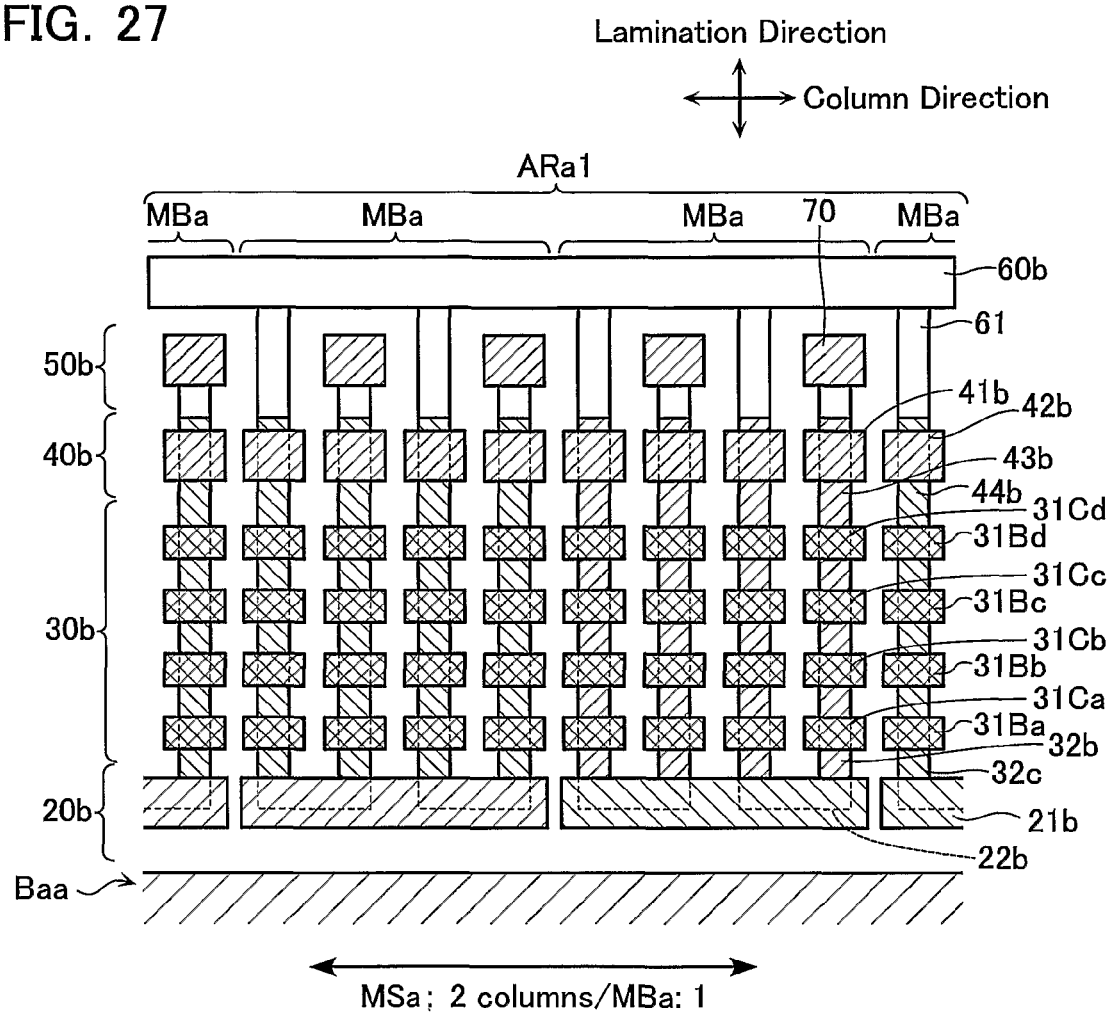
FIG. 27 is a cross-sectional view in the column direction of the non-volatile semiconductor storage device 10B according to the third embodiment.
Figure 28:
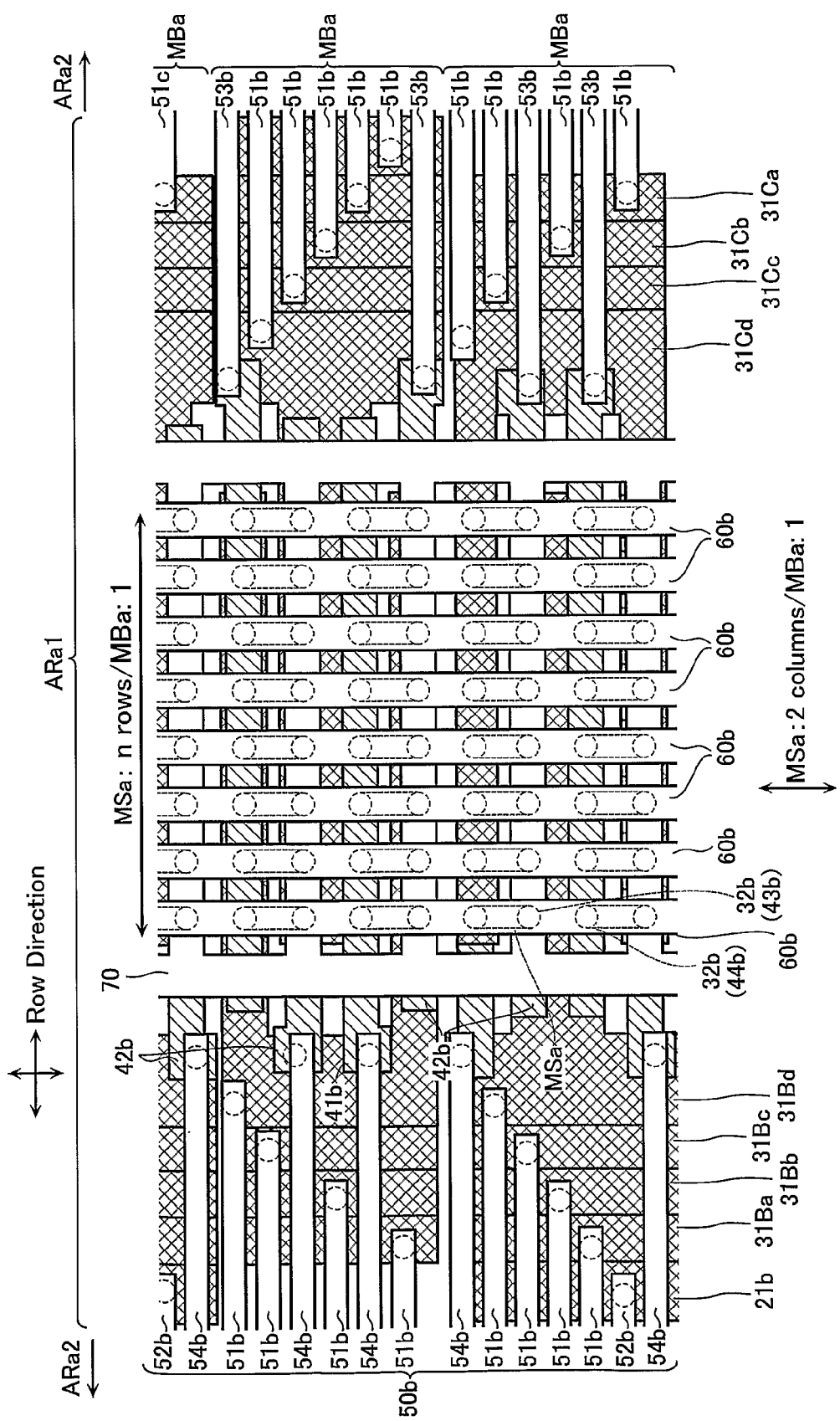
FIG. 28 is a top plan view of the non-volatile semiconductor storage device 10B according to the third embodiment.

Referring now to FIGS. 26 to 28 and 29A to 29E, a lamination structure of the non-volatile semiconductor storage device 10B according to the third embodiment will be described below. FIG. 26 is a cross-sectional view in the row direction of the non-volatile semiconductor storage device 10B according to the third embodiment. FIG. 27 is a cross-sectional view in the column direction of the non-volatile semiconductor storage device 10B. FIG. 28 is a top plan view thereof. FIGS. 29A to 29E are top plan views illustrating respective layers of FIG. 28. Note that FIGS. 27 to 29E omit interlayer insulation layers.

In the non-volatile semiconductor storage device 10B according to the third embodiment, a memory block MBa (a memory transistor area ARa1) has a back gate transistor layer 20b, a memory transistor layer 30b, and a selection transistor layer 40b that are sequentially provided on the semiconductor substrate Baa, as illustrated in FIGS. 26 to 28. The back gate transistor layer 20b functions as a back gate transistor BGTra. The memory transistor layer 30b functions as memory transistors MTra1 to MTra8. The selection transistor layer 40b functions as source-side selection transistors SSTra and drain-side selection transistors SDTra.

Figure 29A:
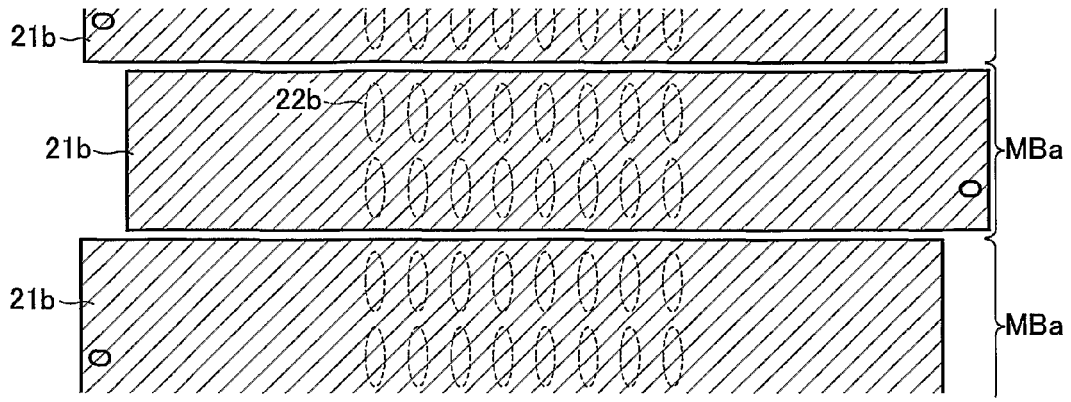
FIG. 29A is a top plan view illustrating some layers of FIG. 28.

As illustrated in FIGS. 26 and 27, the back gate transistor layer 20b has back gate conductive layers 21b and bottom semiconductor layers 22b. Each of the back gate conductive layers 21b assumes a plate-like shape extending in parallel to the semiconductor substrate Baa over a predetermined area. As illustrated in FIG. 29A, the back gate conductive layers 21b are separated for each memory block MBa. Each back gate conductive layer 21b is formed to surround bottom semiconductor layers 22b. The bottom semiconductor layers 22b are formed to a predetermined depth from the top surfaces of the respective back gate conductive layers 21b. As illustrated in FIG. 29A, the bottom semiconductor layers 22b are formed to extend in the column direction, as viewed from above. The bottom semiconductor layers 22b are formed in a matrix form, as viewed from above. The bottom semiconductor layers 22b are arranged with "n rows" in the row direction and "2 columns" in the column direction for each memory block MBa. The back gate conductive layers 21b and the bottom semiconductor layers 22b are composed of polysilicon (p-Si).

The back gate transistor layer 20b also has a tunnel insulation layer, an electric charge accumulation layer, and a block insulation layer. Each tunnel insulation layer, electric charge accumulation layer, and block insulation layer are formed between the back gate conductive layers 21b and the bottom semiconductor layers 22b. Each tunnel insulation layer, electric charge accumulation layer, and block insulation layer are formed in the stated order from the bottom semiconductor layers 22b side to the back gate conductive layers 21b side. The tunnel insulation layers and the block insulation layers are composed of silicon oxide ($SiO_2$). The electric charge accumulation layers are composed of silicon nitride (SiN).

In the back gate transistor layer 20b configured as mentioned above, the back gate conductive layers 21b function as the control gates of back gate transistors BGTra. The back gate conductive layers 21b also function as parts of the back gate lines BGa. The bottom semiconductor layers 22b are included in the U-shaped bottom portions of the memory strings MSa.

Figure 29B:
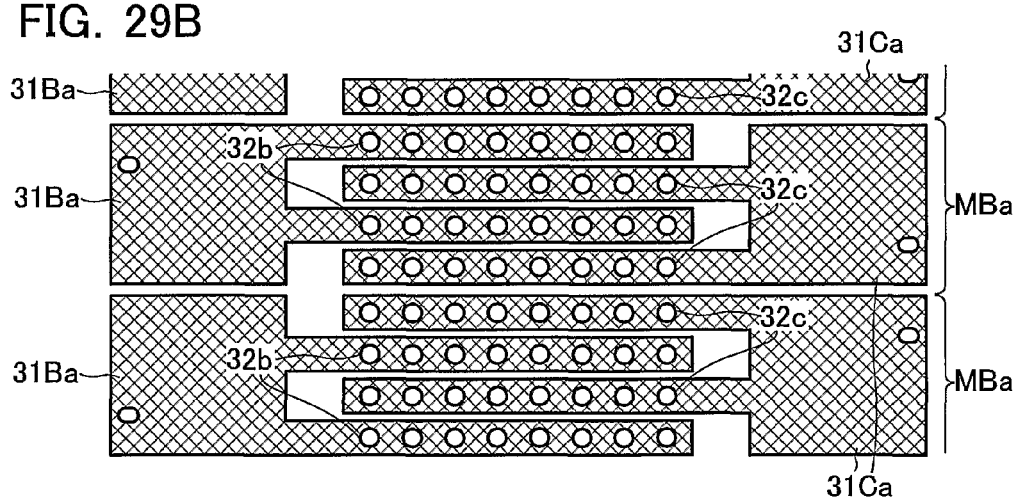
FIG. 29B is a top plan view illustrating some layers of FIG. 28.

As illustrated in FIGS. 26 and 27, the memory transistor layer 30b has first word-line conductive layers 31B (31Ba to 31Bd), second word-line conductive layers 31C (31Ca to 31Cd), first memory columnar semiconductor layers 32b, and second memory columnar semiconductor layers 32c. As illustrated in FIGS. 28 and 29B, the first and second word-line conductive layers 31Ba to 31Bd and 31Ca to 31Cd are formed in comb-teeth shape, with two protruding portions aligned in the column direction and extending in the row direction for each memory block MBa. The protruding portions of the first word-line conductive layers 31Ba to 31Bd are formed to be positioned between the protruding portions of the second word-line conductive layers 31Ca to 31Cd with a predetermined interval. This means that the protruding portions of the first and second word-line conductive layers 31Ba to 31Bd and 31Ca to 31Cd are provided, "4" columns aligned in the column direction for each memory block MBa. The first and second memory columnar semiconductor layers 32b and 32c are formed in columnar shape so as to extend in the lamination direction and penetrate the first and second word-line conductive layers 31Ba to 31Bd and 31Ca to 31Cd. As illustrated in FIGS. 28 and 29B, the first and second memory columnar semiconductor layers 32b and 32c are formed to be aligned in the column direction (in a matrix form as viewed from above) at the protruding portions of the first and second word-line conductive layers 31Ba to 31Bd and 31Ca to 31Cd. A pair of first and second memory columnar semiconductor layers 32b and 32c that are aligned in the column direction are formed to be connected to the both ends in the column direction of the bottom semiconductor layers 22b, respectively. In other words, the bottom semiconductor layers 22b are formed to connect the bottom portions of the first and second memory columnar semiconductor layers 32b and 32c. The first and second word-line conductive layers 31Ba to 31Bd and 31Ca to 31Cd, as well as the first and second memory columnar semiconductor layers 32b and 32c are composed of polysilicon (p-Si).

The memory transistor layer 30b also has a tunnel insulation layers, an electric charge accumulation layer, and a block insulation layer. Each tunnel insulation layer, electric charge accumulation layer, and block insulation layer are formed between the first word-line conductive layers 31Ba to 31Bd and the first memory columnar semiconductor layers 32b, as well as between the second word-line conductive layers 31Ca to 31Cd and the second memory columnar semiconductor layers 32c. Each tunnel insulation layer, electric charge accumulation layer, and block insulation layer are formed in the stated order from the first memory columnar semiconductor layers 32b (the second memory columnar semiconductor layers 32c) side to the first word-line conductive layers 31Ba to 31Bd (the second word-line conductive layers 31Ca to 31Cd) side. The tunnel insulation layers and the block insulation layers are composed of silicon oxide ($SiO_2$). The electric charge accumulation layers are composed of silicon nitride (SiN).

In the memory transistor layer 30b configured as mentioned above, the first and second word-line conductive layers 31Ba to 31Bd and 31Ca to 31Cd function as the control gates of the memory transistors MTra1 to MTra8. In addition, the first and second word-line conductive layers 31Ba to 31Bd and 31Ca to 31Cd function as parts of the word lines WLa1 to WLa8. The first and second memory columnar semiconductor layers 32b and 32c are included in a pair of U-shaped side portions of a memory string MSa.

In addition, the configuration of the memory transistor layer 30b is restated as follows: the first word-line conductive layers 31Ba to 31Bd are formed to surround first memory-side columnar semiconductor layers 32b that are arranged with n rows in the row direction and two columns in the column direction. The second word-line conductive layers 31Ca to 31Cd are formed to surround second memory-side columnar semiconductor layers 32c that are arranged with n rows in the row direction and two columns in the column direction.

Figure 29C:
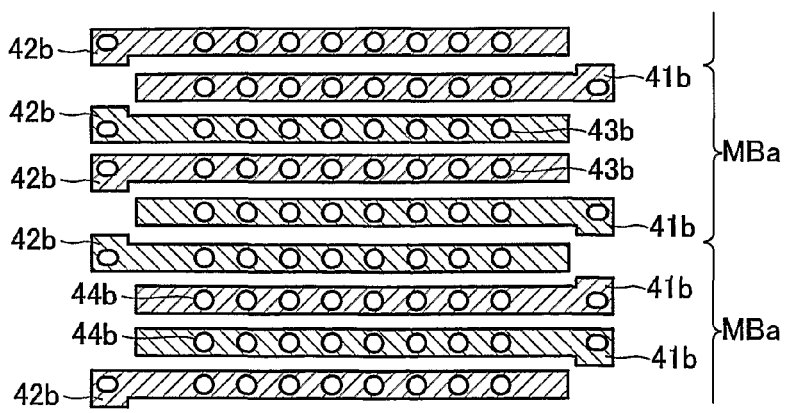
FIG. 29C is a top plan view illustrating some layers of FIG. 28.

As illustrated in FIGS. 26 and 27, the selection transistor layer 40b has source-side conductive layers 41b, drain-side conductive layers 42b, source-side columnar semiconductor layers 43b, and drain-side columnar semiconductor layers 44b. As illustrated in FIGS. 28 and 29C, the source-side conductive layers 41b are formed in a stripe pattern aligned in the column direction and extending in the row direction. Each memory block MBa has two source-side conductive layers 41b provided therein. The source-side conductive layers 41b are separated for each memory block MBa. As illustrated in FIG. 29C, the drain-side conductive layers 42b are formed in a stripe pattern extending in the row direction, at a predetermined cycle in the column direction. The drain-side conductive layers 42b are provided between the source-side conductive layers 41b. Each memory block MBa has two drain-side conductive layers 42b provided therein. The drain-side conductive layers 42b are separated for each memory block MBa. The source-side columnar semiconductor layers 43b are formed so as to extend in the lamination direction, penetrate the source-side conductive layers 41b, and come in contact with the top surfaces of the first memory columnar semiconductor layers 32b. Each memory block MBa has n rows and 2 columns of source-side columnar semiconductor layers 43b formed therein. The drain-side columnar semiconductor layers 44b are formed so as to extend in the lamination direction, penetrate the drain-side conductive layers 42b, and come in contact with the top surfaces of the second memory columnar semiconductor layers 32c. Each memory block MBa has n rows and 2 columns of drain-side columnar semiconductor layers 44b formed therein.

In addition, the selection transistor layer 40b has source-side gate insulation layers and drain-side gate insulation layers. Each source-side gate insulation layer is formed between a source-side conductive layer 41b and a source-side columnar semiconductor layer 43b. Each drain-side gate insulation layer is formed between a drain-side conductive layer 42b and a drain-side columnar semiconductor layer 44b. The source-side gate insulation layers and the drain-side gate insulation layers are composed of silicon oxide ($SiO_2$).

In the selection transistor layer 40b configured as mentioned above, the source-side conductive layers 41b function as the control gates of source-side selection transistors SSTra. The source-side conductive layers 41b also function as parts of the source-side selection gate lines SGSa. The drain-side conductive layers 42b function as the control gates of drain-side selection transistors SDTra. The drain-side conductive layers 42b also function as parts of the drain-side selection gate lines SGDa.

In addition, the configuration of the selection transistor layer 40b is restated as follows: each source-side conductive layer 41b is formed to surround source-side columnar semiconductor layers 43b that are arranged with n rows in the row direction and 1 column in the column direction. Each drain-side conductive layer 42b is formed to surround drain-side columnar semiconductor layers 44b that are arranged with n rows in the row direction and 1 column in the column direction. The source-side columnar semiconductor layers 43b and the drain-side columnar semiconductor layers 44b are formed to extend upward from the first and second memory columnar semiconductor layers 32b and 32c.

According to the configuration of the memory transistor area ARa1 as mentioned above, two columns of memory strings MSa are arranged in the column direction for each memory block MBa, as illustrated in FIG. 28.

The non-volatile semiconductor storage device 10B according to the third embodiment also comprises memory transistor areas ARa1, as well as a wiring layer 50b, bit-line layers 60b, and source-line layers 70 that extend over a peripheral area ARa2. The wiring layer 50b and the source-line layers 70 are formed in the same layer, above which the bit-line layers 60b are formed. Note that the source-line layers 70 function as source lines SLa.

The wiring layer 50b comprises word connection layers 51b, source-side connection layers 52b, drain-side connection layers 53b, and back gate connection layers 54b.

Figure 29D:
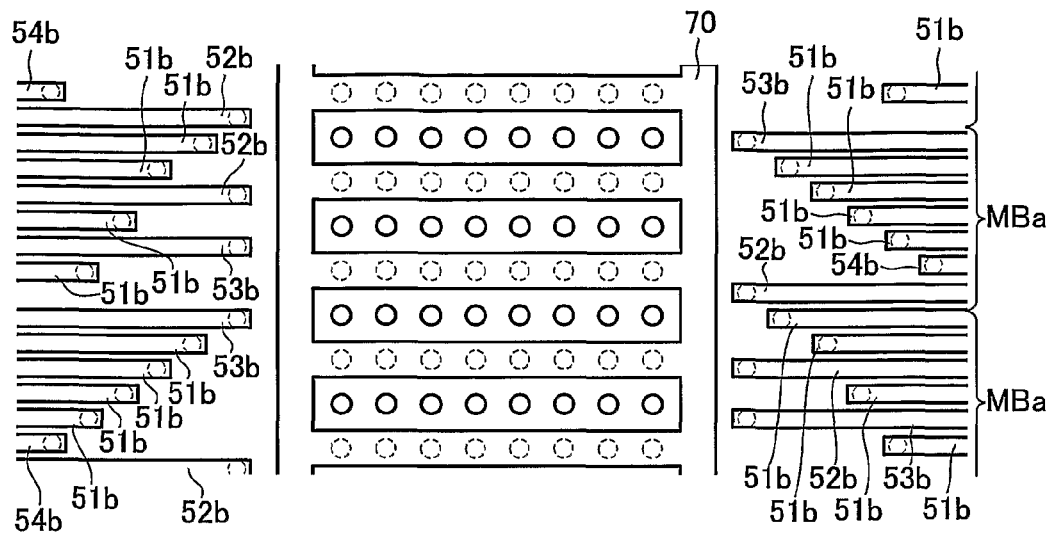
FIG. 29D is a top plan view illustrating some layers of FIG. 28.

As illustrated in FIGS. 28 and 29D, the word connection layers 51b are formed in rectangular shapes extending in the row direction. The word connection layers 51b are arranged with "4 columns" aligned in the column direction for each memory block MBa. The word connection layers 51b are electrically connected via respective contact plug layers 511b to the first word-line conductive layers 31Ba to 31Bd, at one end in the row direction of the first word-line conductive layers 31Ba to 31Bd. In addition, the word connection layers 51b are electrically connected via respective contact plug layers 511b to the second word-line conductive layers 31Ca to 31Cd, at the other end in the row direction of the second word-line conductive layers 31Ca to 31Cd.

As illustrated in FIGS. 28 and 29D, the source-side connection layers 52b are formed in rectangular shapes extending in the row direction. Each memory block MBa has two source-side connection layers 52b provided therein. One of two source-side connection layers 52b is electrically connected via a contact plug layer 521b to a source-side conductive layer 41b, at one end in the row direction of the first word-line conductive layers 31Ba to 31Bd. In addition, the other of two source-side connection layers 52b is electrically connected via a contact plug layer 521b to a source-side conductive layer 41b, at the other end in the row direction of the second word-line conductive layers 31Ca to 31Cd.

As illustrated in FIGS. 28 and 29D, the drain-side connection layers 53b are formed in rectangular shapes extending in the row direction. Each memory block MBa has two drain-side connection layers 53b provided therein. One of two drain-side connection layers 53b is electrically connected via a contact plug layer 531b to a drain-side conductive layer 42b, at one end in the row direction of the first word-line conductive layers 31Ba to 31Bd. In addition, the other of two drain-side connection layers 53b is electrically connected via a contact plug layer 531b to a drain-side conductive layer 42b, at the other end in the row direction of the second word-line conductive layers 31Ca to 31Cd.

As illustrated in FIGS. 28 and 29D, the back gate connection layers 54b are formed in rectangular shapes extending in the row direction. Each memory block MBa has one back gate connection layer 54b provided therein. Each back gate connection layer 54b is electrically connected via a contact plug layer 541b to a back gate conductive layers 21b, at one (or the other) end in the row direction of the first and second word-line conductive layers 31Ba to 31Bd and 31Ca to 31Cd.

Figure 29E:
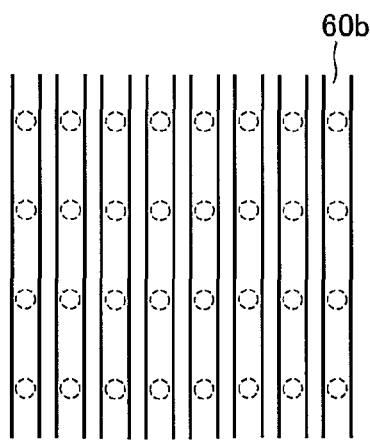
FIG. 29E is a top plan view illustrating some layers of FIG. 28.

As illustrated in FIGS. 28 and 29E, the bit-line layers 60b are formed in rectangular shapes extending in the column direction. The bit-line layers 60b are formed with n rows aligned in the row direction for each memory block MBa. The bit-line layers 60b are connected via respective contact plug layers 61 to the top surfaces of the respective drain-side columnar semiconductor layers 44b. Note that the bit-line layers 60b function as bit lines BLa.

As illustrated in FIGS. 28 and 29D, the source-line layers 70 are formed in a ladder-like form extending in the column direction. Each memory block MBa has two portions of a source-line layer 70 extending in the row direction formed therein. The source-line layers 70 are connected, at their portions extending in the row direction, to the top surfaces of the source-side columnar semiconductor layers 43b.

That is, the non-volatile semiconductor storage device 10B according to the third embodiment is formed with (Configuration 1b) and (Configuration 2b) as described below.

(Configuration 1b) The Word Connection Layers 51b

The word connection layers 51b extend to the vicinity of both ends of the first and second word-line conductive layers 31B and 31C in the row direction from both sides of the memory block MBa (Configuration 2b) The Memory Strings MSa The number of memory strings MSa arranged in the column direction for each memory block MBa. i.e., "m" is 2.

The number of laminated first and second word-line conductive layers 31B and 31C. i.e., "n" is 4.

In view of (Configuration 1b) and (Configuration 2b) above, the non-volatile semiconductor storage device 10B according to the third embodiment is configured to satisfy the relation represented by (Formula 1) above.

(Advantages of Non-Volatile Semiconductor Storage Device 10B in Third Embodiment)

Advantages of the non-volatile semiconductor storage device 10B according to the third embodiment will now be described below. The non-volatile semiconductor storage device 10B according to the third embodiment is configured to satisfy the relation represented by (Formula 1) above. Accordingly, the non-volatile semiconductor storage device 10B according to the third embodiment may mitigate an increase in the area occupied by the word connection layers 51b and reduce the occupation area of the entire non-volatile semiconductor storage device 10B.

[Fourth Embodiment]

(General Configuration of Non-Volatile Semiconductor Storage Device 10C in Fourth Embodiment)

Figure 30:
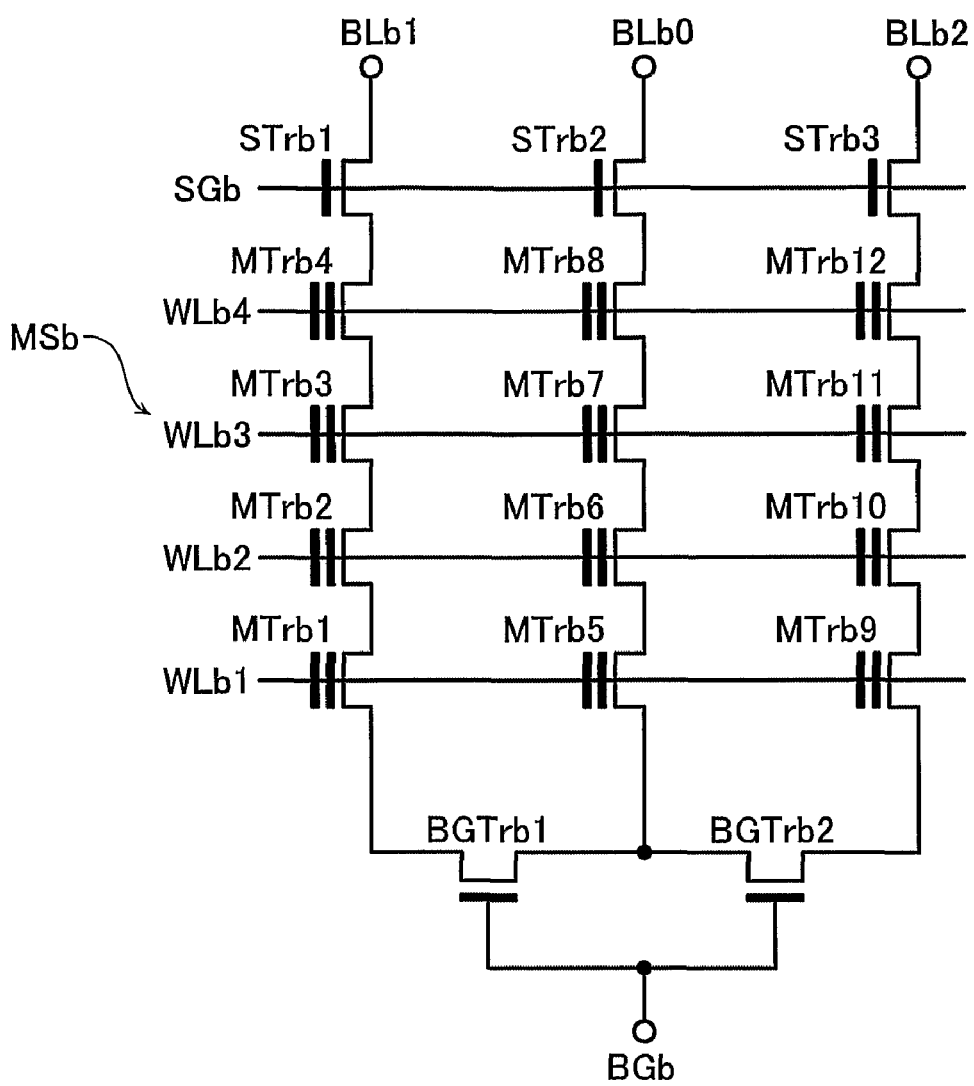
FIG. 30 is a circuit diagram illustrating a memory string MSb in a non-volatile semiconductor storage device 10C according to a fourth embodiment.

Referring now to FIG. 30, a general configuration of a non-volatile semiconductor storage device 10C according to a fourth embodiment will be described below. FIG. 30 is a circuit diagram illustrating a memory string MSb in the non-volatile semiconductor storage device 10C according to the fourth embodiment. Note that the same reference numerals represent the same components as the first to third embodiments, and description thereof will be omitted in the fourth embodiment.

As illustrated in FIG. 30, unlike the first to third embodiments, a memory string MSb according to the fourth embodiment is formed in "W-shape", as viewed from a direction parallel to the semiconductor substrate Baa. The memory string MSb comprises three sets of memory transistors MTrb1 to MTrb4, MTrb5 to MTrb8, and MTrb9 to MTrb12 connected in series, as well as two back gate transistors BGTrb1 and BGTrb2. One end of the memory transistor MTrb1 is connected via the back gate transistor BGTrb1 to one end of the memory transistor MTrb5. One end of the memory transistor MTrb5 is connected via the back gate transistor BGTrb2 to one end of the memory transistor MTrb9. One ends of the memory transistors MTrb4, MTrb8, and MTrb12 are connected to one ends of selection transistors STrb1, STrb2, and STrb3.

Figure 31:
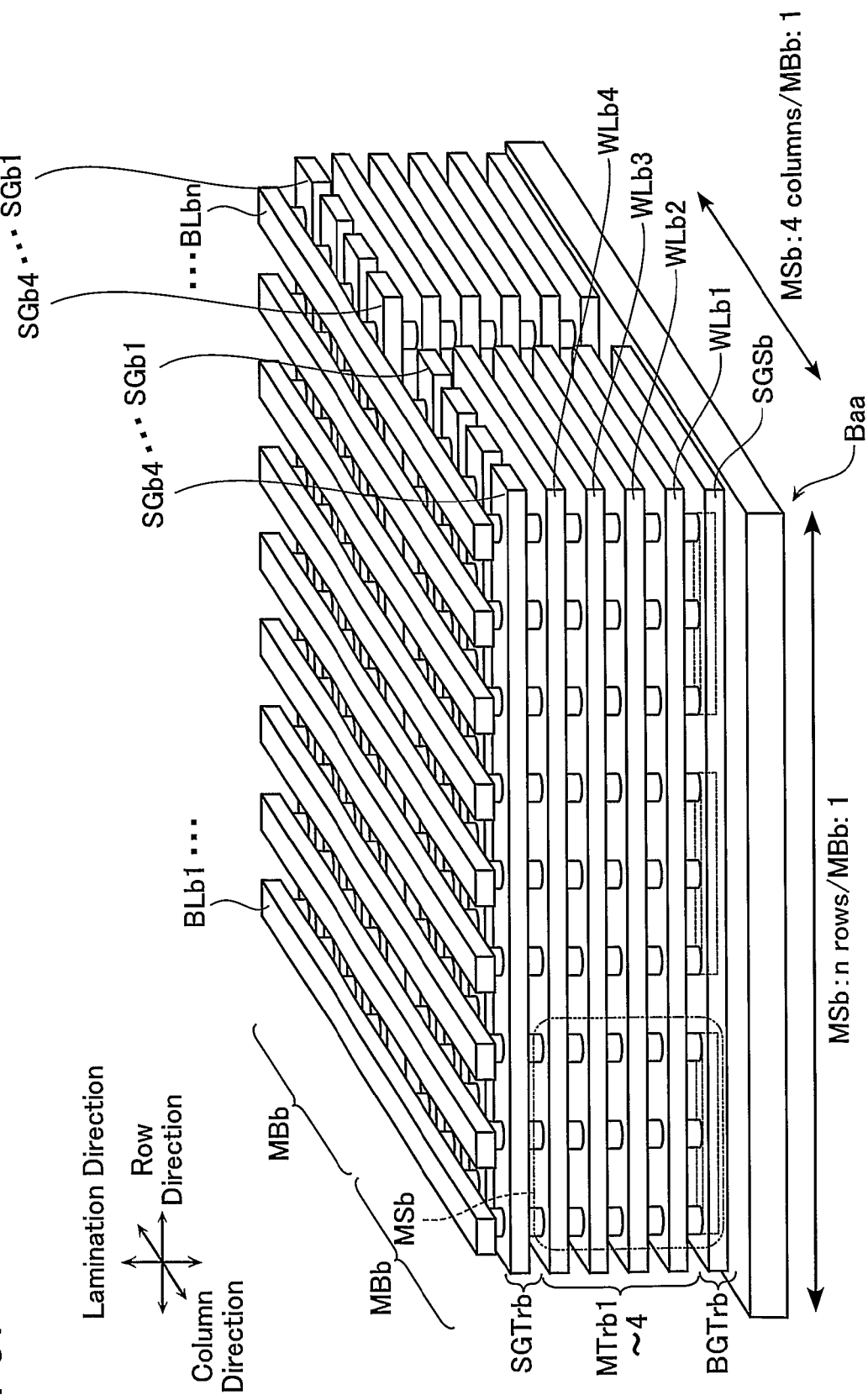
FIG. 31 a schematic diagram illustrating a lamination structure of a memory transistor area according to the fourth embodiment.
Figure 32:
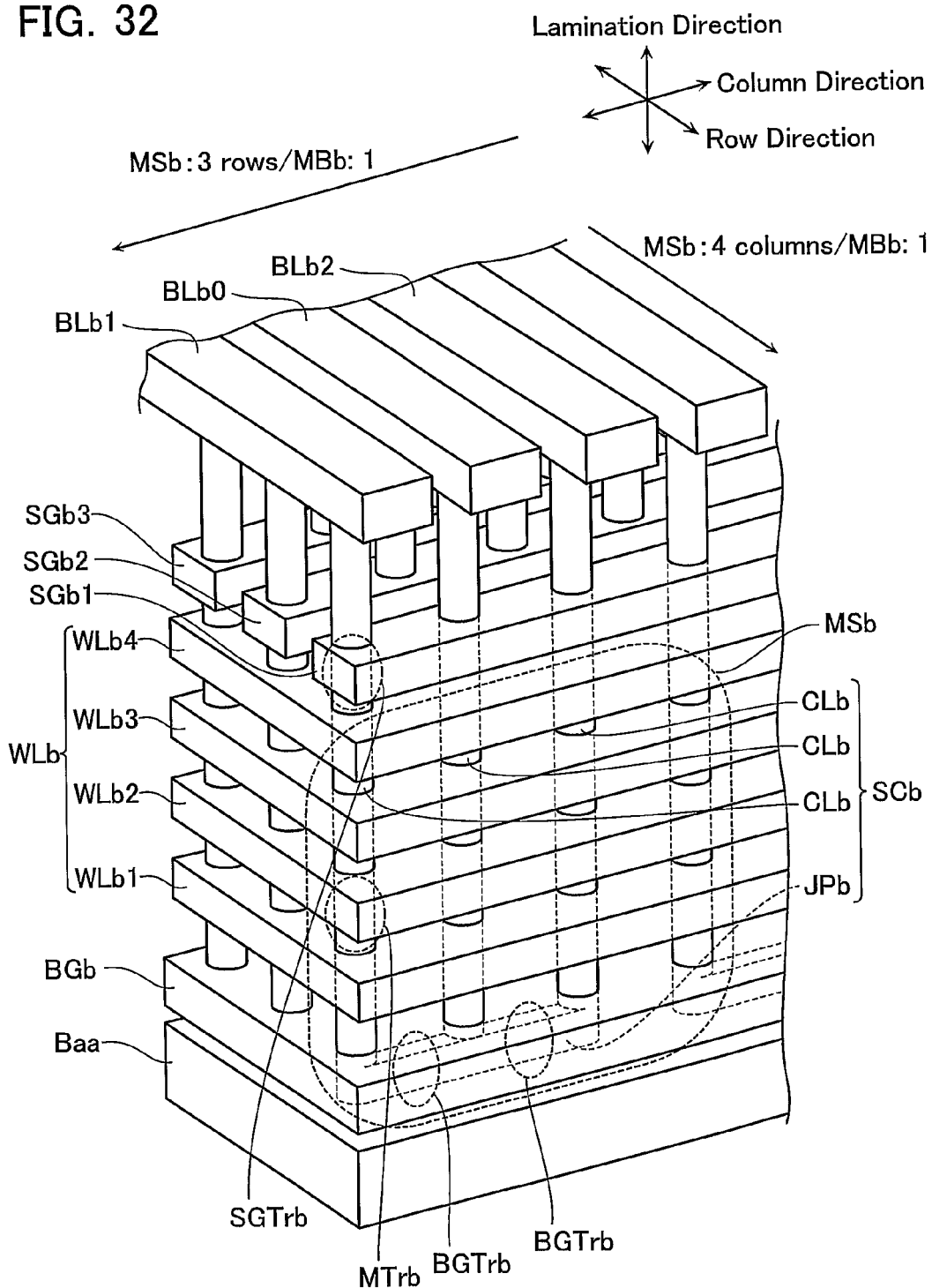
FIG. 32 is an enlarged view of FIG. 31.

Referring now to FIGS. 31 and 32, a general configuration of the non-volatile semiconductor storage device 10C according to the fourth embodiment will be described below. FIG. 31 schematically illustrates a lamination structure of the non-volatile semiconductor storage device 10C according to the fourth embodiment, and FIG. 32 is an enlarged view thereof. As illustrated in FIG. 31, the non-volatile semiconductor storage device 10C according to the fourth embodiment has memory strings MSb arranged in a matrix form (with n rows in the row direction and 4 columns in the column direction) in one memory block MBb.

Each memory block MBb has a W-shaped semiconductor layer SCb provided for each memory string MSb, word lines WLb1 to WLb4, selection gate lines SGb, and a back gate line BGb.

As illustrated in FIG. 32, each W-shaped semiconductor layer SCb is formed in W-shape (sideways E-shape or comb-like form) as viewed from the row direction. Each W-shaped semiconductor layer SCb has a plurality of (three, in this case) columnar portions CLb extending in substantially the vertical direction with respect to the semiconductor substrate Baa, and a joining portion JPb formed to join the lower ends of the plurality of columnar portions CLb. The joining portion JPb is formed with the column direction illustrated in FIG. 32 taken as the longitudinal direction. The three columnar portions CLb included in one memory string MSb are also formed in line along the column direction.

Although not illustrated in FIG. 32, an electric charge accumulation layer, which is a part of a memory cell, is formed around the plurality of columnar portions CLb via a tunnel insulation film, and a block insulation film is further formed around the electric charge accumulation layer. In addition, word lines WLb1 to WLb4 are formed around the plurality of columnar portions CLb via the tunnel insulation film, the electric charge accumulation layer, and the block insulation film.

The word lines WLb1 to WLb4 are formed by laminating multiple layers of conductive films on the substrate Baa via an interlayer insulation film, not illustrated in FIG. 32. The word lines WLb1 to WLb4 are formed as plate-like electrodes that are commonly connected to 3×4 memory strings MS arranged in a two-dimensional manner and in a grid pattern on the semiconductor substrate Baa. Because of the plate-like shapes commonly connected to the memory strings MSb arranged in a matrix form, instead of being formed in an elongated stripe pattern (in strips) per memory strings MSb arranged in a line, the word lines WLb1 to WLb4 may provide a lower wiring resistance as compared with being formed in an elongated stripe pattern.

The selection gate lines SGb (SGb1 to SGb4) are commonly connected to a plurality of columnar portions CLb aligned in the column direction so that they provide a stripe pattern on the tip sides of the columnar portions CLb, with the column direction taken as the longitudinal direction. That is, a plurality of memory strings MSb aligned in the row direction are each connected to different selection gate lines SGb1 to SGb4.

The back-gate line BGb comes in contact with the joining portion JPb via a gate insulation film, not illustrated. Each joining portion JPb has two back gate transistors BGTrb formed therein, with their gate electrodes included in the back-gate line BGb.

In addition, bit lines BLb are formed along the columnar portions CLb aligned in the row direction, with the row direction taken as the longitudinal direction. Three columnar portions CLb included in one memory string MSb are each connected to different bit lines BLb0 to BLb2.

In addition, each joining portion JPb has two back gate transistors BGTrb formed therein at respective positions between three columnar portions CLb, with their gates included in the back gate layer BGb.

In addition, selection transistors SGTrb are formed on the upper ends of the respective columnar portions CLb. The selection transistors SGTrb are commonly connected to one selection gate line SGb and become conductive at the same time. Such memory strings MSb are arranged in a two-dimensional matrix form on the substrate Baa, with the word lines WLb1 to WLb4 being connected in common.

(Lamination Structure of Non-Volatile Semiconductor Storage Device 100 in Fourth Embodiment)

Figure 33:
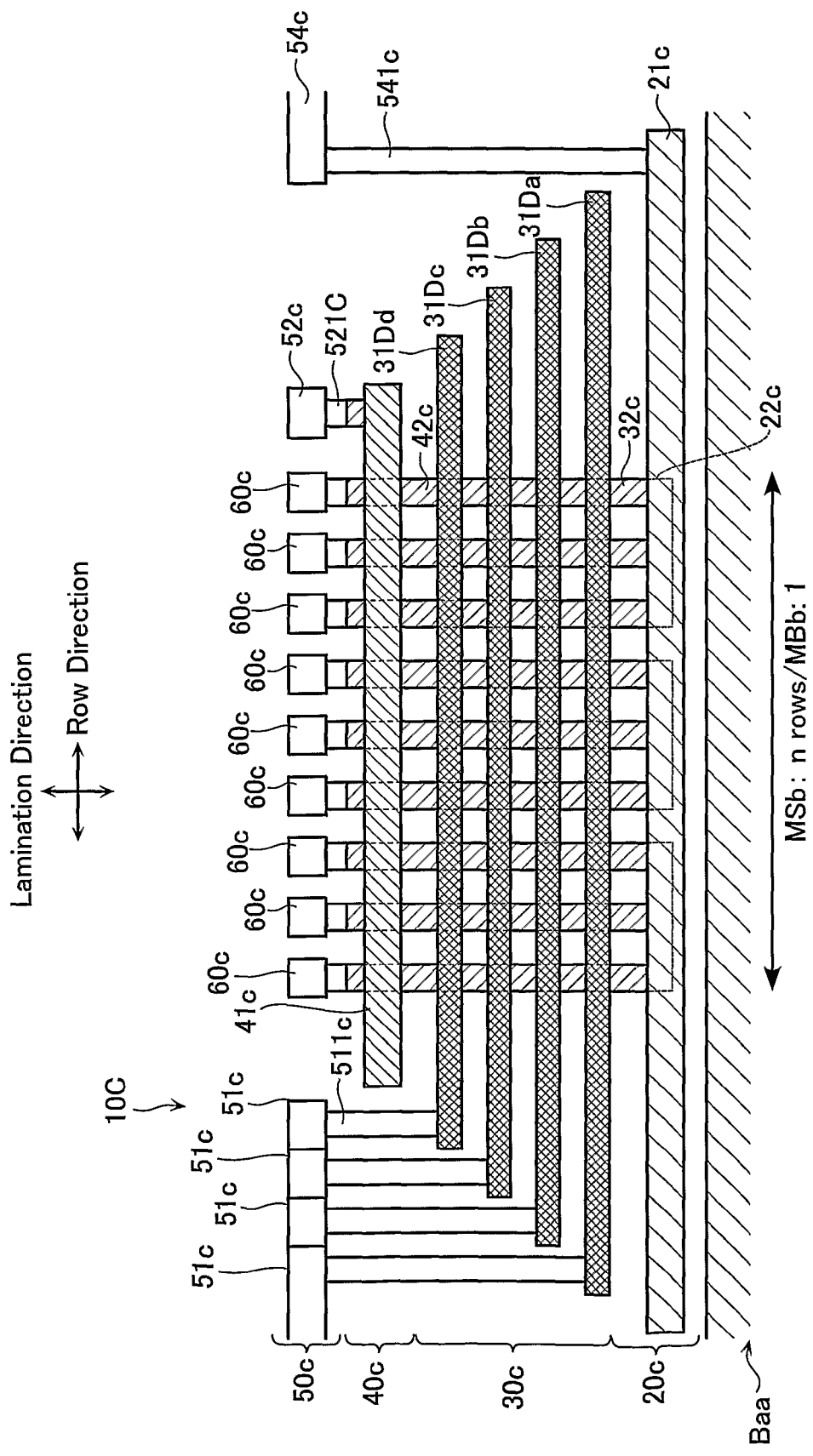
FIG. 33 is a cross-sectional view in the row direction of the non-volatile semiconductor storage device 10C according to the fourth embodiment.
Figure 34:
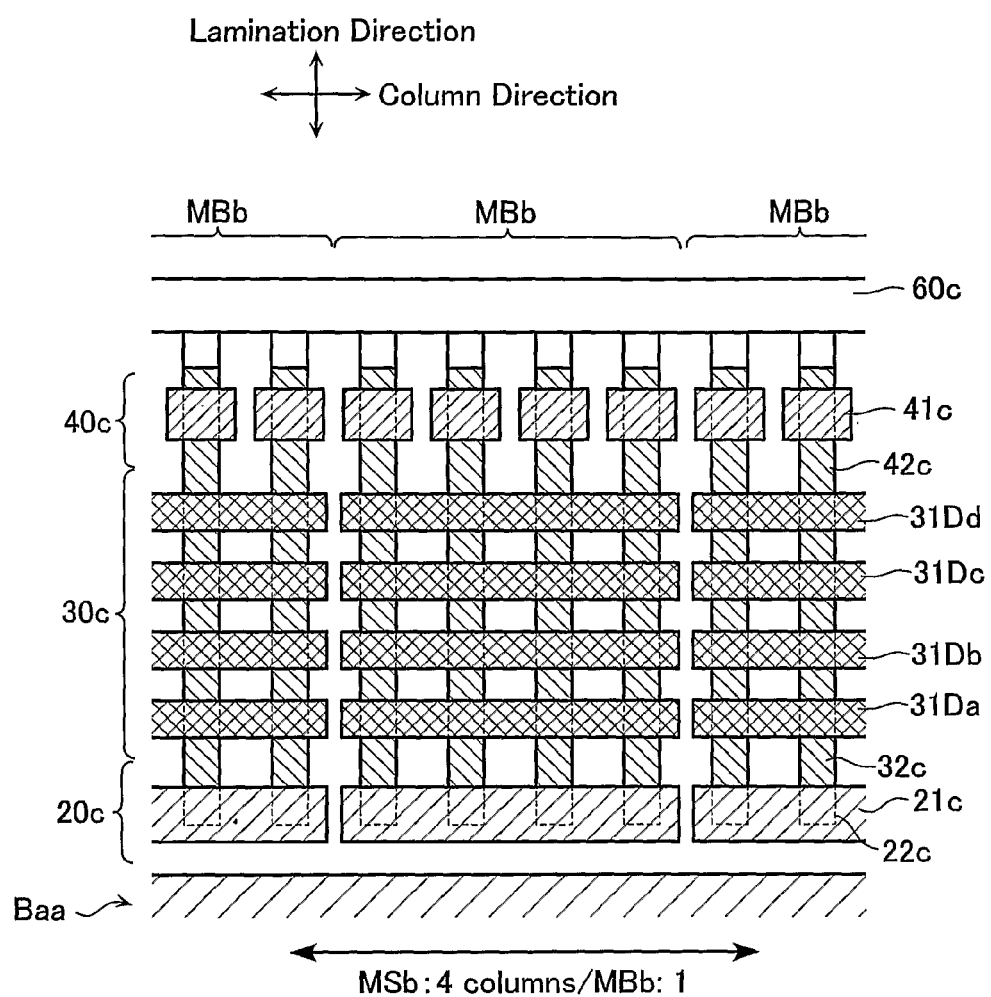
FIG. 34 is a cross-sectional view in the column direction of the non-volatile semiconductor storage device 10C according to the fourth embodiment.
Figure 35:
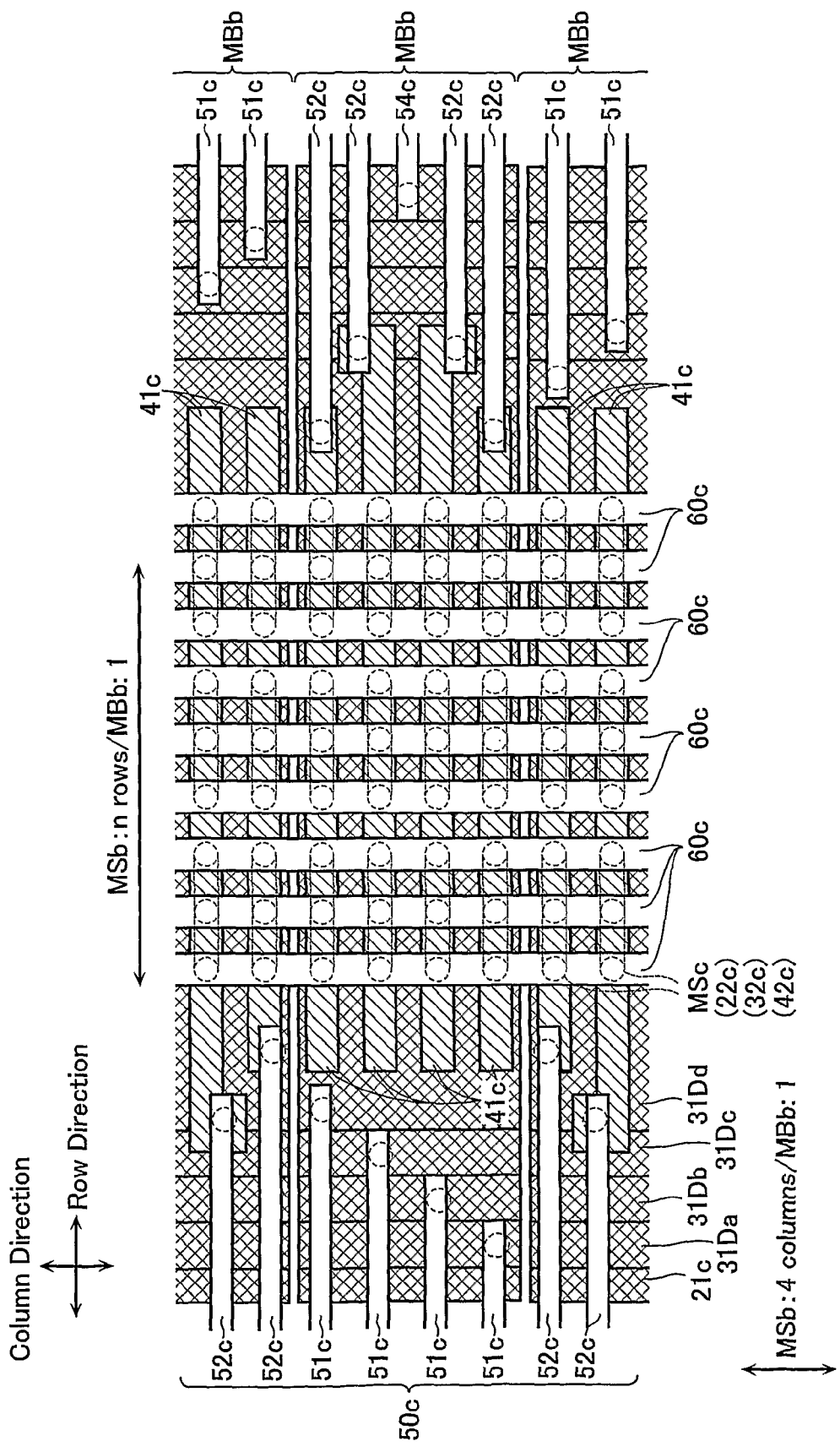
FIG. 35 is a top plan view of the non-volatile semiconductor storage device 10C according to the fourth embodiment.

Referring to FIGS. 33 to 35, a lamination structure of the non-volatile semiconductor storage device 10C according to the fourth embodiment will be described below. FIG. 33 is a cross-sectional view in the row direction of the non-volatile semiconductor storage device 10C according to the fourth embodiment. FIG. 34 is a cross-sectional view in the column direction of the non-volatile semiconductor storage device 10C, and FIG. 35 is a top plan view thereof.

As illustrated in FIG. 33, the non-volatile semiconductor storage device 10C according to the fourth embodiment has a back gate transistor layer 20c, a memory transistor layer 30c, a selection transistor layer 40c, a wiring layer 50c, and bit-line layers 60c that are sequentially provided on the semiconductor substrate Baa. The back gate transistor layer 20c functions as back gate transistors BGTrb1 and BGTrb2. The memory transistor layer 30c functions as memory transistors MTrb1 to MTrb4, MTrb5 to MTrb8, and MTrb9 to MTrb12. The selection transistor layer 40c functions as selection transistors SGTrb.

As illustrated in FIG. 33, the back gate transistor layer 20c has back gate conductive layers 21c and bottom semiconductor layers 22c. Each of the back gate conductive layers 21c assumes a plate-like shape extending in parallel to the semiconductor substrate Baa over a predetermined area. The back gate conductive layers 21c are separated for each memory block MBb. Each memory block MBb has one back gate conductive layer 21c provided therein. The bottom semiconductor layers 22c are formed to a predetermined depth from the top surfaces of the respective back gate conductive layers 21c. The bottom semiconductor layers 22c are formed to extend in the row direction, as viewed from above. As illustrated in FIG. 35, the bottom semiconductor layers 22c are formed in a matrix form ("n rows" in the row direction and "4 columns" in the column direction), as viewed from above. Each bottom semiconductor layer 22c is formed to join the lower ends of three memory columnar semiconductor layers 32c aligned in the row direction, as described below. The back gate conductive layers 21c and the bottom semiconductor layers 22c are composed of polysilicon (p-Si).

In addition, the back gate transistor layer 20c has a tunnel insulation layer, an electric charge accumulation layer, and a block insulation layer, as in the third embodiment.

In the back gate transistor layer 20c configured as mentioned above, the back gate conductive layers 21c function as the control gates of the back gate transistors BGTrb1, BGTrb2. The back gate conductive layers 21c also function as parts of the back gate lines BGb. The bottom semiconductor layers 22c are included in the W-shaped bottom portions of the memory strings MSb.

In addition, the configuration of the back gate transistor layer 20c is restated as follows: each back gate conductive layer 21c is formed to surround "bottom semiconductor layers 22c that are arranged with n rows in the row direction and 4 columns in the column direction".

As illustrated in FIG. 33, the memory transistor layer 30c has word-line conductive layers 31D (31Da to 31Dd) and memory columnar semiconductor layers 32c. The word-line conductive layers 31Da to 31Dd are laminated, and each assumes a plate-like shape extending in a direction parallel to the semiconductor substrate Baa over a predetermined area. The word-line conductive layers 31Da to 31Dd are separated for each memory block MBb. The memory columnar semiconductor layers 32c are formed to extend in the lamination direction and penetrate the word-line conductive layers 31Da to 31Dd. The word-line conductive layers 31Da to 31Dd and the memory columnar semiconductor layers 32c are composed of polysilicon (p-Si).

In addition, the memory transistor layer 30c has a tunnel insulation layer, an electric charge accumulation layer, and a block insulation layer, as in the third embodiment.

In the memory transistor layer 30c configured as mentioned above, the word-line conductive layers 31Da to 31Dd function as the control gates of the memory transistors MTrb1 to MTrb4, MTrb5 to MTrb8, and MTrb9 to MTrb12. The word-line conductive layers 31Da to 31Dd also function as parts of the word lines WLb1 to WLb4. The memory columnar semiconductor layers 32c are included in the W-shaped side portions of the memory strings MSb.

In addition, the configuration of the memory transistor layer 30c is restated as follows: the word-line conductive layers 31Da to 31Dd are formed to surround memory columnar semiconductor layers 32c that are arranged with 9 rows in the row direction and 4 columns in the column direction.

As illustrated in FIG. 33, the selection transistor layer 40c has conductive layers 41c and columnar semiconductor layers 42c. The conductive layers 41c are formed to extend in the row direction and to be aligned in the column direction. The conductive layers 41c are separated for each memory block MBb. The columnar semiconductor layers 42c are formed to extend in the lamination direction, penetrate the conductive layers 41c, and come in contact with the top surfaces of the memory columnar semiconductor layers 32c. In addition, gate insulation layers (not illustrated) are provided between the conductive layers 41c and the columnar semiconductor layers 42c.

In the selection transistor layer 40c configured as mentioned above, the conductive layers 41c function as the control gates of the selection transistors SGTrb. The conductive layers 41c also function as parts of the selection gate lines SGb.

Furthermore, the configuration of the selection transistor layer 40c is restated as follows: four conductive layers 41c are formed to surround "columnar semiconductor layers 42c that are arranged with 9 rows in the row direction and 4 columns in the column direction" in one memory block MBb.

In addition, according to the above-mentioned configuration, 4 columns of memory strings MSb are arranged in the column direction for each memory block MBb, as illustrated in FIG. 35.

As illustrated in FIG. 33, the wiring layer 50c comprises word connection layers 51c, selection gate connection layers 52c, and back gate connection layers 54c.

As illustrated in FIG. 35, the word connection layers 51c are formed in rectangular shapes extending in the row direction. The word connection layers 51c are arranged with "4 columns" aligned in the column direction for each memory block MBb. The word connection layers 51c are electrically connected via respective contact plug layers 511c to the word-line conductive layers 31Da to 31Dd, at one end in the row direction of the word-line conductive layers 31Da to 31Dd.

As illustrated in FIG. 35, the selection gate connection layers 52c are formed in rectangular shapes extending in the row direction. The selection gate connection layers 52c are electrically connected via respective contact plug layers 521c to the conductive layers 41c, at the other end in the row direction of the word-line conductive layers 31Da to 31Dd.

As illustrated in FIG. 35, the back gate connection layers 54c are formed in rectangular shapes extending in the row direction. The back gate connection layers 54c are electrically connected via respective contact plug layers 541c to the back gate conductive layers 21c, at the other (or one) end in the row direction of the word-line conductive layers 31Da to 31Dd.

As illustrated in FIG. 33, the bit-line layers 60c and the wiring layer 50c are formed in the same layer. The bit-line layers 60c are formed in rectangular shapes extending in the column direction. As illustrated in FIG. 35, the bit-line layers 60c are formed with n rows aligned in the row direction for each memory block MBb. The bit-line layers 60c are connected to the upper surfaces of the columnar semiconductor layers 42c, respectively. Note that the bit-line layers 60c function as bit lines BLb.

That is, the non-volatile semiconductor storage device 10C according to the fourth embodiment is formed with (Configuration 1c) and (Configuration 2c) as described below.

(Configuration 1c) The Word Connection Layers 51c
The word connection layers 51c extend to the vicinity of one end of the word-line conductive layer 31D in the row direction from one side of the Memory block MBb.

(Configuration 2c) The Memory Strings MSb
The number of memory strings MSb arranged in the column direction for each memory block MBb. i.e., "m" is 4.

The number of laminated word-line conductive layers 31D. i.e., "n" is 4.

In view of (Configuration 1c) and (Configuration 2c) above, the non-volatile semiconductor storage device 10C according to the fourth embodiment is configured to satisfy the relation represented by (Formula 1) above.

(Advantages of Non-Volatile Semiconductor Storage Device 10C in Fourth Embodiment)

Advantages of the non-volatile semiconductor storage device 10C according to the fourth embodiment will now be described below. The non-volatile semiconductor storage device 10C according to the fourth embodiment has the same advantages as the first embodiment since it is configured to satisfy the relation represented by (Formula 1) above.

[Other Embodiments]

While embodiments of the non-volatile semiconductor storage device have been described, the present invention is not intended to be limited to the disclosed embodiments and various other changes, additions, substitutions or the like may be made thereto without departing from the spirit of the invention.

The invention claimed is:

1. A non-volatile semiconductor storage device comprising:
   a plurality of memory blocks, each of the memory blocks having a plurality of memory strings with a plurality of memory cells connected in series, and each of the memory blocks being provided for each first area parallel to a substrate; and
   a plurality of wiring layers formed in a same plane and extending in a first direction parallel to the substrate,
   each of the memory blocks comprising:
      a first conductive layer expanding in parallel to the substrate over the first area, n layers of the first conductive layers being formed in a lamination direction and shared by the plurality of memory strings;
      a first semiconductor layer formed to extend in a lamination direction and penetrate the first conductive layers, the first semiconductor layer provided for each of the memory strings;
      an electric charge accumulation layer formed between the first conductive layers and the first semiconductor layer, and configured to be able to accumulate electric charges;
      a second conductive layer provided below the first conductive layers and expanding in parallel to the substrate over the first area;
      a second semiconductor layer formed to extend in a lamination direction from the bottom surface of the first semiconductor layer and penetrate the second conductive layer;
      a first gate insulation layer formed between the second conductive layer and the second semiconductor layer;
      a third conductive layer provided above the first conductive layers, and formed to be aligned in the second direction and extend in the first direction at the first area;
      a third semiconductor layer formed to extend in a lamination direction from the top surface of the first semiconductor layer and penetrate the third conductive layer; and
      a second gate insulation layer formed between the third conductive layer and the third semiconductor layer,
      the second semiconductor layer, a part of the second conductive layer, and the first gate insulation layer being included in a plurality of first selection transistors connected in series to one ends of the memory strings,
      the third semiconductor layer, a part of the third conductive layer, and the second gate insulation layer being included in a plurality of second selection transistors connected in series to the other ends of the memory strings,
   the memory strings including the first semiconductor layer, parts of the first conductive layers, and the electric charge accumulation layer, and being arranged with m columns in a second direction orthogonal to the lamination direction and the first direction, for each of the memory blocks;
   the wiring layers being arranged in the second direction, being formed to extend to the vicinity of one end of the first conductive layer in the first direction from one side of the memory block, and being connected via contact plugs to the first conductive layers; and
   a relation represented by (Formula 1) being satisfied:

$$m \geq n \qquad \text{(Formula 1)}.$$

2. The non-volatile semiconductor storage device according to claim 1, wherein
   the n layers of the first conductive layers have their ends in the first direction formed in a stepwise manner in relation to each other.

3. The non-volatile semiconductor storage device according to claim 1, further comprising:
   a first row decoder circuit provided one for each of the memory blocks,
   wherein the first row decoder circuit selectively applies a certain voltage to gates of the memory cells via the wiring layers.

4. The non-volatile semiconductor storage device according to claim 1, further comprising:
   a second row decoder circuit provided one for each of the memory blocks,
   wherein the second row decoder circuit selectively applies a certain voltage to gates of the first selection transistors and gates of the second selection transistors.

5. A non-volatile semiconductor storage device comprising:
   a plurality of memory blocks, each of the memory blocks having a plurality of memory strings with a plurality of memory cells connected in series, and each of the memory blocks being provided for each first area parallel to a substrate; and
   a plurality of wiring layers formed in a same plane and extending in a first direction parallel to the substrate,
   each of the memory blocks further comprises:
      a first conductive layer expanding in parallel to the substrate over the first area, n layers of the first conductive layers being formed in a lamination direction and shared by the plurality of memory strings;
      a first semiconductor layer formed to extend in a lamination direction and penetrate the first conductive layers, the first semiconductor layer provided for each of the memory strings;
      an electric charge accumulation layer formed between the first conductive layers and the first semiconductor layer, and configured to be able to accumulate electric charges;
      a fourth semiconductor layer joining lower ends of a plurality of the first semiconductor layers aligned in the first direction;
      a fourth conductive layer provided below the first conductive layers and expanding in parallel to the substrate over the first area, the fourth conductive layer formed to surround the fourth semiconductor layer; and
      a third gate insulation layer formed between the fourth conductive layer and the fourth semiconductor layer,
   the fourth semiconductor layer, a part of the fourth conductive layer, and the third gate insulation layer being included in a third selection transistor connected in series between the memory cells,
   the memory strings including the first semiconductor layer, parts of the first conductive layers, and the electric charge accumulation layer, and being arranged with m columns in a second direction orthogonal to the lamination direction and the first direction, for each of the memory blocks;

the wiring layers being arranged in the second direction, being formed to extend to the vicinity of one end of the first conductive layer in the first direction from one side of the memory block, and being connected via contact plugs to the first conductive layers; and a relation represented by (Formula 1) being satisfied:

$$m \geq n \qquad \text{(Formula 1)}.$$

6. The non-volatile semiconductor storage device according to claim 5, wherein
each of the memory blocks further comprises:
a fifth conductive layer provided above the first conductive layers, and formed to be aligned in the second direction and extend in the first direction at the first area;
a fifth semiconductor layer formed to extend in a lamination direction from the top surface of the first semiconductor layer and penetrate the fifth conductive layer; and
a fourth gate insulation layer formed between the fifth conductive layer and the fifth semiconductor layer,
wherein the fifth semiconductor layer, a part of the fifth conductive layer, and the fourth gate insulation layer are included in a plurality of fourth selection transistors connected in series to one ends of the memory strings.

7. A non-volatile semiconductor storage device comprising:
a plurality of memory blocks, each of the memory blocks having a plurality of memory strings with a plurality of memory cells connected in series, and each of the memory blocks being provided for each first area parallel to a substrate; and
a plurality of wiring layers formed in a same plane and extending in a first direction parallel to the substrate,
each of the memory blocks comprising:
a first conductive layer expanding in parallel to the substrate over the first area, n layers of the first conductive layers being formed in a lamination direction and shared by the plurality of memory strings;
a first semiconductor layer formed to extend in a lamination direction and penetrate the first conductive layers, the first semiconductor layer provided for each of the memory strings; and
an electric charge accumulation layer formed between the first conductive layers and the first semiconductor layer, and configured to be able to accumulate electric charges;
a second conductive layer provided below the first conductive layers and expanding in parallel to the substrate over the first area;
a second semiconductor layer formed to extend in a lamination direction from the bottom surface of the first semiconductor layer and penetrate the second conductive layer;
a first gate insulation layer formed between the second conductive layer and the second semiconductor layer;
a third conductive layer provided above the first conductive layers, and formed to be aligned in the second direction and extend in the first direction at the first area;
a third semiconductor layer formed to extend in a lamination direction from the top surface of the first semiconductor layer and penetrate the third conductive layer; and
a second gate insulation layer formed between the third, conductive layer and the third semiconductor layer, the second semiconductor layer, a part of the second conductive layer, and the first gate insulation layer being included in a plurality of first selection transistors connected in series to one ends of the memory strings,
the third semiconductor layer, a part of the third conductive layer, and the second gate insulation layer being included in a plurality of second selection transistors connected in series to the other ends of the memory strings,
the memory strings including the first semiconductor layer, parts of the first conductive layers, and the electric charge accumulation layer, and being arranged with m columns in a second direction orthogonal to the lamination direction and the first direction, for each of the memory blocks;
the wiring layers being arranged in the second direction, being formed to extend to the vicinity of both ends of the first conductive layers in the first direction from both sides of the memory block, and being connected via contact plugs to the first conductive layers; and
a relation represented by (Formula 2) being satisfied:

$$m \geq n/2 \qquad \text{(Formula 2)}.$$

8. The non-volatile semiconductor storage device according to claim 7, wherein
the n layers of the first conductive layers have their ends in the first direction formed in a stepwise manner in relation to each other.

9. The non-volatile semiconductor storage device according to claim 7, further comprising:
a first row decoder circuit provided one for each of the memory blocks,
wherein the first row decoder circuit selectively applies a certain voltage to gates of the memory cells via the wiring layers.

10. The non-volatile semiconductor storage device according to claim 7, further comprising:
a second row decoder circuit provided one for each of the memory blocks,
wherein the second row decoder circuit selectively applies a certain voltage to gates of the first selection transistors and gates of the second selection transistors.

11. A non-volatile semiconductor storage device comprising:
a plurality of memory blocks, each of the memory blocks having a plurality of memory strings with a plurality of memory cells connected in series, and each of the memory blocks being provided for each first area parallel to a substrate; and
a plurality of wiring layers formed in a same plane and extending in a first direction parallel to the substrate,
each of the memory blocks comprising:
a first conductive layer formed in comb-teeth shape with a plurality of protruding portions extending in the first direction at the first area, n layers of the first conductive layers being formed in a lamination direction and shared by the plurality of memory strings;
a second conductive layer formed in comb-teeth shape with a plurality of protruding portions extending in the first direction at the first area, n layers of the second conductive layers being formed in a lamination direction and shared by the plurality of memory strings, so that the protruding portions of the second conductive layers are positioned between the protruding portions of the first conductive layers;

a first semiconductor layer formed to penetrate the first conductive layers, the first semiconductor layer provided for each of the memory strings;

a second semiconductor layer formed to penetrate the second conductive layer, the second semiconductor layer provided for each of the memory strings;

a third semiconductor layer formed to join respective bottom portions of the first semiconductor layer and the second semiconductor layer; and an electric charge accumulation layer formed between the first conductive layers and the first semiconductor layer, as well as between the second conductive layer and the second semiconductor layer, and configured to be able to accumulate electric charges, the memory strings including the first conductive layers, the second conductive layer, the first semiconductor layer, the second semiconductor layer, the third semiconductor layer, and the electric charge accumulation layer, and being arranged with m columns in a second direction orthogonal to the lamination direction and the first direction, for each of the memory blocks;

the wiring layers being arranged in the second direction, being formed to extend to the vicinity of both ends of the first conductive layer and the second conductive layer in the first direction from both sides of the memory block, and being connected via contact plugs to the first conductive layer or the second conductive layer; and a relation represented by (Formula 3) being satisfied:

$$m \geq n \qquad \text{(Formula 3)}.$$

12. The non-volatile semiconductor storage device according to claim 11, wherein each of the memory blocks further comprises:
a fifth conductive layer formed to surround the third semiconductor layer; and
a third gate insulation layer formed between the third semiconductor layer and the fifth conductive layer,
wherein the third semiconductor layer, a part of the fifth conductive layer, and the third gate insulation layer are included in a third selection transistor connected in series between the memory cells.

13. The non-volatile semiconductor storage device according to claim 11, wherein the n layers of the first conductive layers and the second conductive layer have their ends in the first direction formed in a stepwise manner in relation to each other.

14. The non-volatile semiconductor storage device according to claim 11, wherein each of the memory blocks further comprises:
a third conductive layer provided above the first conductive layers, and formed to be aligned in the second direction and extend in the first direction at the first area;
a fourth conductive layer provided above the second conductive layer, and formed to be positioned between the third conductive layers aligned in the second direction and to extend in the first direction;
a fourth semiconductor layer formed to extend in a lamination direction from the top surface of the first semiconductor layer and penetrate the third conductive layer;
a fifth semiconductor layer formed to extend in a lamination direction from the top surface of the second semiconductor layer and penetrate the fourth conductive layer;
a first gate insulation layer formed between the third conductive layer and the fourth semiconductor layer; and
a second gate insulation layer formed between the fourth conductive layer and the fifth semiconductor layer,
wherein the fourth semiconductor layer, a part of the third conductive layer, and the first gate insulation layer are included in a plurality of first selection transistors connected in series to one ends of the memory strings, and
wherein the fifth semiconductor layer, a part of the fourth conductive layer, and the second gate insulation layer are included in a plurality of second selection transistors connected in series to the other ends of the memory strings.

15. The non-volatile semiconductor storage device according to claim 14, further comprising:

two row decoder circuits provided for each of the memory blocks,
wherein each of the row decoder circuits selectively applies a certain voltage to gates of the memory cells via the wiring layers, and selectively applies a certain voltage to gates of the first selection transistors and gates of the second selection transistors.

* * * * *